United States Patent
Isobe et al.

(10) Patent No.: US 7,476,913 B2
(45) Date of Patent: Jan. 13, 2009

(54) LIGHT EMITTING DEVICE HAVING A MIRROR PORTION

(75) Inventors: Hiroyuki Isobe, Yanai (JP); Gen Murakami, Tokyo (JP); Toshikatsu Hiroe, Yonezawa (JP)

(73) Assignees: Renesas Technology Corp., Tokyo (JP); Hitachi Cable Precision Co., Ltd., Yamagata (JP); Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/659,667

(22) PCT Filed: Aug. 10, 2004

(86) PCT No.: PCT/JP2004/011457

§ 371 (c)(1),
(2), (4) Date: Jan. 10, 2008

(87) PCT Pub. No.: WO2006/016398

PCT Pub. Date: Feb. 16, 2006

(65) Prior Publication Data

US 2008/0128724 A1 Jun. 5, 2008

(51) Int. Cl.
*H01L 29/267* (2006.01)
*H01L 29/06* (2006.01)
*H01L 31/0328* (2006.01)
*H01L 31/0336* (2006.01)
*H01L 31/072* (2006.01)
*H01L 31/109* (2006.01)
*H01L 27/15* (2006.01)
*H01L 29/22* (2006.01)
*H01L 33/00* (2006.01)
*H01L 29/227* (2006.01)
*H01L 29/24* (2006.01)
*H01L 31/12* (2006.01)

(52) U.S. Cl. ............ 257/98; 257/13; 257/81; 257/82; 257/95; 257/99; 257/100; 257/918; 257/E23.004; 257/E23.043; 257/E23.044; 257/E23.045; 257/E23.046; 257/E23.047; 257/E23.048; 257/E23.049; 257/E23.05; 257/E25.028; 257/E25.032; 257/E33.054; 257/E33.056; 257/E33.057; 257/E33.058; 257/E33.059

(58) Field of Classification Search ............ 257/13, 257/81–82, 95, 98–100, 918, E23.004, E23.043–E23.05, 257/E25.028, E25.032, E33.054, E33.056–E33.059
See application file for complete search history.

(56) References Cited

U.S. PATENT DOCUMENTS

| | | | |
|---|---|---|---|
| 6,573,580 B2 * | 6/2003 | Arndt | 257/433 |
| 6,593,598 B2 * | 7/2003 | Ishinaga | 257/98 |
| 6,645,783 B1 * | 11/2003 | Brunner et al. | 438/26 |
| 6,657,382 B2 * | 12/2003 | Nagai et al. | 313/512 |
| 6,806,506 B2 * | 10/2004 | Tsuji | 257/99 |
| 6,858,880 B2 * | 2/2005 | Horiuchi et al. | 257/100 |
| 6,893,890 B2 * | 5/2005 | Takekuma et al. | 438/29 |
| 7,029,147 B2 * | 4/2006 | Nawashiro | 362/236 |
| 7,038,195 B2 * | 5/2006 | Kida et al. | 250/239 |
| 7,230,280 B2 * | 6/2007 | Yaw et al. | 257/98 |
| 7,429,758 B2 * | 9/2008 | Ruhnau et al. | 257/98 |
| 2002/0113244 A1 * | 8/2002 | Barnett et al. | 257/98 |
| 2003/0098460 A1 * | 5/2003 | Yasukawa et al. | 257/99 |

FOREIGN PATENT DOCUMENTS

| | | |
|---|---|---|
| JP | 4-352372 | 5/1991 |
| JP | 6-77537 | 8/1992 |
| JP | 6-314822 | 4/1993 |
| JP | 11-251645 | 2/1998 |
| JP | 2001-127347 | 10/1999 |
| JP | 2002-319711 | 4/2001 |
| JP | 2003-101121 | 9/2001 |
| JP | 2004-79619 | 8/2002 |

OTHER PUBLICATIONS

International Search Report of PCT/JP2004/011457 mailed Nov. 22, 2004.

* cited by examiner

*Primary Examiner*—Ida M Soward

(74) *Attorney, Agent, or Firm*—Reed Smith LLP; Stanley P. Fisher, Esq.; Juan Carlos A. Marquez, Esq.

(57) ABSTRACT

A light emitting device has a cup portion with a bottom surface opening, and one electrode of a light emitting element is connected to the cup portion. The other electrode of the light emitting element is connected to a lead set up from an inner space to outside the cup portion using the opening of the cup portion. Each electrode and lead of the light emitting device can be electrically connected without bonding wires. This prevents shadows or light unevenness from reflecting the shape of the bonding wire, thereby enhancing light-emission efficiency. As an alternative to setting up the lead from inside to the outside of the cup portion, the lead existing outside the cup portion and the other electrode are electrically connected via the bonding wire through the cup portion's opening. Thus, light outputted outside of the light emitting device is not intercepted by the bonding wire.

13 Claims, 44 Drawing Sheets

LIGHT EMITTING DEVICE HAVING A MIRROR PORTION

TECHNICAL FIELD

The present invention relates to a light emitting device and a method for manufacturing the same. More particularly, it relates to technologies which are effective when applied to a light emitting device. Here, the light emitting device is manufactured by implementing a light emitting element on a lead frame including a cup-shaped reflection mirror portion. Also, the light emitting element includes a first electrode and a second electrode on the same principal surface of a substrate.

BACKGROUND ART

Conventionally, in light emitting devices using a light emitting element such as LED (light emitting diode) chip or LD (laser diode) chip, some of the devices have been manufactured in accordance with the following steps: Namely, a first lead of a lead frame and a first electrode (n electrode) of the light emitting element, and a second lead of the lead frame and a second electrode (p electrode) of the light emitting element are electrically connected to each other, respectively. Then, after sealing surroundings of the light emitting element with a transparent resin, the first lead and the second lead are cut off from the lead frame.

Also, at this time, either of the first lead and the second lead of the lead frame, in some cases, is formed into a cup shape having an inner space of, e.g., conic pyramid shape, elliptic pyramid shape, or concave mirror shape. Then, the light emitting element is implemented on bottom-surface portion of this cup-shape-formed portion (which, hereinafter, will be referred to as "cup portion"). On account of this configuration, light emitted from side surface of the light emitting element in a direction along the implementation surface can be reflected on concave-portion surface of the cup portion. This allows the light to be gathered and directed in advance in a predetermined direction, thereby allowing an enhancement in light-emission efficiency.

Also, in the light emitting element, semiconductor layers engaged in performing the light emission, such as, e.g., n-type semiconductor layer, light emitting layer, and p-type semiconductor layer, are multilayered via a buffer layer on one principal surface of the substrate.

Also, in the light emitting element, when roughly classified, there exist two ways to provide the first electrode and the second electrode. One is a method of providing the first electrode (n electrode) on rear surface of the principal surface of the substrate on which the semiconductor layers engaged in performing the light emission are multilayered, and providing the second electrode (p electrode) on the p-type semiconductor layer. The other is a method of exposing the n-type semiconductor layer by eliminating part of the p-type semiconductor layer and the light emitting layer multilayered on the substrate, and providing the first electrode on the n-type semiconductor layer exposed, and providing the second electrode on the p-type semiconductor layer.

Also, in recent years, there has existed a tendency that the amount of heat generated by the light emitting layer of the light emitting element increases because of high-luminance implementation of the light emitting element. On account of this, when implementing the light emitting element on the cup portion, the second electrode (p electrode) tends to be implemented in a manner faced to the bottom surface of the cup portion, so that the distance between the light emitting layer and the cup portion will become more proximate. At this time, if the first electrode (n electrode) is provided on the rear surface of the principal surface of the substrate on which the semiconductor layers engaged in performing the light emission are multilayered, the first electrode and the first lead are electrically connected via a bonding wire.

Also, if the first electrode is provided on the n-type semiconductor layer, e.g., a metallic layer with an intervention of an insulating layer is provided beforehand in a partial area of the bottom surface of the cup portion. Then, the first electrode and the metallic layer are electrically connected. Moreover, the metallic layer and the first lead are electrically connected via the bonding wire, thereby connecting the first electrode and the first lead electrically (Refer to, e.g., Patent Document 1 and Patent Document 2.).

Also, in recent years, in the light emitting element, a light-through substrate such as, e.g., sapphire has tended to be used as the substrate. As a result, not only the light emitted from the side surface of the light emitting element, but light emitted from the light emitting layer onto the substrate side can also be emitted to the outside of the light emitting element. On account of this, when the second electrode (p electrode) is implemented in a manner faced to the bottom surface of the cup portion, the light emitted from the substrate side and the light reflected on the concave-portion surface of the cup portion are capable of being gathered and directed, thereby being able to be outputted to the outside of the light emitting device. This enhances the light-emission efficiency further.

However, when the first electrode of the light emitting element and the first lead are electrically connected via the bonding wire, the light emitted from the side surface of the light emitting element and the light emitted in such a manner that it passes through the light-through substrate are partially intercepted by the bonding wire. On account of this, there has existed the following problem: Namely, a shadow or light unevenness reflecting shape of the bonding wire occurs in the light outputted from the light emitting device. This lowers the light-emission efficiency. At this time, it is possible to reduce the problem of the light unevenness and the lowering in the light-emission efficiency by using an extremely thin bonding wire. However, when the extremely thin bonding wire is used, there exists the following problem: Namely, electrical resistance of the bonding wire results in a lowering in current capacity, thereby making it difficult to obtain the high luminance.

Patent Document 1: JP-A-6-314822
Patent Document 2: JP-A-11-251645

DISCLOSURE OF THE INVENTION

Problem to be Solved by the Invention

The problem to be solved by the present invention is the following point: Namely, as described above, when the one electrode of the light emitting element is electrically connected to the cup portion, and when the other electrode thereof is electrically connected via the bonding wire to the first lead of the lead frame existing outside the cup portion, the light emitted from the light emitting element is partially intercepted by the bonding wire. As a result, a shadow or light unevenness reflecting the shape of the bonding wire occurs in the light outputted from the light emitting device. This lowers the light-emission efficiency.

Incidentally, as a method for solving the problem like this, e.g., the following implementation method is conceivable: Namely, a through hole or cut-missing portion is provided beforehand in a mount portion of the lead frame. Then, the p electrode and the mount portion are electrically connected in such a manner that the n electrode of the light emitting element is positioned on the through hole or cut-missing portion. Moreover, the n electrode and the mount portion are electrically connected by electrically connecting the electrically independent leads via the bonding wire (Refer to, e.g., JP-A-2004-79619.). In this method, the bonding wire passes though the through hole or cut-missing portion, and is extracted onto rear surface of the surface of the mount portion on which the light emitting element is implemented, then being electrically connected to the leads. On account of this, the bonding wire does not intercept the light emitted from the side surface of the light emitting element in the direction along the implementation surfaces or the light emitted in such a manner that it passes through the substrate. This makes it possible to prevent the lowering in the light-emission efficiency caused by the shadow or light unevenness.

However, in the case of the implementation method disclosed in JP-A-2004-79619, e.g., when the light emitting device is seen from the implementation-surface side of the light emitting element, the leads electrically connected to the n electrode via the bonding wire are provided on outer side of the mount portion of the light emitting element. Also, a lower-side sealing member for sealing the bonding wire is necessary. On account of this, there exists a problem that it is difficult to downsize the light emitting device.

It is an object of the present invention to provide a technology for making it possible to prevent the phenomenon in the above-described problem: Namely, the light emitted from the light emitting element is partially intercepted by the bonding wire. As a result, a shadow or light unevenness reflecting the shape of the bonding wire occurs in the light outputted from the light emitting device. This lowers the light-emission efficiency.

It is another object of the present invention to provide a technology for making it possible to downsize the light emitting device, in addition to the technology for making it possible to prevent the lowering in the light-emission efficiency caused by the shadow or light unevenness reflecting the shape of the bonding wire.

The other objects and novel features of the present invention will become apparent from the description in the present specification and the accompanying drawings.

Means for Solving the Problem

A first feature of the present invention is as follows: A light emitting device, including a light emitting element in which plural types of semiconductor layers engaged in performing light emission are multilayered on a principal surface of a substrate, and in which a first electrode and a second electrode are provided on the principal-surface side of the substrate on which the semiconductor layers are multilayered, a first lead electrically connected to the first electrode of the light emitting element, a second lead electrically connected to the second electrode of the light emitting element, and a transparent resin for sealing surroundings of the light emitting element, a reflection mirror portion being provided on either of the first lead and the second lead and in the surroundings of the light emitting element, the reflection mirror portion extending upwardly from a connection surface with either of the electrodes of the light emitting element, and becoming more distant from center of the light emitting element as moving away from the connection surface, wherein a portion of each of the first lead and the second lead is bending-formed onto the connection-surface side, the portion being connected to each of the first electrode and the second electrode of the light emitting element, the first electrode and the second electrode of the light emitting element being faced to the first lead and the second lead respectively, and being electrically connected via adhesion members to the first lead and the second lead respectively, the reflection mirror portion being provided by bending a cup portion so that the light emitting element will be contained inside an inner space of the cup portion, bottom surface of the cup portion being configured to have an opening, the cup portion being provided by forming an end portion on the opposite side to the portion of either of the first lead and the second lead, the portion being connected to either of the electrodes of the light emitting element.

A second feature of the present invention is as follows: A light emitting device, including a light emitting element in which plural types of semiconductor layers engaged in performing light emission are multilayered on a principal surface of a substrate, and in which a first electrode and a second electrode are provided on the principal-surface side of the substrate on which the semiconductor layers are multilayered, a first lead electrically connected to the first electrode of the light emitting element, a second lead electrically connected to the second electrode of the light emitting element, and a transparent resin for sealing surroundings of the light emitting element, a reflection mirror portion being provided on either of the first lead and the second lead and in the surroundings of the light emitting element, the reflection mirror portion extending upwardly from a connection surface with either of the electrodes of the light emitting element, and becoming more distant from center of the light emitting element as moving away from the connection surface, wherein the reflection mirror portion is provided by bending an outer circumferential portion of a portion of either of the first lead and the second lead onto the connection-surface side, the portion being connected to either of the electrodes of the light emitting element, an opening passing through from the connection surface to a rear surface being provided in proximity to the portion of the lead on which the reflection mirror portion is provided, the portion being connected to either of the electrodes of the light emitting element, a portion of the other lead differing from the lead on which the reflection mirror portion is provided passing through the opening of the lead on which the reflection mirror portion is provided, the portion being connected to either of the electrodes of the light emitting element, the portion then existing inside an inner space of a cup portion which includes the connection portion and the reflection mirror portion, the connection portion being the connection portion of the lead on which the reflection mirror portion is provided with either of the electrodes of the light emitting element, the first electrode and the second electrode of the light emitting element being faced to either of the respective leads, and being electrically connected via adhesion members to either of the respective leads.

A third feature of the present invention is as follows: A light emitting device, including a light emitting element in which plural types of semiconductor layers engaged in performing light emission are multilayered on a principal surface of a substrate, and in which a first electrode and a second electrode are provided on the principal-surface side of the substrate on which the semiconductor layers are multilayered, a first lead electrically connected to the first electrode of the light emitting element, a second lead electrically connected to the second electrode of the light emitting element, and a transparent resin for sealing surroundings of the light emitting element, a reflection mirror portion being provided on either of the first lead and the second lead and in the surroundings of the light emitting element, the reflection mirror portion extending upwardly from a connection surface with either of the electrodes of the light emitting element, and becoming more distant from center of the light emitting element as moving away from the connection surface, wherein the one electrode of the light emitting element is provided in a ring-shaped manner in surroundings of the other electrode of the light emitting element, the reflection mirror portion being provided by bending an outer circumferential portion of a portion of either of the first lead and the second lead onto the connection-surface side, the portion being connected to either of the electrodes of the light emitting element, an opening passing through from the connection surface to a rear surface being provided in an inner area of the portion of the lead on which the reflection mirror portion is provided, the portion being connected to the ring-shaped electrode of the light emitting element, the ring-shaped electrode of the light emitting element being faced to the lead on which the reflection mirror portion is provided, and being connected via an adhesion member to the lead in such a manner that the ring-shaped electrode surrounds the opening of the lead on which the reflection mirror portion is provided, a portion of the other lead differing from the lead on which the reflection mirror portion is provided existing in proximity to the opening of the lead on which the reflection mirror portion is provided, the portion being connected to either of the electrodes of the light emitting element, the other lead and either of the electrodes of the light emitting element being connected to each other via a bonding wire which passes through the opening.

A fourth feature of the present invention is as follows: A light emitting device, including a light emitting element in which plural types of semiconductor layers engaged in performing light emission are multilayered on a principal surface of a substrate, and in which a first electrode and a second electrode are provided on the principal-surface side of the substrate on which the semiconductor layers are multilayered, a first lead electrically connected to the first electrode of the light emitting element, a second lead electrically connected to the second electrode of the light emitting element, and a transparent resin for sealing surroundings of the light emitting element, a reflection mirror portion being provided on either of the first lead and the second lead and in the surroundings of the light emitting element, the reflection mirror portion extending upwardly from a connection surface with either of the electrodes of the light emitting element, and becoming more distant from center of the light emitting element as moving away from the connection surface, wherein the reflection mirror portion is provided by bending an outer circumferential portion of a portion of either of the first lead and the second lead onto the connection-surface side, the portion being connected to either of the electrodes of the light emitting element, an opening passing through from the connection surface to a rear surface being provided in proximity to the portion of the lead on which the reflection mirror portion is provided, the portion being connected to either of the electrodes of the light emitting element, the other lead differing from the lead on which the reflection mirror portion is provided being a column-shaped conductor which protrudes into an inner space of a cup portion from the opening of the lead on which the reflection mirror portion is provided, the cup portion including the connection portion and the reflection mirror portion, the connection portion being the connection portion of the lead on which the reflection mirror portion is provided with either of the electrodes of the light emitting element, the first electrode and the second electrode of the light emitting element being faced to either of the respective leads, and being electrically connected via an adhesion members to either of the respective leads.

ADVANTAGES OF THE INVENTION

In the light emitting device of the present invention, a light-intercepting object such as the bonding wire does not exist in the light paths of the light emitted from the light emitting element and reflected at the reflection mirror portion, and of the light emitted in such a manner that it passes through the substrate from the light emitting element. On account of this, it becomes possible to prevent the occurrence of a shadow or light unevenness in the light outputted from the light emitting device, and to prevent the lowering in the light-emission efficiency.

Also, in the light emitting device having the above-described fourth feature, the transparent resin is provided inside only the inner space of the cup portion and the through hole of the lead on which the reflection mirror portion is provided. This makes outer size of the light emitting device substantially equal to size of the cup portion, thereby making it possible to downsize the light emitting device.

Also, in the light emitting device having any one of the above-described first to fourth features, a plurality of grooves are provided in the portion of each lead connected to either of the electrodes of the light emitting element, the plurality of grooves extending from inside a connection area to outside the connection area, and being intersected or branched inside the connection area. As a result, of the adhesion members for electrically connecting the electrodes of the light emitting element and the leads to each other, an adhesion member redundantly provided is permitted to escape into the grooves. This makes it possible to easily prevent phenomena such as a short-circuit between the electrodes.

Also, in the light emitting device having any one of the above-described first to fourth features, the inner space of the cup portion of the lead on which the reflection mirror portion is provided is filled with a resin produced by mixing fluorescent materials or wavelength conversion materials. This makes it possible to obtain a light emitting device which is capable of outputting light of an arbitrary wavelength without being limited to the light of a wavelength (color) specific to the light emitting element.

Also, when manufacturing the light emitting device having the above-described first feature, it is preferable to execute steps of, e.g., forming a lead pattern on a conductive plate, the lead pattern having the first lead and the second lead, bending-forming a portion of each of the first lead and the second lead of the conductive plate (the lead frame) on which the lead pattern is formed, the portion being connected to each of the electrodes of the light emitting element, and forming a cup-shaped reflection mirror portion in an end portion on the opposite side to the bending-formed portion of either of the first lead and the second lead, bottom surface of the cup-shaped reflection mirror portion extending out in a direction of the bending formation, and the bottom surface having an opening, bending the cup-shaped reflection mirror portion so that the bending-formed portion will pass through the opened bottom surface, and enter an inner space of the cup-shaped reflection mirror portion, containing the light emitting element into the inner space of the cup-shaped reflection mirror portion, and electrically connecting the first electrode of the light emitting element and the first lead, and the second electrode of the light emitting element and the second lead to each other by using adhesion members, respectively, sealing the surroundings of the light emitting element with the transparent resin, and individualizing the first lead and the second lead by cutting off portions of the first lead and the second lead, the portions protruding out of the transparent resin. At this time, a step-height difference between the first electrode and the second electrode of the light emitting element is relaxed by the bending formation of the first lead and the second lead. Accordingly, as compared with manufacturing methods of performing, e.g., a processing of eliminating the step-height difference between the first electrode and the second electrode in the light emitting element, or a processing of forming a soldered film for relaxing the step-height difference on the first lead or the second lead, the relaxation of the step-height difference is easier to implement, and simultaneously the manufacturing cost can be reduced.

Also, when manufacturing the light emitting device having the above-described second feature, it is preferable to execute steps of, e.g., forming a lead pattern on a conductive plate, the lead pattern having the first lead and the second lead, forming a reflection mirror portion in surroundings of a portion of either of the first lead and the second lead of the conductive plate (the lead frame) on which the lead pattern is formed, the portion being connected to either of the electrodes of the light emitting element, by forming the portion into a cup shape, and forming an opening in proximity to the portion, the opening passing through from the connection surface to a rear surface, the portion being connected to either of the electrodes of the light emitting element, bending-forming a portion of the other lead differing from the lead on which the reflection mirror portion is formed, the portion being connected to either of the electrodes of the light emitting element, so that the portion will pass through the opening of the lead on which the reflection mirror portion is formed, and exist inside an inner space of the cup portion which includes the connection portion and the reflection mirror portion, the connection portion being the connection portion of the lead on which the reflection mirror portion is formed with either of the electrodes of the light emitting element, containing the light emitting element into the inner space of the reflection mirror portion, and electrically connecting the first electrode of the light emitting element and the first lead, and the second electrode of the light emitting element and the second lead to each other by using adhesion members, respectively, sealing the surroundings of the light emitting element with the transparent resin, and individualizing the first lead and the second lead by cutting off portions of the first lead and the second lead, the portions protruding out of the transparent resin. At this time, a step-height difference between the first electrode and the second electrode of the light emitting element is relaxed by the bending formation of the first lead and the second lead. Accordingly, as compared with manufacturing methods of performing, e.g., a processing of eliminating the step-height difference between the first electrode and the second electrode in the light emitting element, or a processing of forming a soldered film for relaxing the step-height difference on the first lead or the second lead, the relaxation of the step-height difference is easier to implement, and simultaneously the manufacturing cost can be reduced.

Also, when manufacturing the light emitting device having the above-described third feature, it is preferable to execute steps of, e.g., forming a lead pattern on a conductive plate, the lead pattern having the first lead and the second lead, forming a reflection mirror portion in surroundings of a portion of either of the first lead and the second lead of the conductive plate (the lead frame) on which the lead pattern is formed, the portion being connected to either of the electrodes of the light emitting element, by forming the portion into a cup shape, and forming an opening in proximity to the portion, the opening passing through from the connection surface to a rear surface, the portion being connected to either of the electrodes of the light emitting element, bending-forming a portion of the other lead differing from the lead on which the reflection mirror portion is formed, the portion being connected to either of the electrodes of the light emitting element, so that the portion will come to proximity to the opening of the lead on which the reflection mirror portion is formed, containing the light emitting element into an inner space of the reflection mirror portion, the one electrode of the light emitting element being provided in a ring-shaped manner in surroundings of the other electrode of the light emitting element, and electrically connecting the ring-shaped electrode of the light emitting element and the lead on which the reflection mirror portion is formed to each other via an adhesion member in such a manner that the ring-shaped electrode surrounds the opening, electrically connecting the electrode and the other lead to each other via a bonding wire which is set up through the opening, the electrode being exposed into the opening of the lead on which the reflection mirror portion of the light emitting element is formed, the other lead differing from the lead on which the reflection mirror portion is formed, sealing the surroundings of the light emitting element with the transparent resin, and individualizing the first lead and the second lead by cutting off portions of the first lead and the second lead, the portions protruding out of the transparent resin. At this time, a step-height difference between the first electrode and the second electrode of the light emitting element is relaxed by the bending formation of the first lead and the second lead. Accordingly, as compared with manufacturing methods of performing, e.g., a processing of eliminating the step-height difference between the first electrode and the second electrode in the light emitting element, or a processing of forming a soldered film for relaxing the step-height difference on the first lead or the second lead, the relaxation of the step-height difference is easier to implement, and simultaneously the manufacturing cost can be reduced.

Also, when manufacturing the light emitting device having the above-described fourth feature, it is preferable to execute steps of, e.g., forming a lead pattern on a conductive plate, the lead pattern having the first lead and the second lead, forming a reflection mirror portion in surroundings of a portion of either of the leads of the conductive plate (the lead frame) on which the lead pattern is formed, the portion being connected to either of the electrodes of the light emitting element, by forming either of the leads into a cup shape, and forming an opening in proximity to the portion, the opening passing through from the connection surface to a rear surface, the portion being connected to either of the electrodes of the light emitting element, containing the light emitting element into an inner space of the reflection mirror portion, and electrically connecting the one electrode of the light emitting element and the lead on which the reflection mirror portion is formed to each other via an adhesion member in such a manner that the other electrode of the light emitting element is exposed into the opening, inserting a column-shaped lead into the opening of the lead on which the reflection mirror portion is formed, and electrically connecting the column-shaped lead and the electrode to each other, the electrode being exposed into the opening of the lead on which the reflection mirror portion of the light emitting element is formed, sealing the surroundings of the light emitting element with the transparent resin, and individualizing the lead on which the reflection mirror portion is formed by cutting off a portion of the lead on which the reflection mirror portion is formed, the portion connecting the reflection mirror portion and the lead frame to each other.

Also, when manufacturing the light emitting device having the above-described fourth feature, e.g., the step of sealing the surroundings with the transparent resin may also form the transparent resin inside only the inner space of the reflection mirror portion and the opening. This makes outer size of the light emitting device substantially equal to size of the cup portion, thereby making it possible to downsize the light emitting device.

Also, when manufacturing the light emitting device having any one of the above-described first to fourth features, before the step of electrically connecting the electrodes of the light emitting element and the leads of the lead frame to each other, a step may also be performed which forms a plurality of grooves in the surfaces of the leads connected to the electrodes of the light emitting element, the plurality of grooves extending from inside a connection area to outside the connection area, and being intersected or branched inside the connection area. At this time, the adhesion members for electrically connecting the electrodes of the light emitting element and the leads to each other are provided in advance on the electrodes of the light emitting element. As a result, when the adhesion members are melted, a redundant adhesion member will flow into the grooves. Accordingly, an amount of the adhesion members which will spread and come to the outside of the connection area can be reduced. On account of this, it becomes possible to prevent phenomena such as a short-circuit caused by the adhesion members which have spread and come toed the outside of the connection area.

Also, when manufacturing the light emitting device having any one of the above-described first to fourth features, the step of sealing the surroundings with the transparent resin may also execute a step of filling the inner space of the reflection mirror portion with a resin produced by mixing fluorescent materials or wavelength conversion materials, and a step of sealing surroundings of the resin with another transparent resin, the resin being produced by mixing the fluorescent materials or the wavelength conversion materials. This makes it possible to obtain a light emitting device which is capable of outputting light of an arbitrary wavelength without being limited to the light of a wavelength (color) specific to the light emitting element.

DESCRIPTION OF REFERENCE NUMERALS

Figure 1:
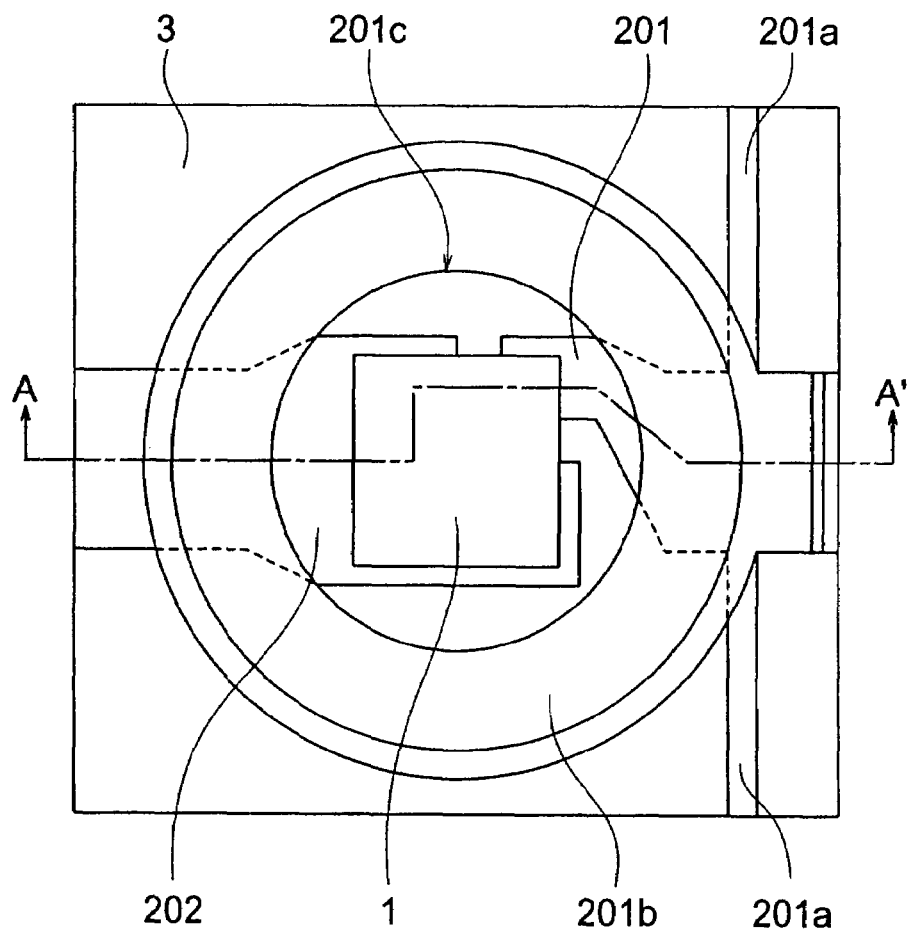
FIG. 1 is a schematic diagram for illustrating overview configuration of a light emitting device of a first embodiment according to the present invention, and is a plan view of the light emitting device when seen from an output direction of light.

1 light emitting element
101 substrate
102 buffer layer
103 semiconductor layers engaged in performing light emission
104 first electrode
105 second electrode
201 first lead
202 second lead
201*b*, 202*a* reflection mirror portions (cup portions)
201*c*, 202*b* openings (through holes) of reflection mirror portions
3, 3*a*, 3*b* transparent resins
4 adhesion member
5*a*, 5*b*, 5*c*, 5*d*, 5*e*, 5*f*, 5*g*, 5*h*, 5*j*, 5*k* dies
6*a*, 6*b*, 6*d* heaters
6*c* collet
7 resin produced by mixing fluorescent materials
8 bonding wire
9 printed wiring plate
9*a* insulating substrate
9*b* common electrode (mat electrode)
9*c* control electrode
9*d* connecting conductor
10 high melting-point solder

BEST MODE FOR CARRYING OUT THE INVENTION

In a light emitting device of the present invention, the bottom surface of a cup portion is configured to have an opening. Then, one electrode of a light emitting element is electrically connected to the cup portion. Moreover, the other electrode of the light emitting element is electrically connected to a lead which is set up through an inner space from outside the cup portion by making use of the opening of the cup portion. As a result of this configuration, each electrode and each lead of the light emitting device can be electrically connected to each other without using a bonding wire. This makes it possible to prevent occurrence of a shadow or light unevenness reflecting shape of the bonding wire, thereby allowing an enhancement in light-emission efficiency.

Also, in substitution for setting up the lead through the inner space from outside the cup portion, the lead existing outside the cup portion and the other electrode of the light emitting element are electrically connected to each other via the bonding wire set up through the opening of the cup portion. As a result of this configuration, light outputted to outside of the light emitting device is escaped from being partially intercepted by the bonding wire. This makes it possible to prevent the occurrence of a shadow or light unevenness, thereby allowing an enhancement in the light-emission efficiency.

Also, a conductor which is electrically insulated from the cup portion is provided in the opening of the bottom surface of the cup portion. Then, the one electrode of the light emitting element and the cup portion are electrically connected to each other. Moreover, the other electrode of the light emitting element and the conductor are electrically connected to each other. As a result of this configuration, each electrode and each lead of the light emitting device can be electrically connected to each other without using the bonding wire. This makes it possible to prevent the occurrence of a shadow or light unevenness reflecting the shape of the bonding wire, thereby allowing an enhancement in the light-emission efficiency, and allowing implementation of a downsizing of the light emitting device.

In accordance with the accompanying drawings, the explanation will be given below concerning the present invention in order to explain the present invention in more detail. Incidentally, in all the drawings for explaining embodiments, the same reference numeral will be allocated to configuration components which have the same function, and the repeated explanation thereof will be omitted.

Embodiment 1

Figure 2:
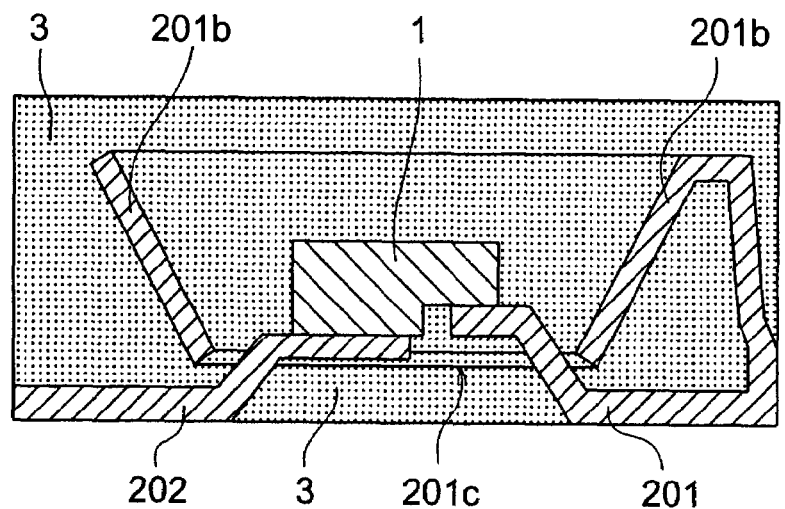
FIG. 2 is a schematic diagram for illustrating the overview configuration of the light emitting device of the first embodiment according to the present invention, and is an A-A' line cross-sectional view of FIG. 1.
Figure 3:
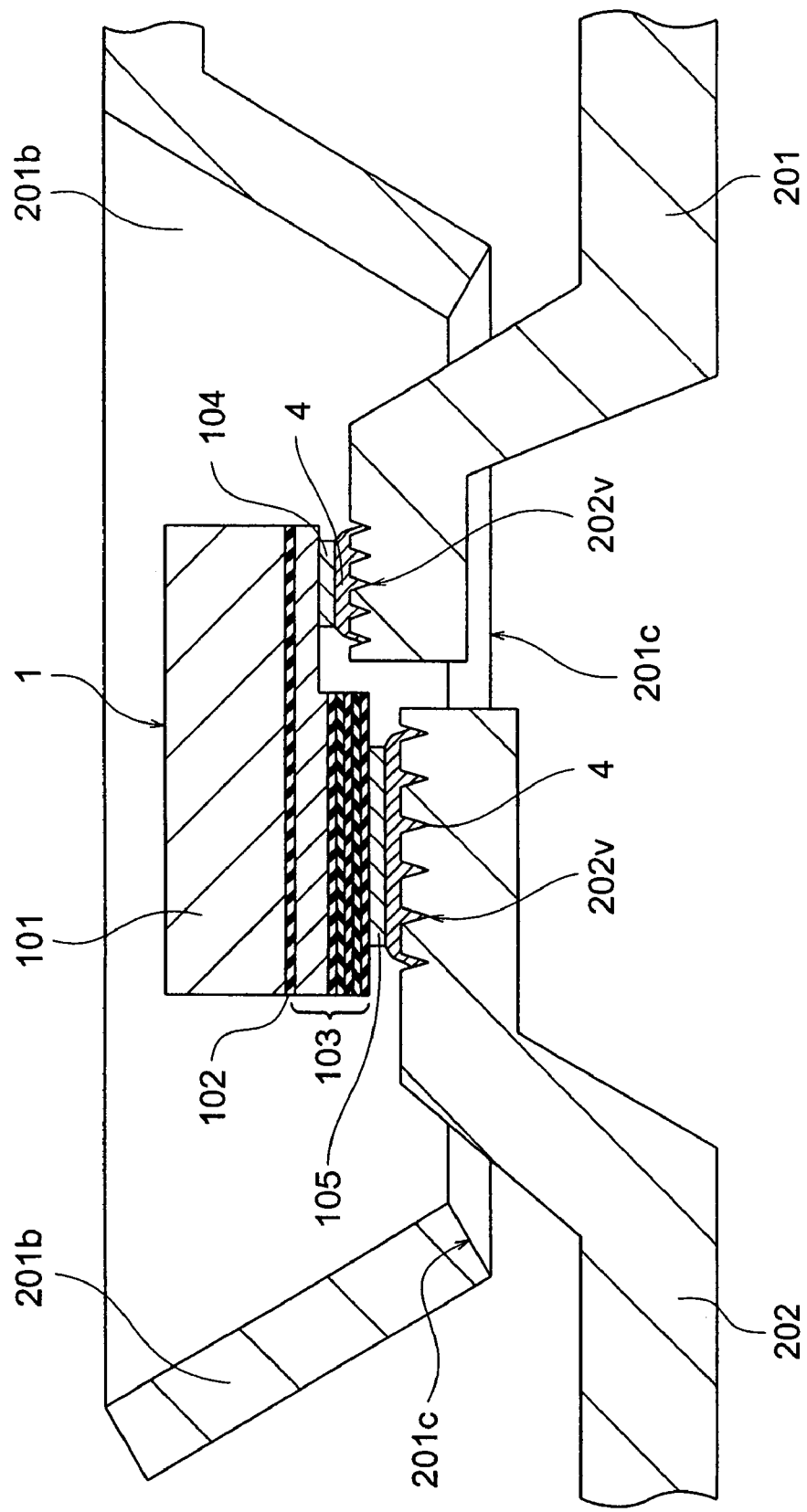
FIG. 3 is a schematic diagram for illustrating the overview configuration of the light emitting device of the first embodiment according to the present invention, and is an enlarged view of the periphery of a light emitting element in FIG. 2.
Figure 4:
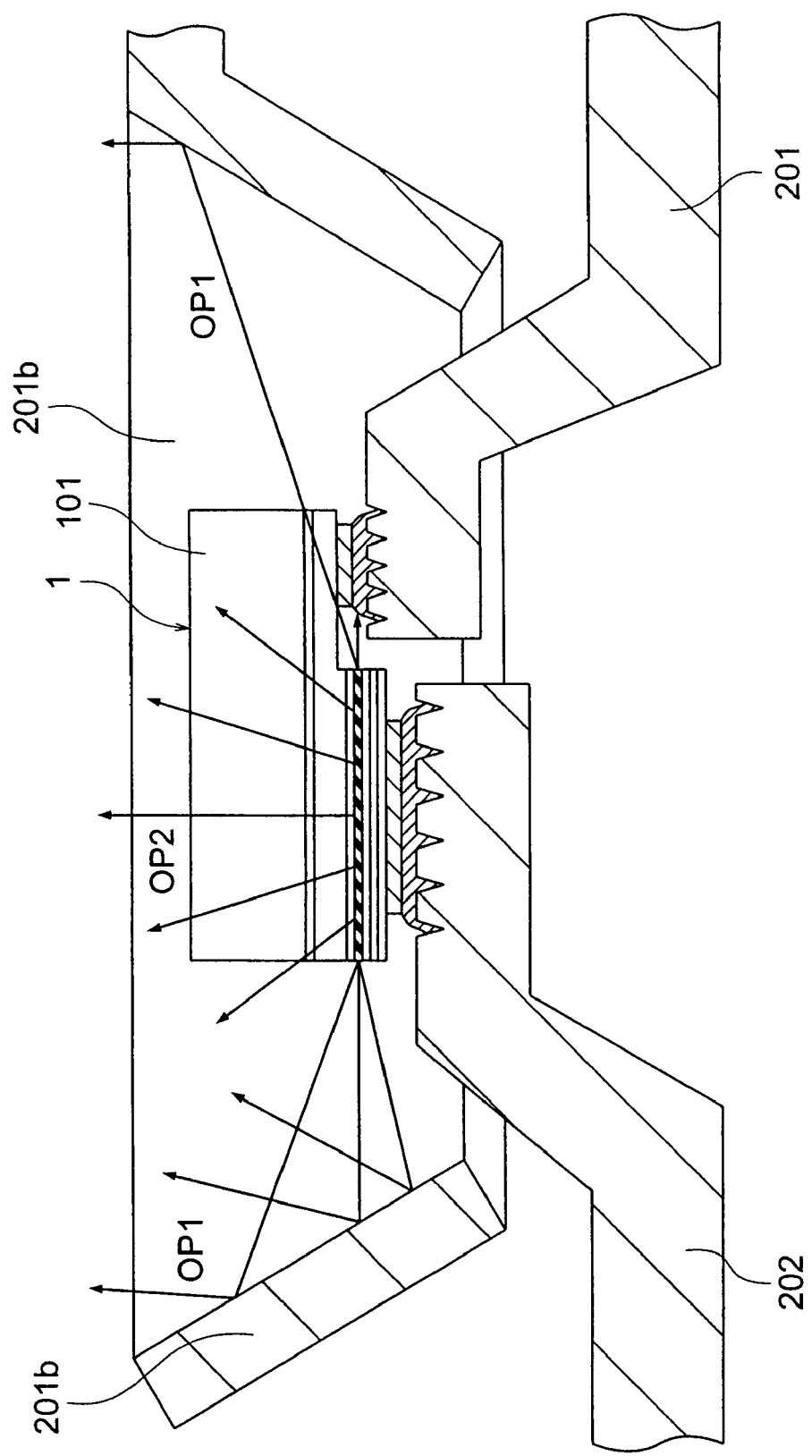
FIG. 4 is a schematic diagram for illustrating the overview configuration of the light emitting device of the first embodiment according to the present invention, and is a diagram for explaining effects of the light emitting device.

FIG. 1 through FIG. 4 are schematic diagrams for illustrating overview configuration of a light emitting device of a first embodiment according to the present invention. FIG. 1 is a plan view of the light emitting device when seen from an output direction of light. FIG. 2 is an A-A' line cross-sectional view of FIG. 1. FIG. 3 is an enlarged view of the periphery of a light emitting element in FIG. 2. FIG. 4 is a diagram for explaining effects of the light emitting device.

In FIG. 1 through FIG. 3, a reference numeral 1 denotes a light emitting element, 201 denotes a first lead, 201*a* denotes a hanger lead, 201*b* denotes a reflection mirror portion, 202 denotes a second lead, and 3 denotes a transparent resin. Also, in FIG. 3, a reference numeral 101 denotes a substrate, 102 denotes a buffer layer, 103 denotes semiconductor layers engaged in performing light emission, 104 denotes a first electrode, 105 denotes a second electrode, and 4 denotes adhesion members.

As illustrated in FIG. 1 through FIG. 3, the light emitting device of the first embodiment includes the light emitting element 1, the first lead 201 which is electrically connected to the first electrode 104 of the light emitting element 1, the second lead 202 which is electrically connected to the second electrode 105 of the light emitting element 1, and the transparent resin 3 for sealing surroundings of the light emitting element 1. At this time, the hanger lead 201a as is illustrated in FIG. 1 remains in the first lead 201.

Also, the light emitting element 1 is an element such as, e.g., LED chip or LD chip. In the light emitting element 1, as illustrated in FIG. 3, the semiconductor layers 103 engaged in performing the light emission are multilayered via the buffer layer 102 on one principal surface of the substrate 101. At this time, if the light emitting element 1 is, e.g., a blue-color light emitting LED chip, the substrate 101 is composed of, e.g., sapphire. Also, at this time, the buffer layer 102 is composed of, e.g., AlN. Also, at this time, the semiconductor layers 103 engaged in performing the light emission are formed by multilayering, e.g., first n-type GaN layer, second n-type GaN layer, InGaN layer (light emitting layer), p-type AlGaN layer, first p-type GaN layer, and second p-type GaN layer (not illustrated) from the side of the buffer layer 102.

Also, as illustrated in FIG. 3, the first electrode 104 and the second electrode 105 of the light emitting element 1 are provided, e.g., on the same principal-surface side of the substrate 101. At this time, as illustrated in FIG. 3, the first electrode 104 is provided on the first n-type GaN layer. Also, as illustrated in FIG. 3, the second electrode 105 is provided on the second p-type GaN layer. At this time, the step-height difference between the first electrode 104 and the second electrode 105 is about 0.05 μm to 2 μm, which is substantially equal to the sum total in thickness of the second n-type GaN layer, InGaN layer (light emitting layer), p-type AlGaN layer, first p-type GaN layer, and second p-type GaN layer.

Also, the first electrode 104 of the light emitting element 1 and the first lead 201, and the second electrode 105 of the light emitting element 1 and the second lead 202 are electrically connected to each other respectively via the adhesion members 4 of, e.g., gold-tin alloy. Also, at this time, preferably, as illustrated in FIG. 3, e.g., V-character grooves 201v, 202v are provided on a connection surface of the first lead 201 with the first electrode 104 and a connection surface of the second lead 202 with the second electrode 105. Also, at this time, preferably, although the illustration is omitted, the V-character grooves 201v, 202v of each lead are a plurality of grooves, the plurality of grooves extending from inside a connection area with each electrode 104, 105 to outside the connection area, and being intersected or branched inside the connection area.

Also, in the light emitting device of the first embodiment, as illustrated in FIG. 1 and FIG. 2, the reflection mirror portion 201b is provided in surroundings of the light emitting element 1. At this time, as illustrated in FIG. 2, the reflection mirror portion 201b is provided by bending a cup-shaped portion onto the light emitting element 1. Here, the cup-shaped portion is provided by shaping, into the cup shape, an end portion on the opposite side to a portion of the first lead 201 connected to the first electrode 104, outer configuration of the cup shape being conic pyramid shape or elliptic pyramid shape, and top surface and bottom surface of the cup shape being configured to have an opening. Also, at this time, as illustrated in FIG. 2 and FIG. 3, the portion of the first lead 201 connected to the first electrode 104, and a portion of the second lead 202 connected to the second electrode 105 are provided in such a manner that these portions pass through the opening 201c of the reflection mirror portion 201b, and exist inside an inner space of the reflection mirror portion 201b.

Also, as illustrated in FIG. 1 and FIG. 2, the transparent resin 3 is provided for sealing not only the light emitting element 1, but also the reflection mirror portion 201b and the connection portion between each lead 201, 202 and each electrode 104, 105.

In the light emitting device of the first embodiment, a voltage is applied between the first electrode 104 and the second electrode 105 of the light emitting element 1 by taking advantage of the first lead 201 and the second lead 202. As a result of this, as illustrated in FIG. 4, light of a wavelength corresponding to the configuration of the semiconductor layers 103 engaged in performing the light emission is light-emitted (emitted) from the light emitting layer (not illustrated) of the light emitting element 1. At this time, as illustrated in FIG. 4, of the light emitted from the light emitting layer, light OP1 emitted from the side surface of the light emitting element 1 is reflected by the reflection mirror portion 201b. This reflection changes its light path in a drawing-plane upward direction. Also, if the substrate 101 of the light emitting element 1 is a light-through substrate such as, e.g., sapphire, light OP2 emitted from the light emitting layer onto the substrate side passes through the substrate 101, then being emitted in the drawing-plane upward direction. As a consequence, in the light emitting device of the first embodiment, the light emitted from the light emitting element 1 is capable of being gathered and directed in the drawing-plane upward direction, thereby being able to be outputted to the outside of the light emitting device.

Also, in the light emitting device of the first embodiment, the first electrode 104 and the second electrode 105 of the light emitting element 1 are provided on the same principal-surface side of the substrate 101. Moreover, the first electrode 104 and the first lead 201, and the second electrode 105 and the second lead 202 are electrically connected to each other inside the inner space of the reflection mirror portion 201b. Namely, in the light emitting device of the first embodiment, unlike the light emitting device disclosed in, e.g., JP-A-11-251645, the wire for connecting the one electrode and the one lead to each other is unnecessary. On account of this, the light emitted from the light emitting layer of the light emitting element is escaped from being intercepted by the wire. Accordingly, e.g., it becomes possible to prevent the shadow or light unevenness reflecting the shape of the wire from occurring in the light outputted from the light emitting device. Also, flip-chip connection is performed on the lead frame, using adhesion members composed of a metal material such as, e.g., gold-tin alloy. This allows implementation of a reduction in the electrical resistance, thereby making it possible to increase the current capacity. Consequently, it becomes possible to flow a larger current, thereby making it possible to obtain the high luminance. Also, the flip-chip connection is performed on the lead frame, using the adhesion members composed of a metal material. This allows acquisition of high heat-radiation property, thereby making it possible to effectively dissipate heat liberation even at the time when the larger current is flown.

Figure 5:
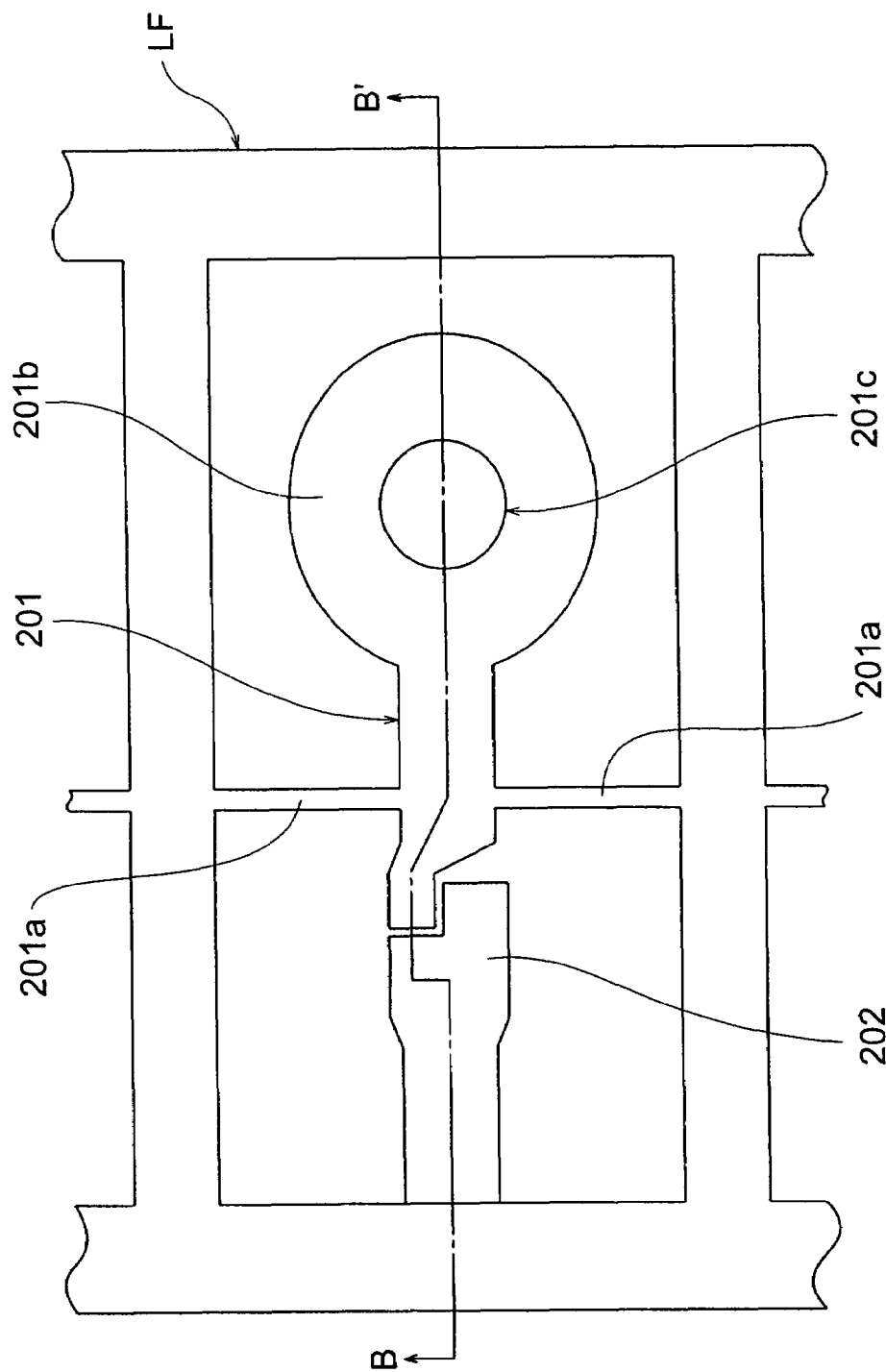
FIG. 5 is a schematic diagram for explaining a manufacturing method for manufacturing the light emitting device of the first embodiment, and is a plan view of a lead frame seen from element-mounted surface side, the lead frame being used for manufacturing the light emitting device.
Figure 6:
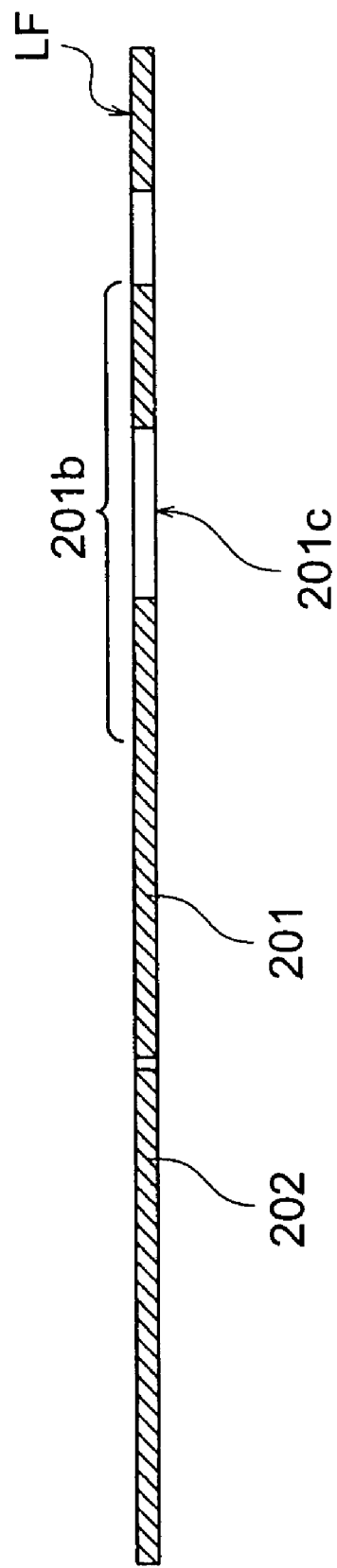
FIG. 6 is a schematic diagram for explaining the manufacturing method for manufacturing the light emitting device of the first embodiment, and is a B-B' line cross-sectional view of FIG. 5.
Figure 7:
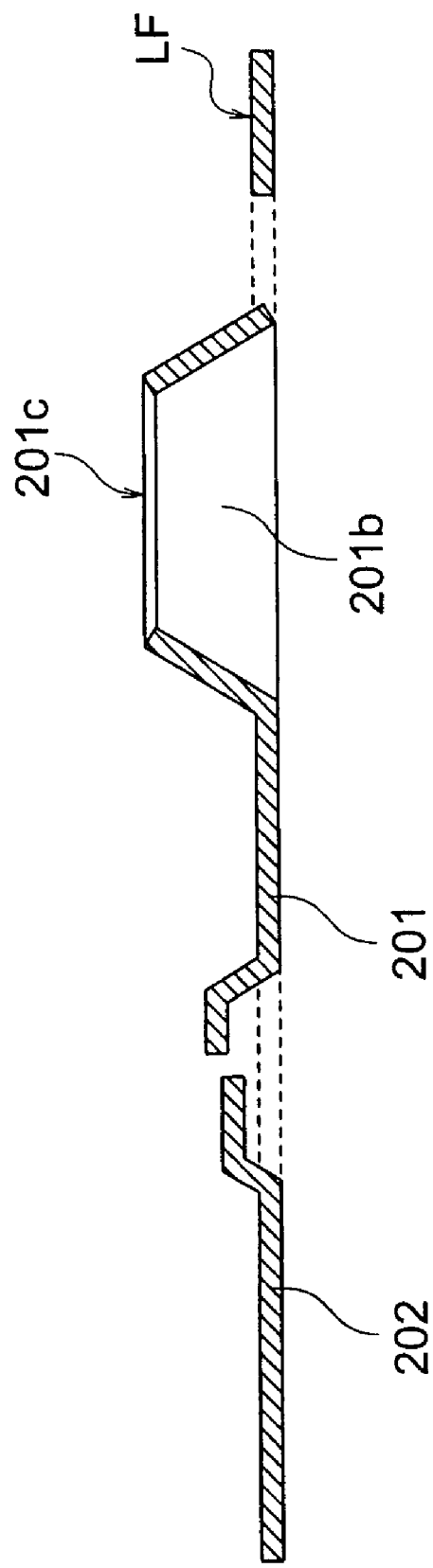
FIG. 7 is a schematic diagram for explaining the manufacturing method for manufacturing the light emitting device of the first embodiment, and is a cross-sectional view of a step of forming an element-mounted portion and a reflection mirror portion.
Figure 8:
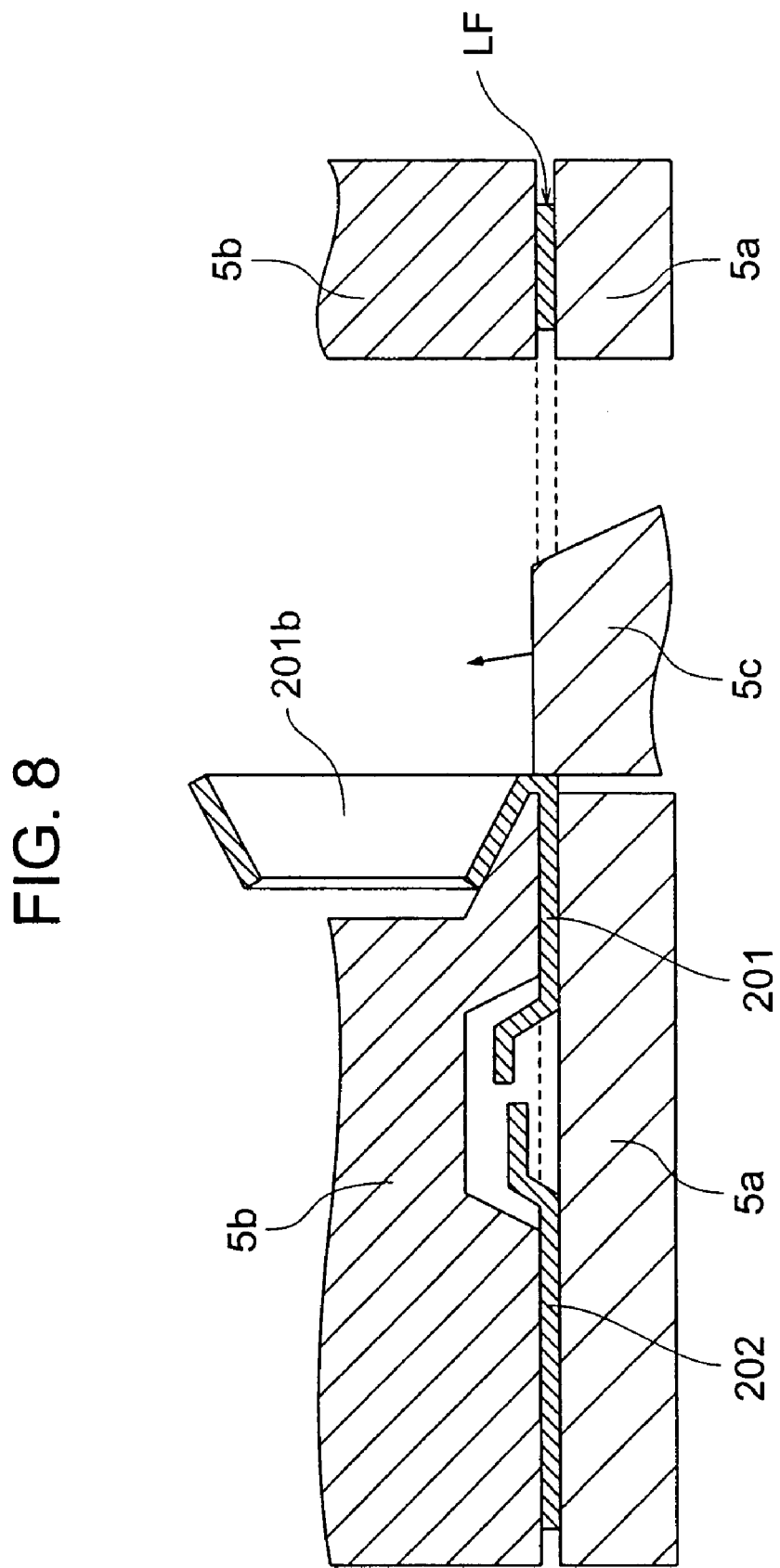
FIG. 8 is a schematic diagram for explaining the manufacturing method for manufacturing the light emitting device of the first embodiment, and is a cross-sectional view of a step of bending the reflection mirror portion.
Figure 9:
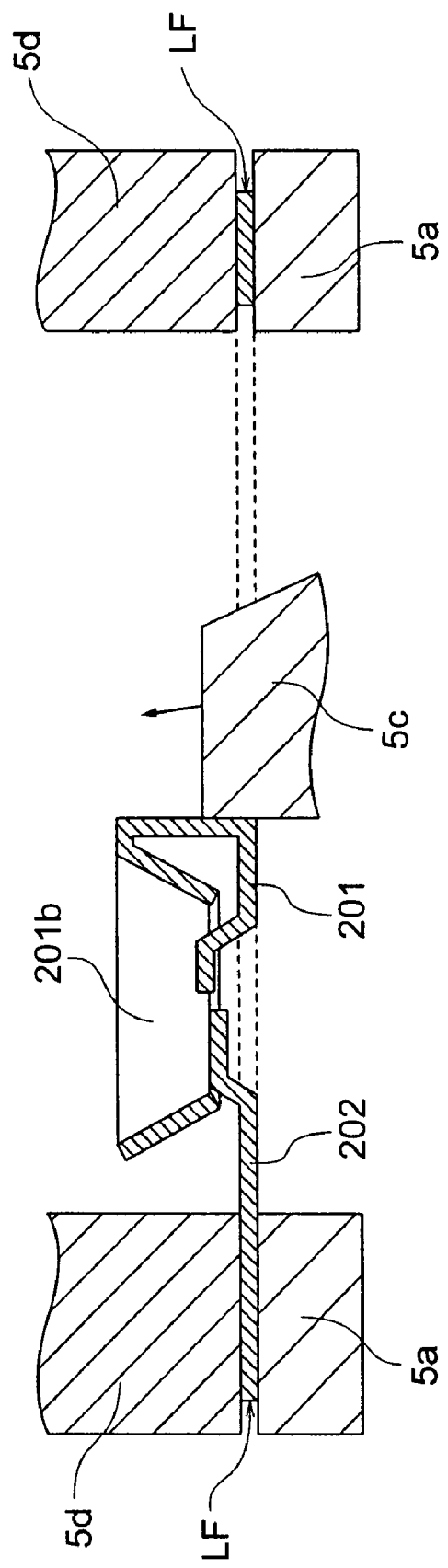
FIG. 9 is a schematic diagram for explaining the manufacturing method for manufacturing the light emitting device of the first embodiment, and is a cross-sectional view of the step of bending the reflection mirror portion.
Figure 10:
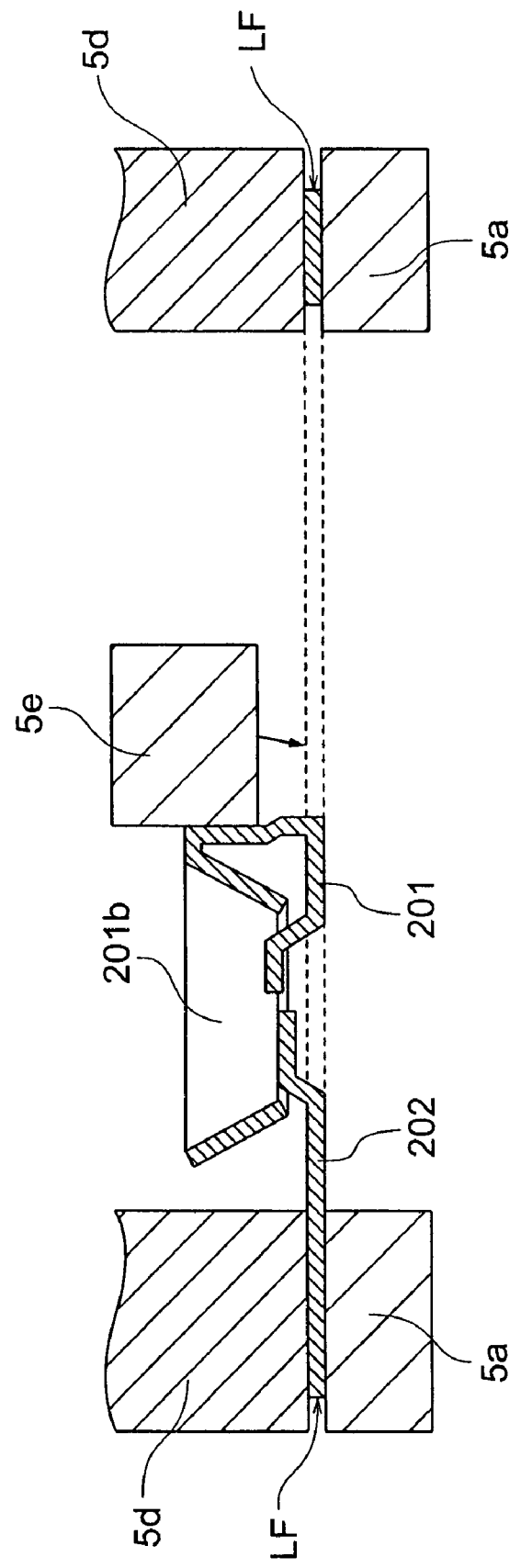
FIG. 10 is a schematic diagram for explaining the manufacturing method for manufacturing the light emitting device of the first embodiment, and is a cross-sectional view of the step of bending the reflection mirror portion.
Figure 11:
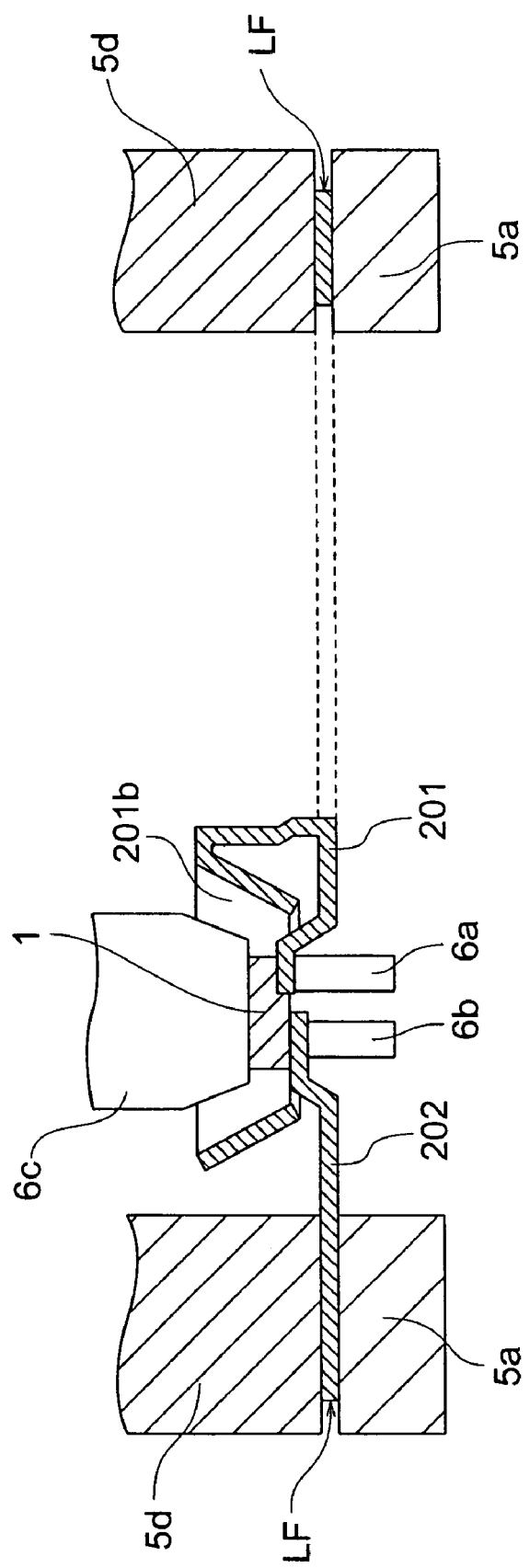
FIG. 11 is a schematic diagram for explaining the manufacturing method for manufacturing the light emitting device of the first embodiment, and is a cross-sectional view of a step of mounting the light emitting element.
Figure 12:
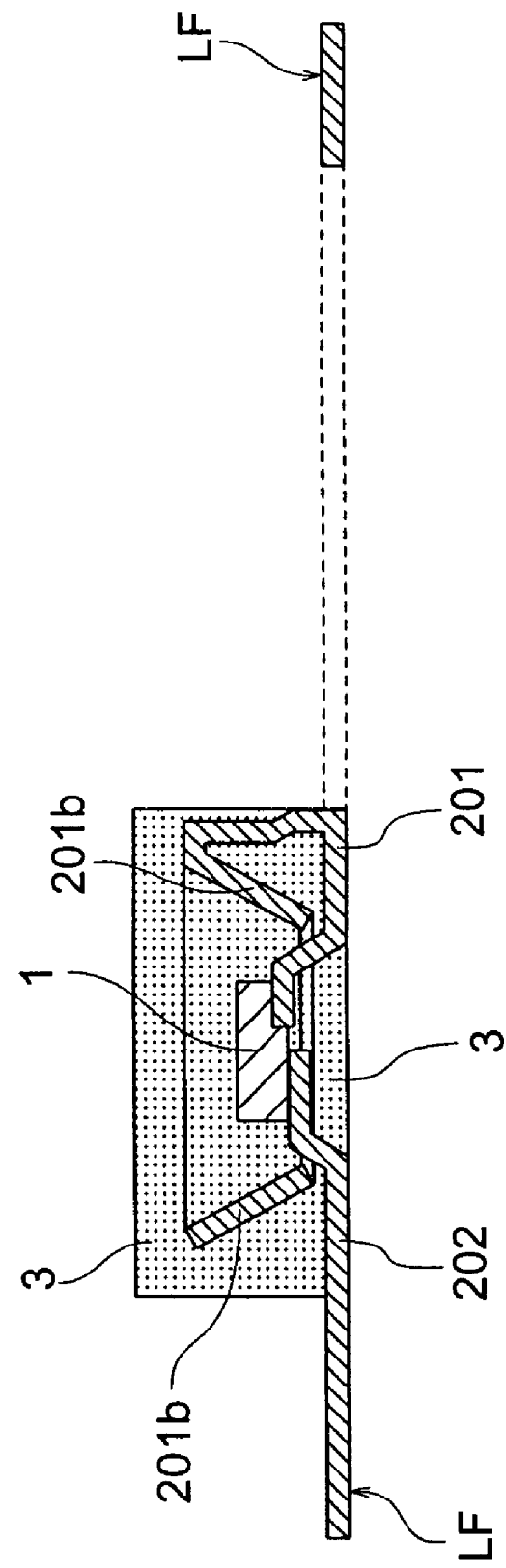
FIG. 12 is a schematic diagram for explaining the manufacturing method for manufacturing the light emitting device of the first embodiment, and is a cross-sectional view of a step of sealing surroundings of the light emitting element with a transparent resin.

FIG. 5 through FIG. 12 are schematic diagrams for explaining a manufacturing method for manufacturing the light emitting device of the first embodiment. FIG. 5 is a plan view of a lead frame seen from element-mounted surface side, the lead frame being used for manufacturing the light emitting device. FIG. 6 is a B-B' line cross-sectional view of FIG. 5. FIG. 7 is a cross-sectional view of a step of forming an element-mounted portion and the reflection mirror portion. FIG. 8 through FIG. 10 are cross-sectional views of a step of bending the reflection mirror portion. FIG. 11 is a cross-sectional view of a step of mounting the light emitting element. FIG. 12 is a cross-sectional view of a step of sealing the surroundings of the light emitting element with the transparent resin.

When manufacturing the light emitting device of the first embodiment, e.g., a lead frame LF as illustrated in FIG. 5 and FIG. 6 is used. At this time, the first lead 201 to be electrically connected to the first electrode 104 of the light emitting element 1 is supported by the hanger lead 201a in a state of floating over an opening of the lead frame. Here, the hanger lead 201a is the portion between the connection portion of the first lead 201 with the first electrode 104 and the reflection mirror portion 201b. Also, at this time, the opening 201c is formed in proximity to center of the reflection mirror portion 201b. Also, in the second lead 202 to be electrically connected to the second electrode 105 of the light emitting element 1, an end portion on the opposite side to the connection portion of the second lead 202 with the second electrode 105 is connected to the lead frame. Also, at this time, using a punching die, the lead frame LF is formed by punching a lead pattern illustrated in FIG. 5 in a conductor plate such as, e.g., an about 100-μm-thick copper plate. At this time, the connection portion of the first lead 201 with the first electrode 104, the reflection mirror portion 201b, and the connection portion of the second lead 202 with the second electrode 105 still remain planar as are illustrated in FIG. 6. Incidentally, e.g., the lead frame LF may be a one formed by forming a plurality of lead patterns as illustrated in FIG. 5 on a tape-shaped or short-volume-shaped conductor plate whose length is long in one direction (drawing-plane up-and-down direction). Otherwise, the lead frame LF may be a one formed by forming only one lead pattern as illustrated in FIG. 5 on a piece of conductor plate.

After the lead frame LF has been prepared as is illustrated in FIG. 5 and FIG. 6, next, the connection portion of each lead 201, 202 with each electrode 104, 105 of the light emitting element 1, and the reflection mirror portion 201b of the first lead 201 are formed as are illustrated in FIG. 7. The connection portion of each lead 201, 202 with each electrode 104, 105 is formed by using, e.g., a V-character bending mold. Also, the reflection mirror portion 201b of the first lead 201 is formed by using, e.g., a squeezing mold so that the outer configuration of the reflection mirror portion 201b becomes conic pyramid shape or elliptic pyramid shape. Also, at this time, the reflection mirror portion 201b of the first lead 201 is formed such that the reflection mirror portion juts in a direction in which the connection portion is bent. Also, although the illustration is omitted, when forming the connection portion of each lead 201, 202 with each electrode, e.g., the V-character grooves extending from inside the connection area with each electrode to outside the connection area are provided in the connection area with each electrode. The V-character grooves maybe formed simultaneously with the bend machining of the connection portion by, e.g., providing protrusions for forming the V-character grooves in the bending mold in advance. Otherwise, after finishing the bend machining, the V-character grooves maybe formed by using another mold.

After the connection portion of each lead 201, 202 with each electrode 104, 105, and the reflection mirror portion 201b of the first lead 201 have been formed as was illustrated in FIG. 7, next, the reflection mirror portion 201b of the first lead 201 is bent, thereby being brought onto the connection portion of each lead 201, 202 with each electrode. At this time, e.g., at first, as illustrated in FIG. 8, the frame portion of the lead frame LF and the first lead 201 are fixed by using dies 5a and 5b, and a portion (first bending portion) which is proximate to the end portion of the reflection mirror portion 201b is bent by using a die 5c. This operation sets the reflection mirror portion 201b into a state where the reflection mirror portion 201b is raised at about 90°. Next, as illustrated in FIG. 9, the frame portion of the lead frame LF and the hanger lead (not illustrated) of the first lead 201 are fixed by using the dies 5a and 5d, and a portion (second bending portion) which is more proximate to the connection portion than the first bending portion of the first lead 201 is bent by using the die 5c. This operation brings the reflection mirror portion 201b onto the connection portion of each lead 201, 202 with each electrode. Furthermore, finally, as illustrated in FIG. 10, the frame portion of the lead frame LF and the hanger lead (not illustrated) of the first lead 201 are fixed by using the dies 5a and 5d, and a portion between the first bending portion and the second bending portion is bent by using a die 5e. This operation allows the position of the reflection mirror portion 201b to be adjusted such that the reflection mirror portion 201b is in no contact with the second lead 202, and that the center of the reflection mirror portion 201b and central position of the light emitting element to be connected onto the connection portion substantially coincide with each other.

After the positioning of the reflection mirror portion 201b has been finished as was illustrated in FIG. 10, next, the light emitting element 1 is implemented. At this time, the connection portion of the first lead 201 and the connection portion of the second lead 202 are heated by using different heaters 6a and 6b, respectively. Also, e.g., the gold-tin alloy is used for the adhesion members 4 for electrically connecting each electrode 104, 105 of the light emitting element 1 and each lead 201, 202 to each other. Also, at this time, the adhesion members 4 are provided on the surfaces of the first electrode 104 and the second electrode 105 of the light emitting element 1. As a result of this configuration, when the adhesion members 4 provided on each electrode 104, 105 of the light emitting element 1 are melted by the heat from each lead 201, 202, the melted adhesion members 4 flow into the V-character grooves of each lead 201, 202. On account of this, it becomes possible to reduce failures such as, e.g., the adhesion members 4 will spread and come to the outside of the connection area, and cause a short-circuit to occur. Also, the first lead 201 and the second lead 202 are heated by using the different heaters 6a and 6b, respectively. As a result of this configuration, e.g., if a step-height difference which occurs between the connection surfaces of the first lead 201 and the second lead 202 at the bending step is not equal to the step-height difference between the first electrode 104 and the second electrode 105 of the light emitting element 1, these step-height differences can be made equal to each other by adjusting heights of the heaters 6a and 6b. On account of this, it becomes possible to reduce tilting of the light emitting element 1 and a connection failure between each electrode and each lead.

After the implementation of the light emitting element 1 has been finished, next, as illustrated in FIG. 12, the surroundings of the light emitting element is sealed with the transparent resin 3. At this time, e.g., as illustrated in FIG. 1 and FIG. 2, the transparent resin 3 is formed by a transfer mold such that the outer configuration of the transparent resin 3 becomes a rectangular parallelepiped shape which will cover the entire reflection mirror portion 201b. Moreover, after sealing the surroundings with the transparent resin 3, the hanger lead (not illustrated) of the first lead 201 and the second lead 202 are cut off along the side surface of the transparent resin 3. This allows acquisition of the light emitting device of the first embodiment.

As having been explained so far, according to the light emitting device of the first embodiment, the light emitted from the light emitting element and outputted to outside of the device is escaped from being intercepted by the bonding wire. On account of this, as compared with the light emitting device of the conventional mode as is disclosed in, e.g., JP-A-11-251645, it becomes possible to enhance the light-emission efficiency. Also, the flip-chip connection is performed on the lead frame, using the adhesion members composed of a metal material such as, e.g., gold-tin alloy. This allows implementation of a reduction in the electrical resistance, thereby making it possible to increase the current capacity. Consequently, it becomes possible to flow a larger current, thereby making it possible to obtain the high luminance. Also, the flip-chip connection is performed on the lead frame, using the adhesion members composed of a metal material. This allows acquisition of the high heat-radiation property, thereby making it possible to effectively dissipate the heat liberation even at the time when the larger current is flown.

Also, when manufacturing the light emitting device of the first embodiment, as illustrated in FIG. 7 and FIG. 11, the bending quantity of the first lead 201 to be connected to the first electrode 104 of the light emitting element 1 and the bending quantity of the second lead 202 to be connected to the second electrode 105 are changed, thereby relaxing the step-height difference between the first electrode 104 and the second electrode 105 of the light emitting element 1. Also, the first lead 201 and the second lead 202 are heated by using the different heaters 6a and 6b, respectively. As a result of this configuration, e.g., if the step-height difference which occurs between the connection surfaces of the first lead 201 and the second lead 202 at the bending step is not equal to the step-height difference between the first electrode 104 and the second electrode 105 of the light emitting element 1, these step-height differences can be made equal to each other by adjusting the heights of the heaters 6a and 6b. On account of this, it becomes possible to reduce the tilting of the light emitting element 1 and the connection failure between each electrode and each lead. Also, it is effective enough only to change the bending quantity of each lead 201, 202 of the lead frame LF. Accordingly, the manufacturing is easier, and simultaneously the manufacturing cost can be reduced.

Figure 13:
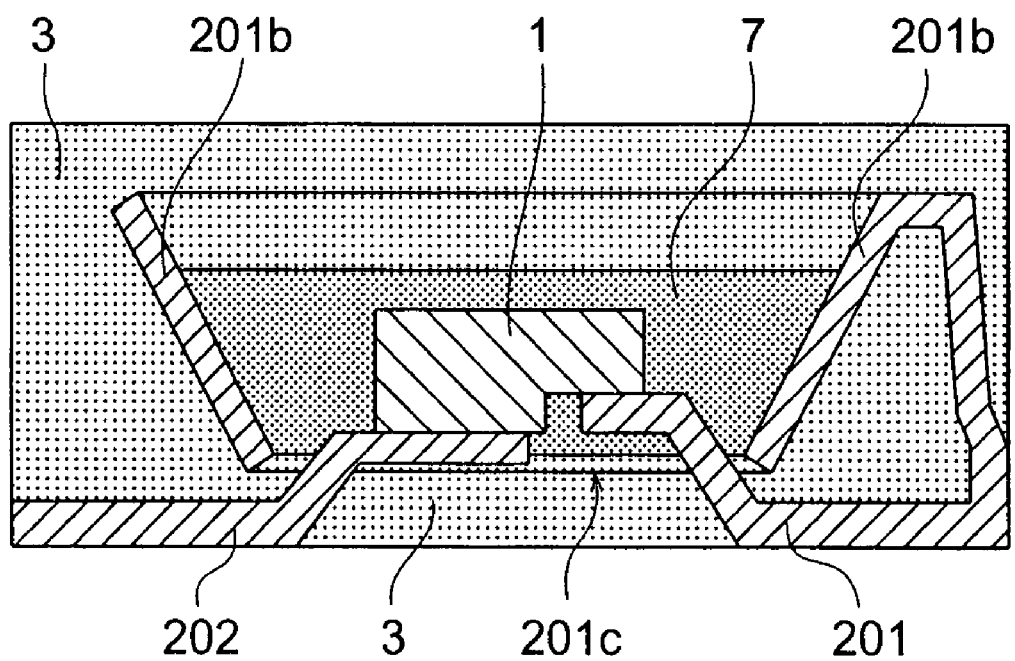
FIG. 13 is a schematic diagram for explaining an application example of the light emitting device of the first embodiment, and is a cross-sectional view for illustrating a configuration example of the light emitting device where the inside of the reflection mirror portion is filled with fluorescent materials.
Figure 14:
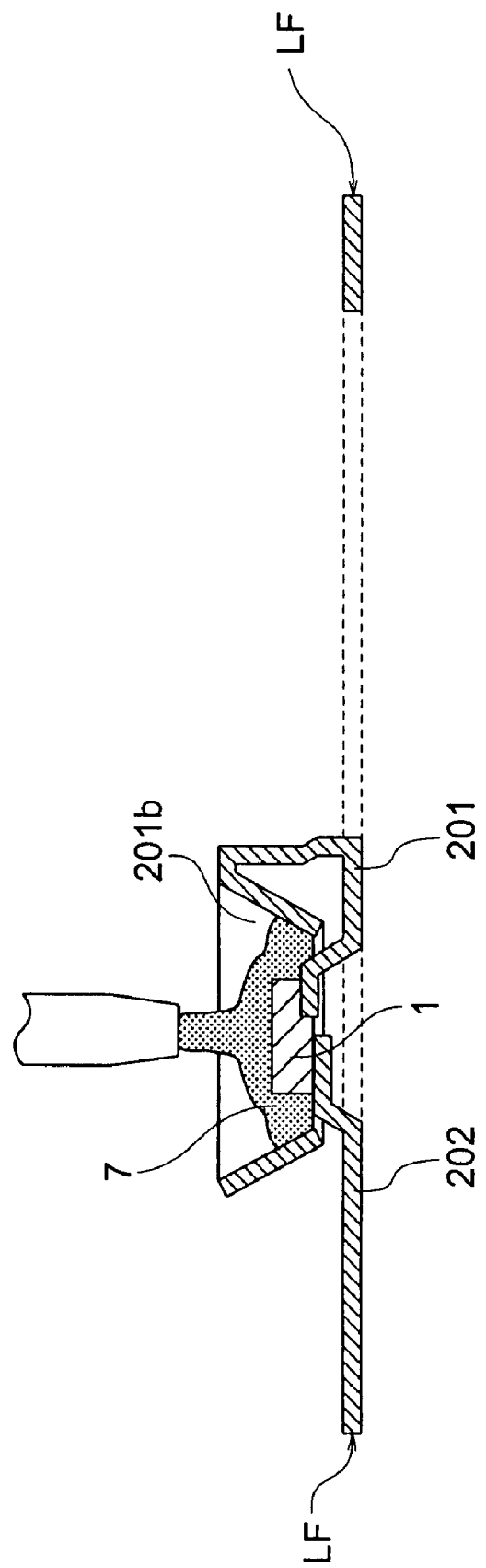
FIG. 14 is a schematic diagram for explaining the application example of the light emitting device of the first embodiment, and is a diagram for illustrating an example of a manufacturing method for manufacturing the light emitting device illustrated in FIG. 13.
Figure 15:
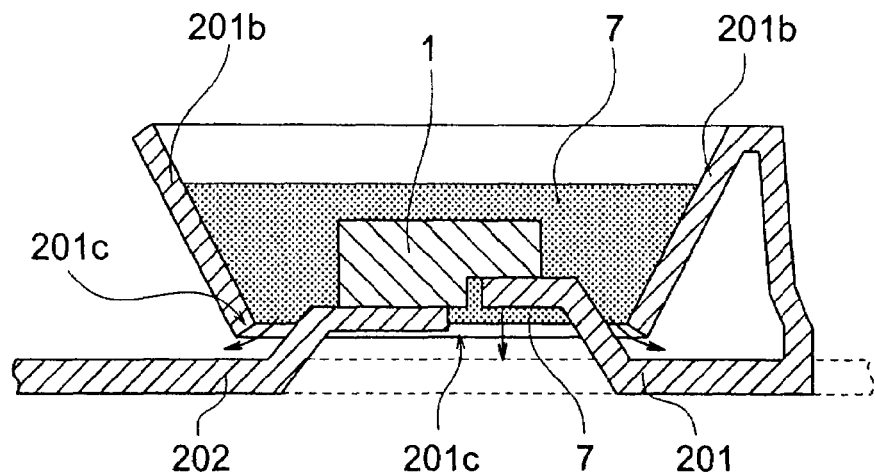
FIG. 15 is a schematic diagram for explaining the application example of the light emitting device of the first embodiment, and is a diagram for explaining problems in the manufacturing method illustrated in FIG. 14.
Figure 16:
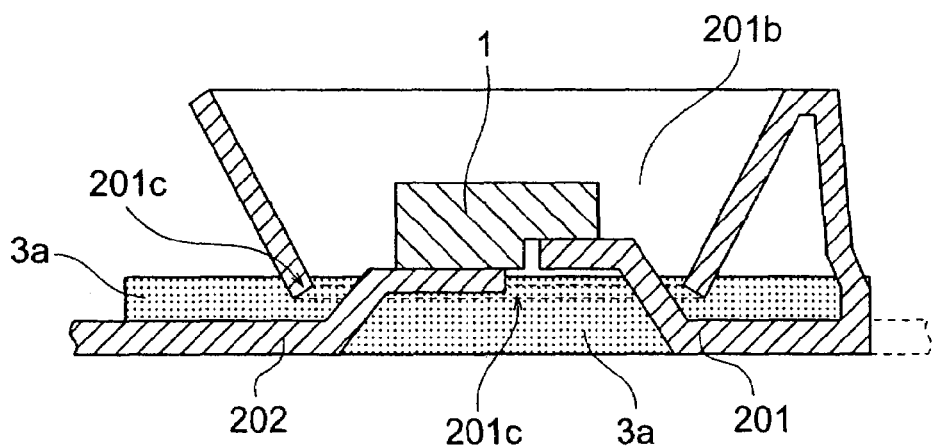
FIG. 16 is a schematic diagram for explaining the application example of the light emitting device of the first embodiment, and is a diagram for illustrating an example of a method for solving the problems illustrated in FIG. 15.
Figure 17:
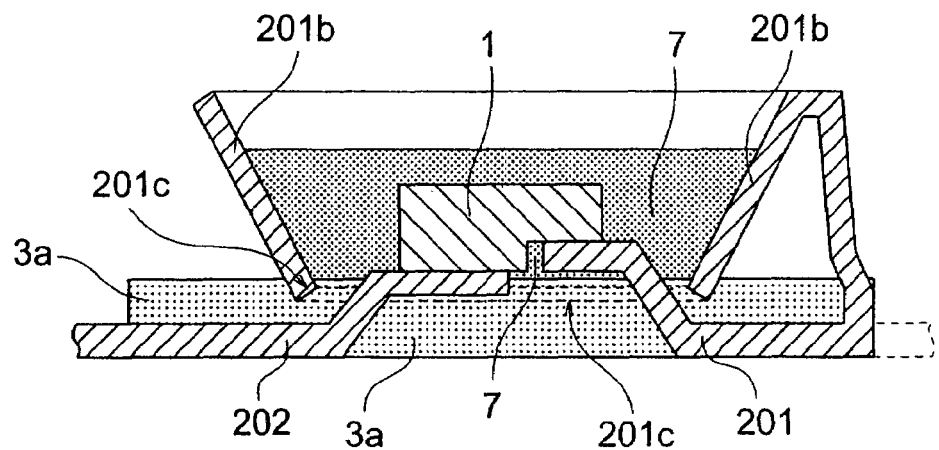
FIG. 17 is a schematic diagram for explaining the application example of the light emitting device of the first embodiment, and is a diagram for illustrating an example of the method for solving the problems illustrated in FIG. 15.
Figure 18:
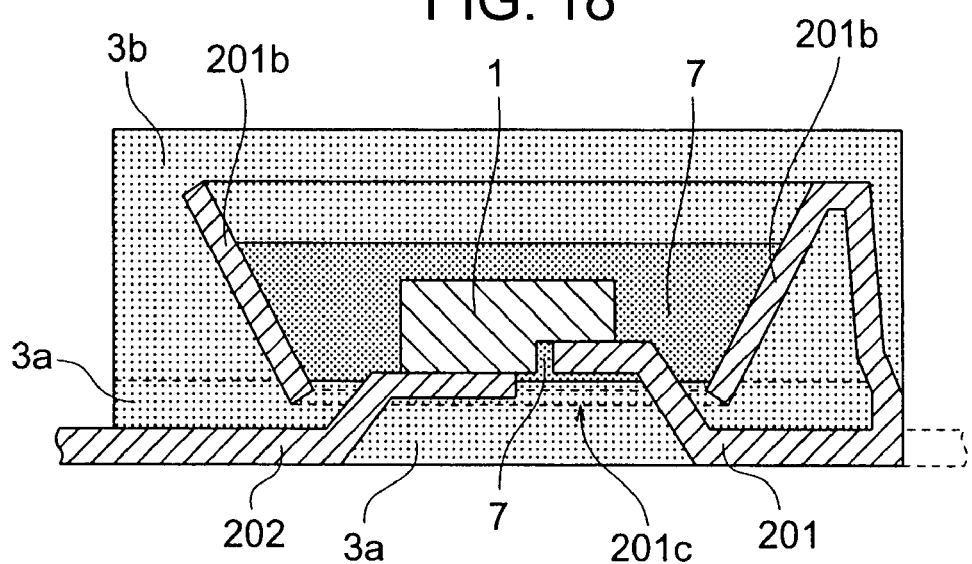
FIG. 18 is a schematic diagram for explaining the application example of the light emitting device of the first embodiment, and is a diagram for illustrating an example of the method for solving the problems illustrated in FIG. 15.

FIG. 13 through FIG. 18 are schematic diagrams for explaining an application example of the light emitting device of the first embodiment. FIG. 13 is a cross-sectional view for illustrating a configuration example of the light emitting device where the inside of the reflection mirror portion is filled with fluorescent materials. FIG. 14 is a diagram for illustrating an example of a manufacturing method for manufacturing the light emitting device illustrated in FIG. 13. FIG. 15 is a diagram for explaining problems in the manufacturing method illustrated in FIG. 14. FIG. 16 through FIG. 18 are diagrams for illustrating an example of a method for solving the problems illustrated in FIG. 15.

In the light emitting device of the first embodiment, as illustrated in FIG. 1 and FIG. 2, the transparent resin 3 for sealing the surroundings of the light emitting element 1 is formed by being extended up to the outside of the reflection mirror portion 201b such that the outer configuration of the transparent resin 3 becomes the rectangular parallelepiped shape. Being not limited thereto, however, e.g., as illustrated in FIG. 13, the following method is also allowable: Namely, a resin 7 produced by mixing fluorescent materials (wavelength conversion materials) in an extent of the amount of filling the surroundings of the light emitting element 1 is provided inside the inner space of the reflection mirror portion 201b. Next, the sealing is performed by forming the transparent resin 3 in surroundings of this resin 7 such that the outer configuration of the transparent resin 3 becomes the rectangular parallelepiped shape.

When manufacturing the light emitting device as illustrated in FIG. 13, after the light emitting element 1 has been implemented on the lead frame LF in accordance with the above-describe steps, the following method is preferable: Namely, as illustrated in FIG. 14, the resin 7 produced by mixing the fluorescent materials is poured into the inner space of the reflection mirror portion 201b. Next, the sealing is performed using the transparent resin 3 which is formed by the transfer mold such that the outer configuration thereof becomes the rectangular parallelepiped shape.

In the case of the light emitting device as illustrated in FIG. 1 and FIG. 2, the light of a wavelength corresponding to the configuration of the semiconductor layers 103 engaged in performing the light emission of the light emitting element 1 is directly outputted to the outside of the light emitting device. On the other hand, as illustrated in FIG. 13, the reflection mirror portion 201b is filled with the resin 7 produced by mixing the fluorescent materials (wavelength conversion materials). As a result of this filling, the wavelength of the light emitted from the light emitting element 1 is converted into a wavelength corresponding to wavelength conversion characteristics of the fluorescent materials. Consequently, the light of this converted wavelength is outputted to the outside of the light emitting device. On account of this, it becomes possible to manufacture the light emitting device which is capable of outputting light of various wavelengths without being limited to the light of the wavelength (color) specific to the light emitting element 1.

As illustrated in FIG. 14, however, in the case of filling the reflection mirror portion 201b with the resin 7 produced by mixing the fluorescent materials, the opening 201c exists on the bottom surface of the reflection mirror portion 201b. As a result of this existence of the opening 201c, there are some cases where, e.g., if the viscosity of the filling resin 7 is low, as illustrated in FIG. 15, the resin 7 flows out of a spacing between the opening 201c and each lead 201, 202. Accordingly, in order to prevent the outflow of the resin 7 like this, e.g., at first, as illustrated in FIG. 16, the spacing between the opening 201c and each lead 201, 202 is closed. Simultaneously, a first sealing resin layer 3a is formed which is in an extent of the height of not covering the light emitting layer of the light emitting element 1. The first sealing resin layer 3a may be either a transparent resin or a colored resin.

After the first sealing resin layer 3a has been formed, next, as illustrated in FIG. 17, the reflection mirror portion 201b is filled with the resin 7 produced by mixing the fluorescent materials. Furthermore, after that, as illustrated in FIG. 18, a second sealing resin layer 3b is formed on the first sealing resin layer 3a by the transfer mold or the like. On account of this configuration, even if the viscosity of the resin 7 produced by mixing the fluorescent materials is low, it becomes possible to prevent the outflow of the resin 7, and to reduce a lowing in the manufacturing yield of the light emitting device.

Also, in the light emitting device of the first embodiment, as illustrated in FIG. 1 and FIG. 2, the example has been cited where the reflection mirror portion 201b is formed such that the outer configuration thereof becomes the conic pyramid shape or elliptic pyramid shape. Being not limited thereto, however, the reflection mirror portion 201b may also be formed into e.g., concave mirror shape.

Also, in the light emitting device of the first embodiment, as the example of the light emitting element 1, the blue-color light emitting LED chip has been cited. The light emitting element 1, however, may also be either a LED chip emitting another-color light, or a LD chip.

Also, in the light emitting device of the first embodiment, as illustrated in FIG. 1 and FIG. 2, the transparent resin 3 is formed such that the outer configuration thereof becomes the rectangular parallelepiped shape. Being not limited thereto, however, the transparent resin 3 may also be formed such that the light-outputting surface is formed into, e.g., convex lens shape or Fresnel lens shape.

Embodiment 2

Figure 19:
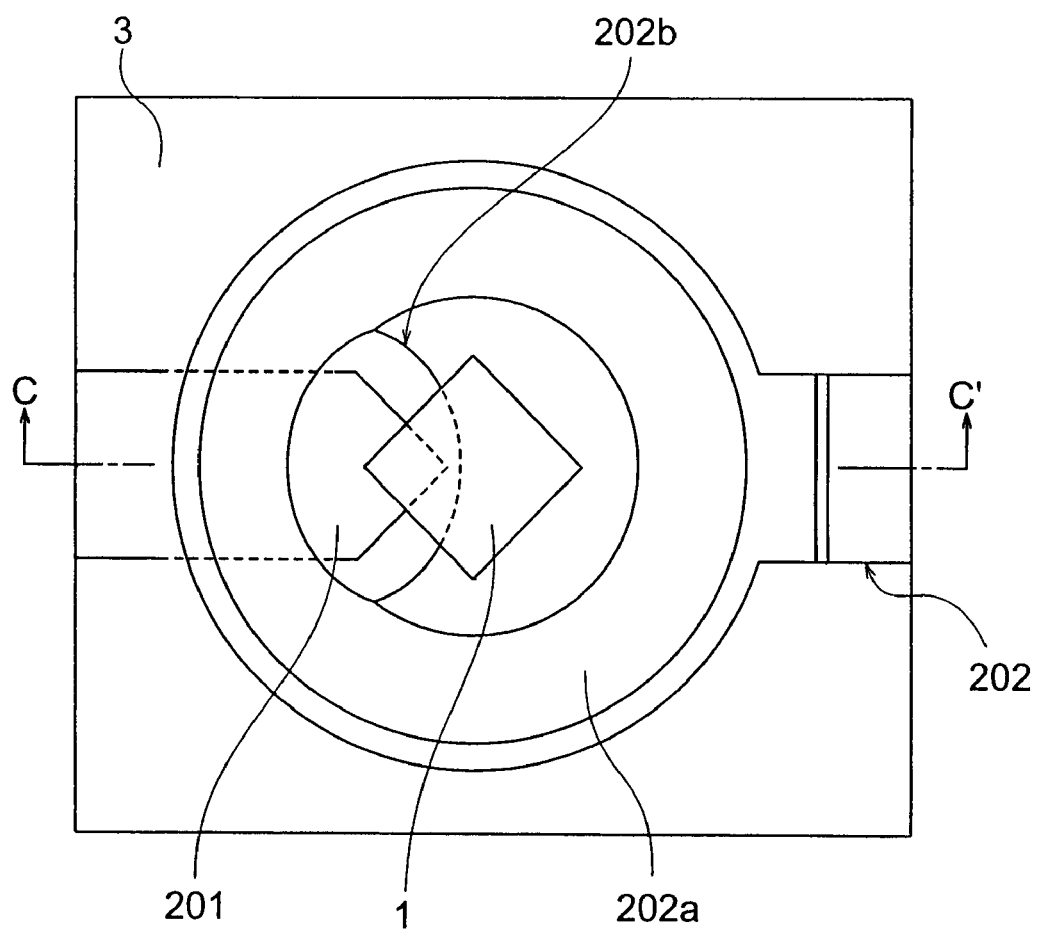
FIG. 19 is a schematic diagram for illustrating overview configuration of a light emitting device of a second embodiment according to the present invention, and is a plan view of the light emitting device when seen from an output direction of light.
Figure 20:
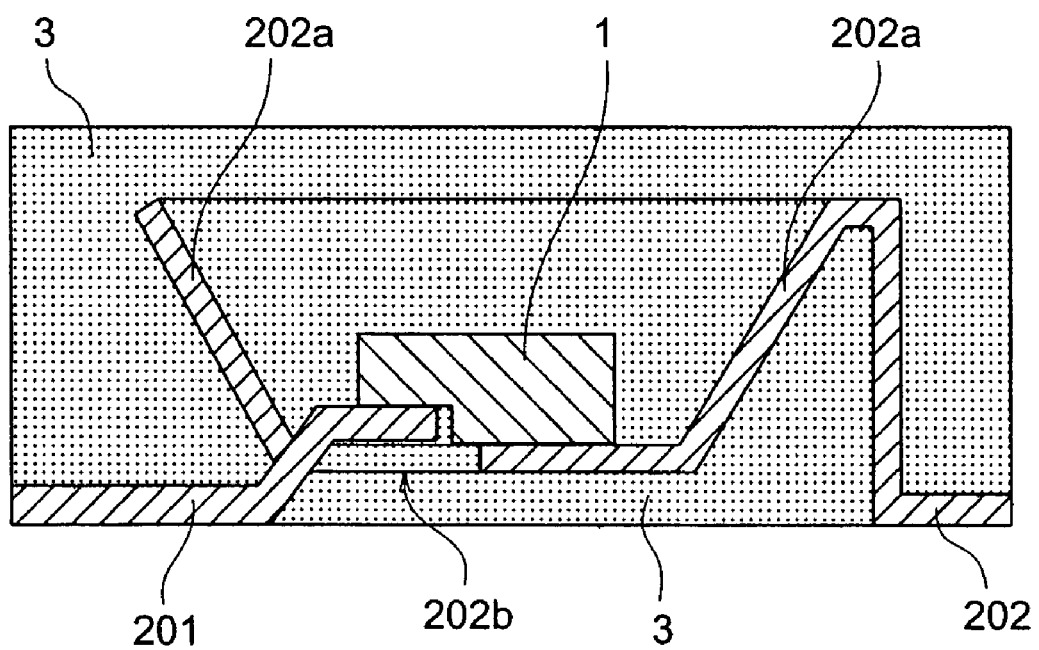
FIG. 20 is a schematic diagram for illustrating the overview configuration of the light emitting device of the second embodiment according to the present invention, and is a C-C' line cross-sectional view of FIG. 19.

FIG. 19 and FIG. 20 are schematic diagrams for illustrating overview configuration of a light emitting device of a second embodiment according to the present invention. FIG. 19 is a plan view of the light emitting device when seen from an output direction of light. FIG. 20 is a C-C' line cross-sectional view of FIG. 19.

As illustrated in FIG. 19 and FIG. 20, the light emitting device of the second embodiment includes the light emitting element 1, the first lead 201 which is electrically connected to the first electrode (not illustrated) of the light emitting element 1, the second lead 202 which is electrically connected to the second electrode (not illustrated) of the light emitting element 1, and the transparent resin 3 for sealing the surroundings of the light emitting element 1. At this time, the light emitting element 1 may be the LED chip or LD chip as was explained in the first embodiment e.g., the chip-shaped element of the configuration as was illustrated in FIG. 3. Consequently, the detailed explanation thereof will be omitted.

Also, in the light emitting device of the second embodiment, as illustrated in FIG. 19 and FIG. 20, the second lead 202 which is electrically connected to the second electrode 105 of the light emitting element 1 is formed into a cup shape. The second electrode 105 of the light emitting element 1 is electrically connected to an inner bottom-surface of this cup-shape-formed portion (which, hereinafter, will be referred to as "cup portion") 202a.

Also, at this time, an opening 202b for connecting an inner space of the cup portion 202a and the outside thereof to each other is provided on the bottom surface of the cup portion 202a. The first lead 201 is electrically connected to the first electrode 104 of the light emitting element 1 in such a manner that the first lead 201 passes through the opening 202b of the cup portion 202a.

As was explained in the first embodiment, the first lead 201 and the first electrode 104 of the light emitting element 1, and the second lead 202 and the second electrode 105 of the light emitting element 1 are electrically connected to each other respectively via the adhesion members 4 of, e.g., gold-tin alloy. Also, at this time, preferably, although the illustration is omitted, V-character grooves as were explained in the first embodiment are provided on a connection surface of the first lead 201 and a connection surface of the second lead 202.

In the light emitting device of the second embodiment as well, similarly to the light emitting device explained in the first embodiment, the wire for connecting the one electrode and the one lead to each other is unnecessary. On account of this, the light emitted from the light emitting layer of the light emitting element 1 and outputted to outside of the device is escaped from being intercepted by the wire. Accordingly, e.g., it becomes possible to prevent the shadow or light unevenness reflecting the shape of the wire from occurring in the light outputted from the light emitting device. Also, flip-chip connection is performed on the lead frame, using adhesion members composed of a metal material such as, e.g., gold-tin alloy. This allows implementation of a reduction in the electrical resistance, thereby making it possible to increase the current capacity. Consequently, it becomes possible to flow a larger current, thereby making it possible to obtain the high luminance. Also, the flip-chip connection is performed on the lead frame, using the adhesion members composed of a metal material. This allows acquisition of high heat-radiation property, thereby making it possible to effectively dissipate heat liberation even at the time when the larger current is flown.

Figure 21:
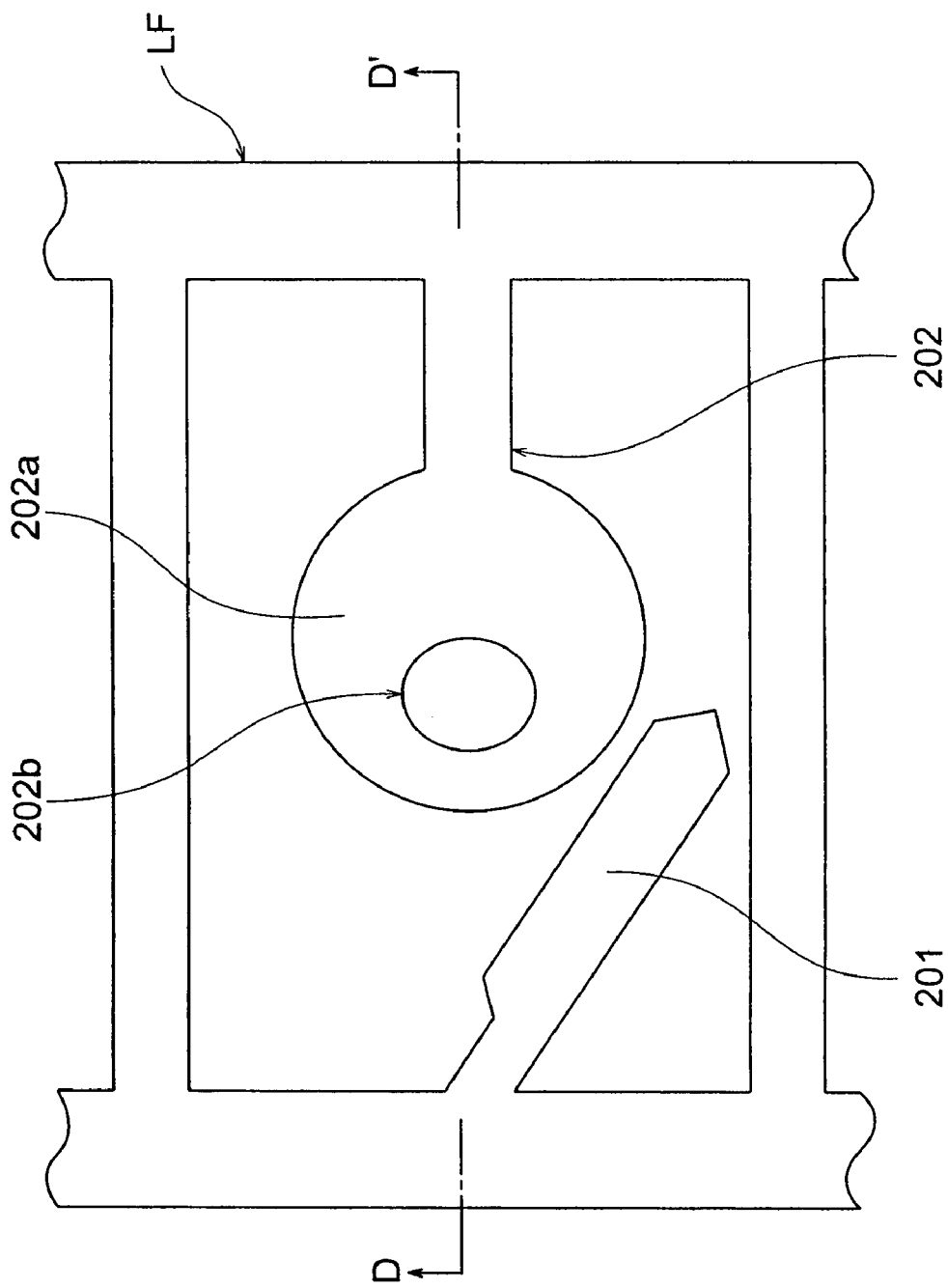
FIG. 21 is a schematic diagram for explaining a manufacturing method for manufacturing the light emitting device of the second embodiment, and is a plan view of the lead frame seen from element-mounted surface side, the lead frame being used for manufacturing the light emitting device.
Figure 22:
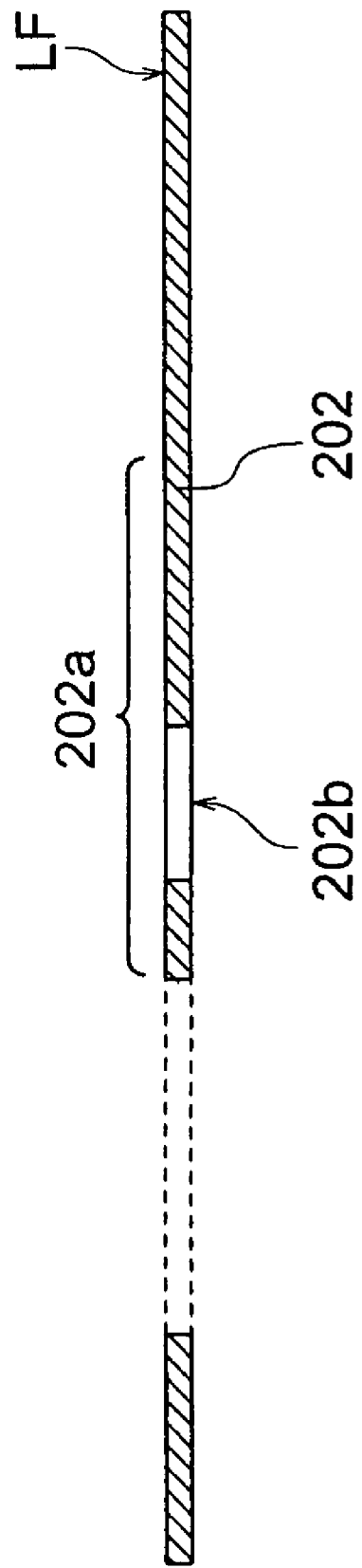
FIG. 22 is a schematic diagram for explaining the manufacturing method for manufacturing the light emitting device of the second embodiment, and is a D-D' line cross-sectional view of FIG. 21.
Figure 23:
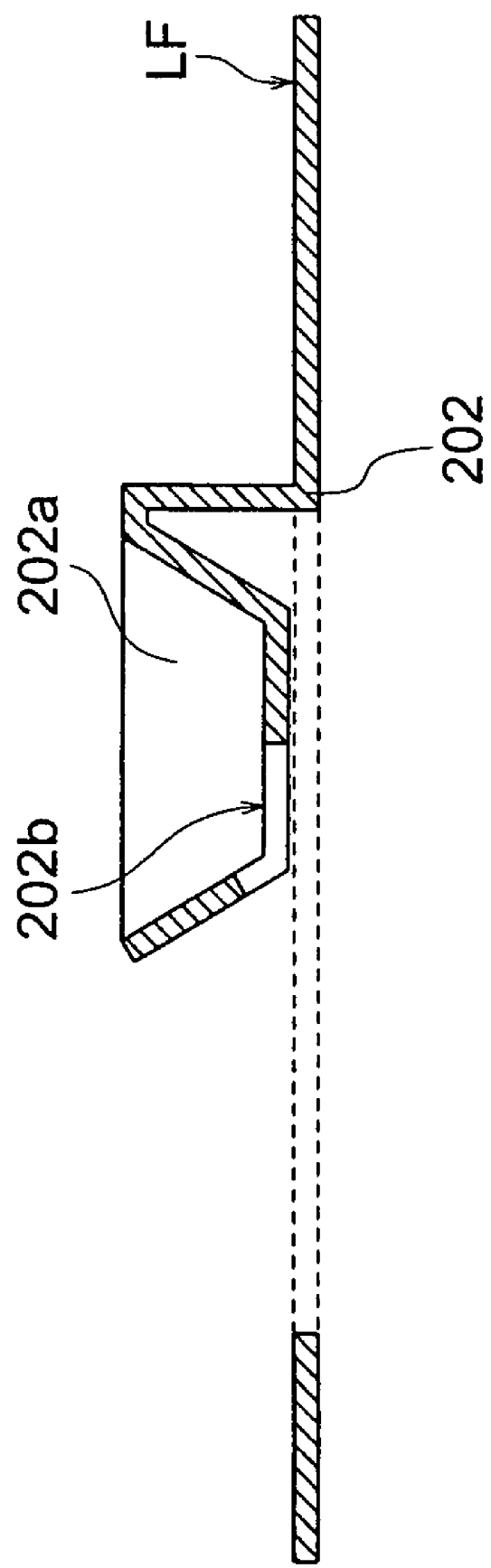
FIG. 23 is a schematic diagram for explaining the manufacturing method for manufacturing the light emitting device of the second embodiment, and is a cross-sectional view of a step of forming a cup portion.
Figure 24:
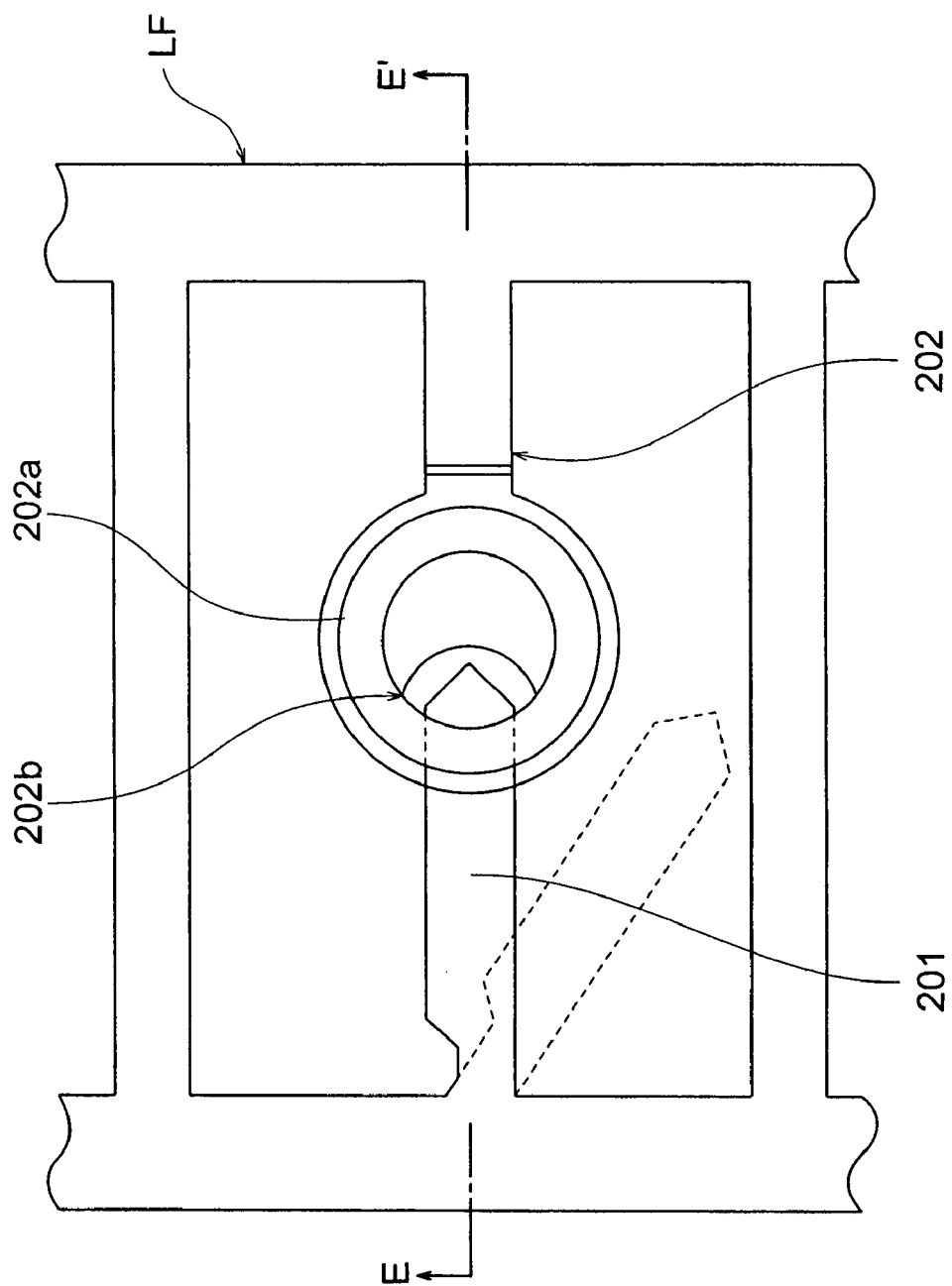
FIG. 24 is a schematic diagram for explaining the manufacturing method for manufacturing the light emitting device of the second embodiment, and is a cross-sectional view of a step of bending a first lead.
Figure 25:
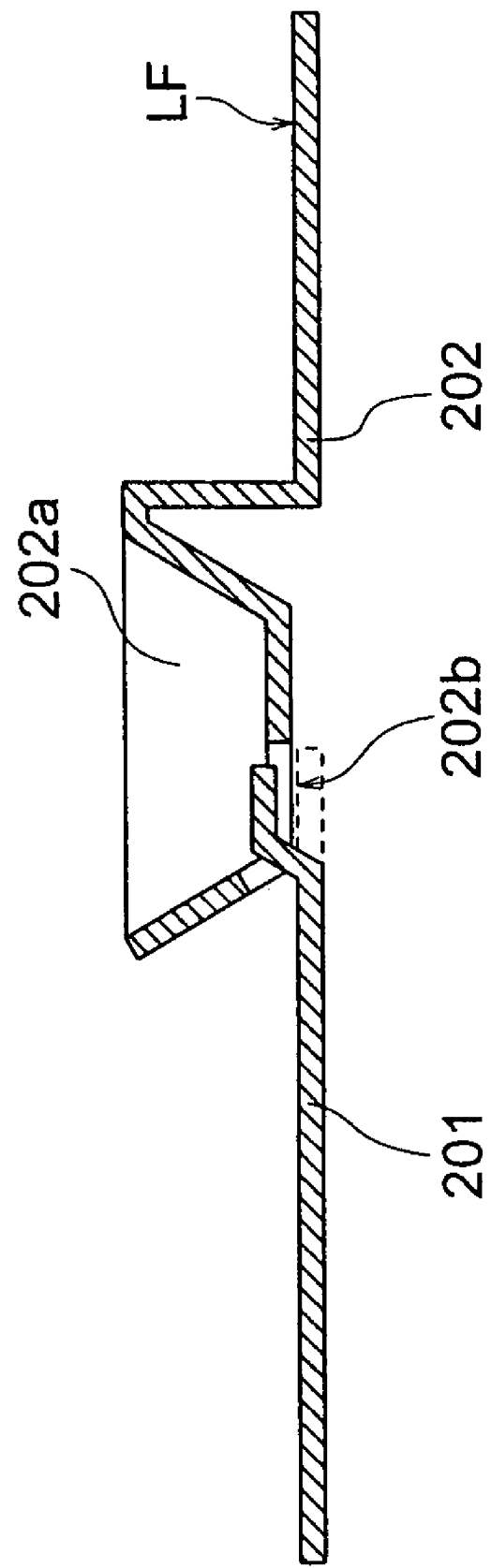
FIG. 25 is a schematic diagram for explaining the manufacturing method for manufacturing the light emitting device of the second embodiment, and is an E-E' line cross-sectional view of FIG. 24.
Figure 26:
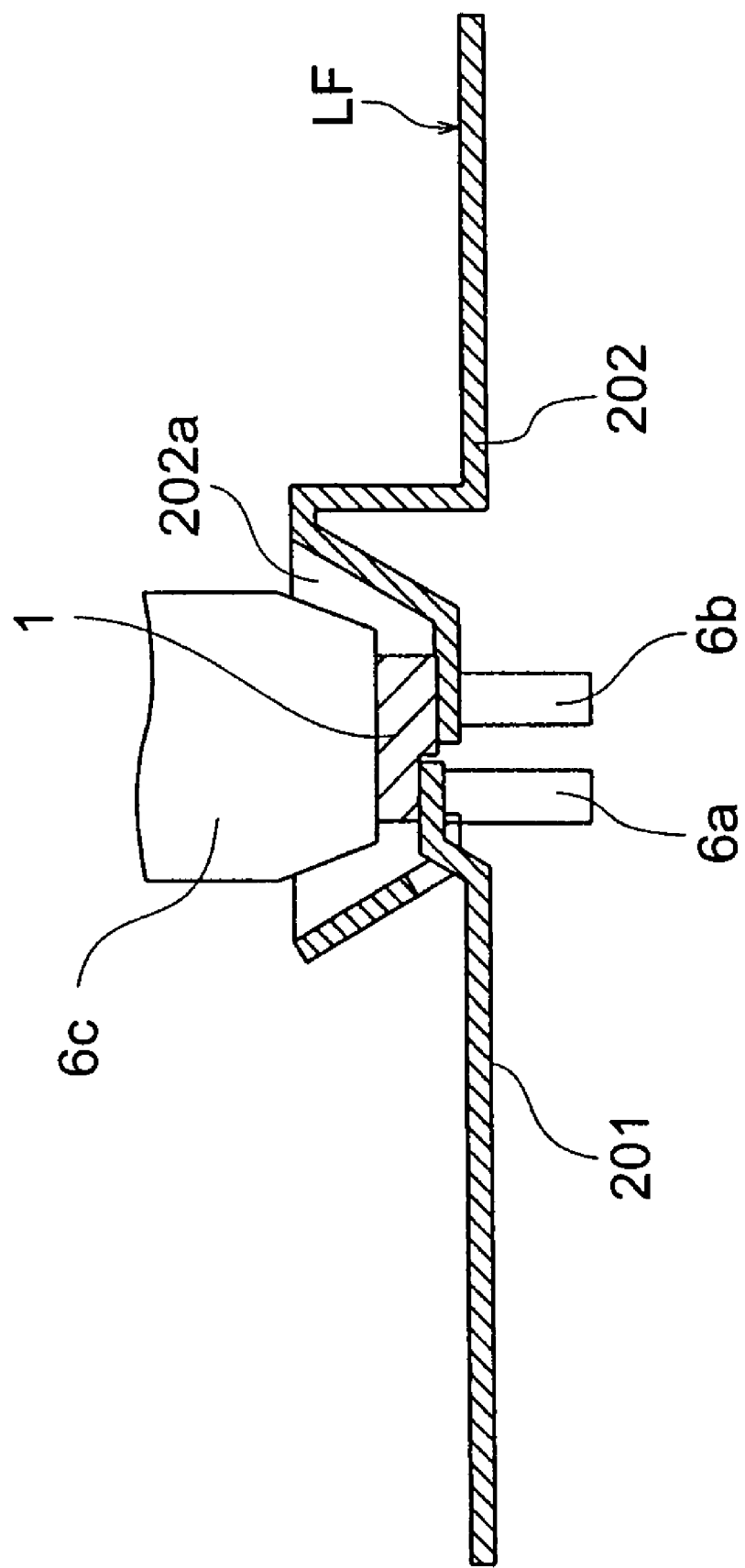
FIG. 26 is a schematic diagram for explaining the manufacturing method for manufacturing the light emitting device of the second embodiment, and is a cross-sectional view of a step of mounting the light emitting element.
Figure 27:
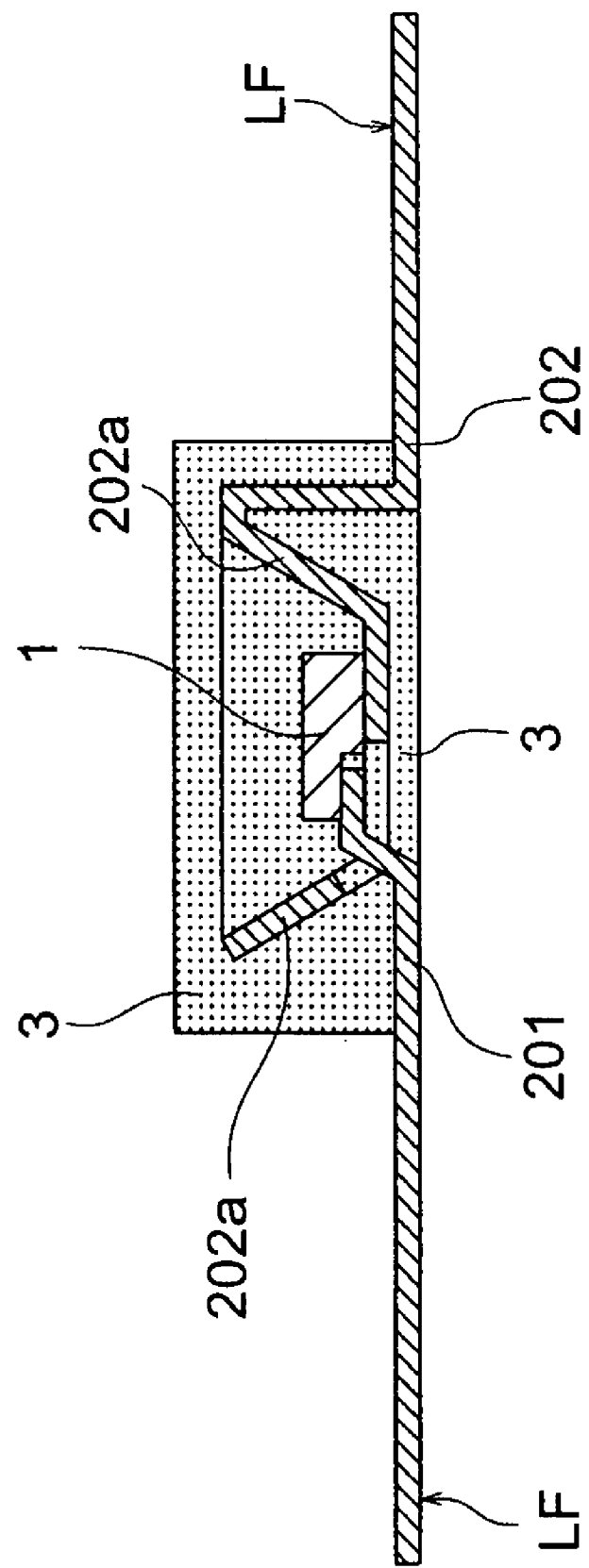
FIG. 27 is a schematic diagram for explaining the manufacturing method for manufacturing the light emitting device of the second embodiment, and is a cross-sectional view of a step of sealing surroundings of the light emitting element with a transparent resin.

FIG. 21 through FIG. 27 are schematic diagrams for explaining a manufacturing method for manufacturing the light emitting device of the second embodiment. FIG. 21 is a plan view of the lead frame seen from element-mounted surface side, the lead frame being used for manufacturing the light emitting device. FIG. 22 is a D-D'line cross-sectional view of FIG. 21. FIG. 23 is a cross-sectional view of a step of forming the cup portion. FIG. 24 is a cross-sectional view of a step of bending the first lead. FIG. 25 is an E-E'line cross-sectional view of FIG. 24. FIG. 26 is cross-sectional view of a step of mounting the light emitting element. FIG. 27 is a cross-sectional view of a step of sealing surroundings of the light emitting element with the transparent resin.

When manufacturing the light emitting device of the second embodiment, e.g., a lead frame LF as illustrated in FIG. 21 and FIG. 22 is used. At this time, the opening 202b for allowing the first lead 201 to pass therethrough is formed in a portion of the second lead 202 in which the cup portion 202a is to be formed. Also, as illustrated in FIG. 21, the first lead 201 is formed such that the first lead 201 juts in an oblique direction with respect to the second lead 202. Also, at this time, using a punching die, the lead frame LF is formed by punching a lead pattern illustrated in FIG. 21 in a conductor plate such as, e.g., an about 100-μm-thick copper plate. At this time, the lead frame LF still remains planar as is illustrated in FIG. 22. Incidentally, e.g., the lead frame LF may be a one formed by forming a plurality of lead patterns as illustrated in FIG. 21 on a tape-shaped or short-volume-shaped conductor plate whose length is long in one direction (drawing-plane up-and-down direction). Otherwise, the lead frame LF may be a one formed by forming only one lead pattern as illustrated in FIG. 21 on a piece of conductor plate.

After the lead frame LF has been prepared as is illustrated in FIG. 21 and FIG. 22, next, as illustrated in FIG. 23, the front end 202a of the second lead 202 is formed into the cup shape. The formation of the cup portion 202a is performed by using, e.g., the squeezing mold. Also, although the illustration is omitted, at this time, the V-character grooves maybe formed on the inner bottom-surface of the cup portion 202a simultaneously with the formation of the cup portion 202a. Otherwise, after finishing the formation of the cup portion 202a, the V-character grooves maybe formed by using another mold.

After the formation of the cup portion 202a has been finished, next, as illustrated in FIG. 24 and FIG. 25, the first lead 201 is bent onto the side of the opening 202b of the cup portion 202a of the second lead 202, thereby forming a front end of the first lead 201 in such a manner that the front end passes through the opening 202b of the cup portion 202a and comes into the inner space of the cup portion 202a. The formation of the first lead 201 is performed by using, e.g., the bending mold. At this time, the V-character grooves maybe formed on the connection surface with the first electrode 104 of the light emitting element 1 simultaneously with the formation of the front end of the first lead 201. Otherwise, after finishing the formation of the front end of the first lead 201, the V-character grooves maybe formed by using another mold.

In this way, after the formation of the first lead 201 and the second lead 202, next, as illustrated in FIG. 26, the light emitting element 1 is implemented. At this time, the connection portion of the first lead 201 and the connection portion of the second lead 202 are heated by using different heaters 6a and 6b, respectively. Also, e.g., the gold-tin alloy is used for the adhesion members 4 for electrically connecting each electrode 104, 105 of the light emitting element 1 and each lead 201, 202 to each other. Also, at this time, the adhesion members 4 are provided on the surfaces of the first electrode 104 and the second electrode 105 of the light emitting element 1. As a result of this configuration, when the adhesion members 4 provided on each electrode 104, 105 of the light emitting element 1 are melted by the heat from each lead 201, 202, the melted adhesion members 4 flow into the V-character grooves of each lead 201, 202. On account of this, it becomes possible to reduce failures such as, e.g., the adhesion members 4 will spread and come to the outside of the connection area, and cause a short-circuit to occur. Also, the first lead 201 and the second lead 202 are heated by using the different heaters 6a and 6b, respectively. As a result of this configuration, e.g., if a step-height difference which occurs between the connection surfaces of the first lead 201 and the second lead 202 at the bending step is not equal to the step-height difference between the first electrode 104 and the second electrode 105 of the light emitting element 1, these step-height differences can be made equal to each other by adjusting heights of the heaters 6a and 6b. On account of this, it becomes possible to reduce tilting of the light emitting element 1 and a connection failure between each electrode and each lead.

After the implementation of the light emitting element 1 has been finished, next, as illustrated in FIG. 27, the surroundings of the light emitting element is sealed with the transparent resin 3. At this time, e.g., as illustrated in FIG. 19 and FIG. 20, the transparent resin 3 is formed by a transfer mold such that the outer configuration of the transparent resin 3 becomes a rectangular parallelepiped shape which will cover the entire cup portion (reflection mirror portion) 202a. Moreover, after sealing the surroundings with the transparent resin 3, the first lead 201 and the second lead 202 are cut off along the side surface of the transparent resin 3. This allows acquisition of the light emitting device of the second embodiment.

As having been explained so far, according to the light emitting device of the second embodiment, the light emitted from the light emitting element and outputted to outside of the device is escaped from being intercepted by the bonding wire. On account of this, as compared with the light emitting device of the conventional mode as is disclosed in, e.g., JP-A-11-251645, it becomes possible to enhance the light-emission efficiency. Also, the flip-chip connection is performed on the lead frame, using the adhesion members composed of a metal material such as, e.g., gold-tin alloy. This allows implementation of a reduction in the electrical resistance, thereby making it possible to increase the current capacity. Consequently, it becomes possible to flow a larger current, thereby making it possible to obtain the high luminance. Also, the flip-chip connection is performed on the lead frame, using the adhesion members composed of a metal material. This allows acquisition of the high heat-radiation property, thereby making it possible to effectively dissipate the heat liberation even at the time when the larger current is flown.

Also, when manufacturing the light emitting device of the second embodiment, as illustrated in FIG. 20 and FIG. 25, the first lead 201 is bent in such a manner that the front end of the first lead 201 to be connected to the first electrode 104 of the light emitting element 1 passes through the opening 202b of the second lead 202 to be connected to the second electrode 105, and comes into the inner space of the cup portion 202a. This relaxes the step-height difference between the first electrode 104 and the second electrode 105 of the light emitting element 1. Also, the first lead 201 and the second lead 202 are heated by using the different heaters 6a and 6b, respectively. As a result of this configuration, e.g., if the step-height difference which occurs between the connection surfaces of the first lead 201 and the second lead 202 at the bending step is not equal to the step-height difference between the first electrode 104 and the second electrode 105 of the light emitting element 1, these step-height differences can be made equal to each other by adjusting the heights of the heaters 6a and 6b. On account of this, it becomes possible to reduce the tilting of the light emitting element 1 and the connection failure between each electrode and each lead. Also, it is effective enough only to change the bending quantity of each lead 201, 202 of the lead frame LF. Accordingly, the manufacturing is easier, and simultaneously the manufacturing cost can be reduced.

Also, although the detailed explanation using drawings will be omitted, in the light emitting device of the second embodiment as well, before performing the sealing with the transparent resin 3, the cup portion 202a is filled with the resin 7 produced by mixing the fluorescent materials (wavelength conversion materials). As a result of this filling, it becomes possible to manufacture the light emitting device which is capable of outputting light of various wavelengths without being limited to the light of the wavelength (color) specific to the light emitting element 1.

Also, at this time, there are some cases where, if the viscosity of the resin 7 produced by mixing the fluorescent materials is low, the resin 7 with which the cup portion 202a is filled flows out of the opening 202b. Accordingly, if the viscosity of the resin 7 is low, e.g., similarly to the example illustrated in FIG. 17, the opening 202b of the cup portion 202a is closed. Simultaneously, the first sealing resin layer 3a is formed which is in an extent of the height of not covering the light emitting layer of the light emitting element 1. After that, the cup portion 202a is filled with the resin 7 produced by mixing the fluorescent materials. Furthermore, after that, the second sealing resin layer 3b is formed.

Also, in the light emitting device of the second embodiment, as illustrated in FIG. 19 and FIG. 20, the example has been cited where the cup portion 202a is formed such that the outer configuration thereof becomes the conic pyramid shape or elliptic pyramid shape. Being not limited thereto, however, the cup portion 202a may also be formed into e.g., concave mirror shape.

Also, in the light emitting device of the second embodiment as well, similarly to the first embodiment, the first electrode 104 and the second electrode 105 of the light emitting element 1 are provided on the same principal-surface side of the substrate 101. As long as this configuration is implemented, the light emitting element 1 may also be either a LED chip emitting whatever-color light, or a LD chip.

Also, in the light emitting device of the second embodiment, as illustrated in FIG. 19 and FIG. 20, the transparent resin 3 is formed such that the outer configuration thereof becomes the rectangular parallelepiped shape. Being not limited thereto, however, the transparent resin 3 may also be formed such that the light-outputting surface is formed into, e.g., convex lens shape or Fresnel lens shape.

Embodiment 3

Figure 28:
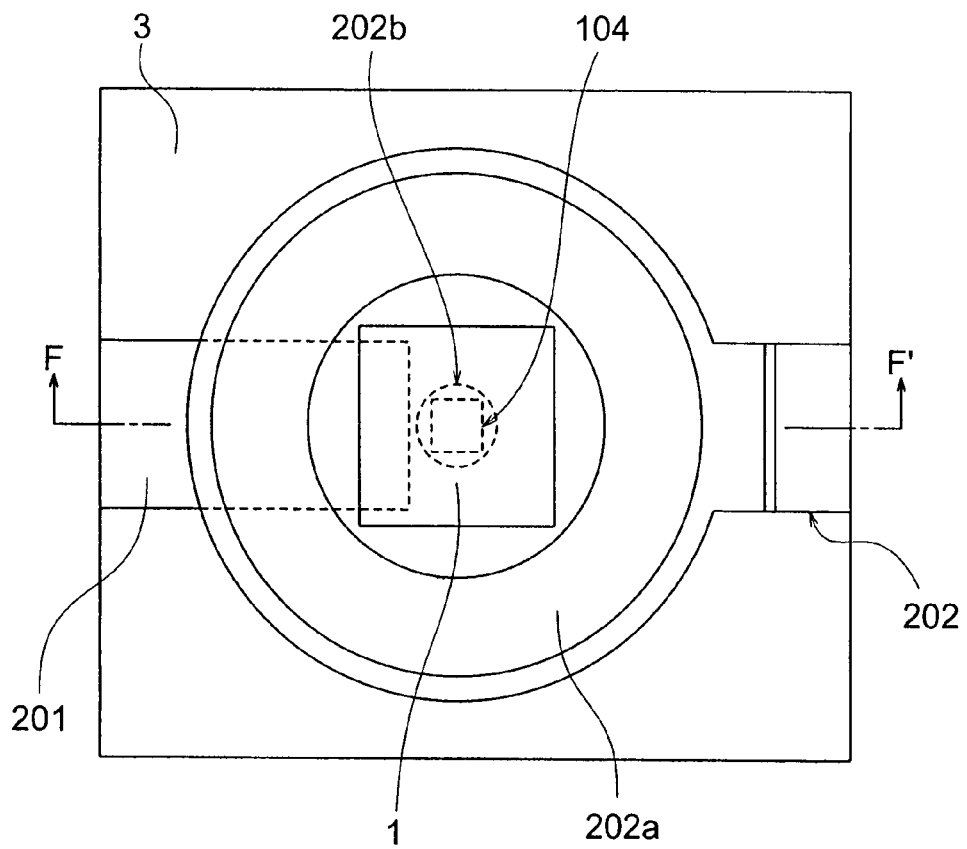
FIG. 28 is a schematic diagram for illustrating overview configuration of a light emitting device of a third embodiment according to the present invention, and is a plan view of the light emitting device when seen from an output direction of light.
Figure 29:
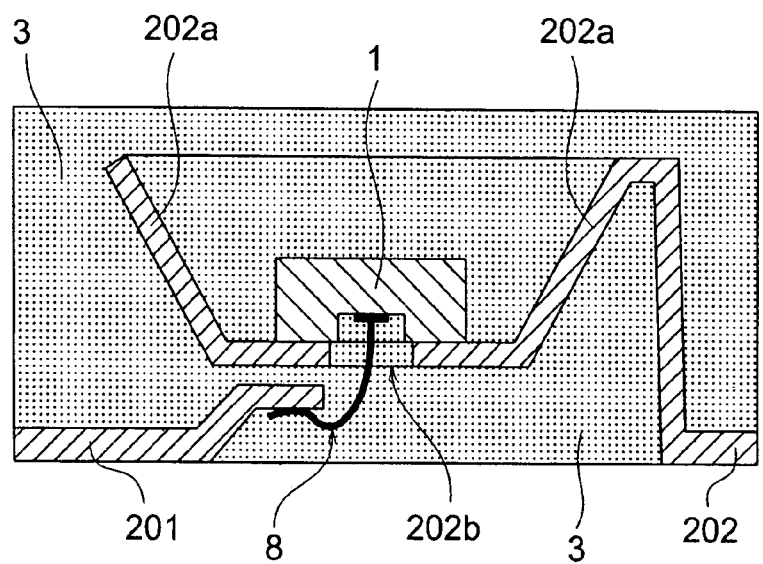
FIG. 29 is a schematic diagram for illustrating the overview configuration of the light emitting device of the third embodiment according to the present invention, and is an F-F' line cross-sectional view of FIG. 28.
Figure 30:
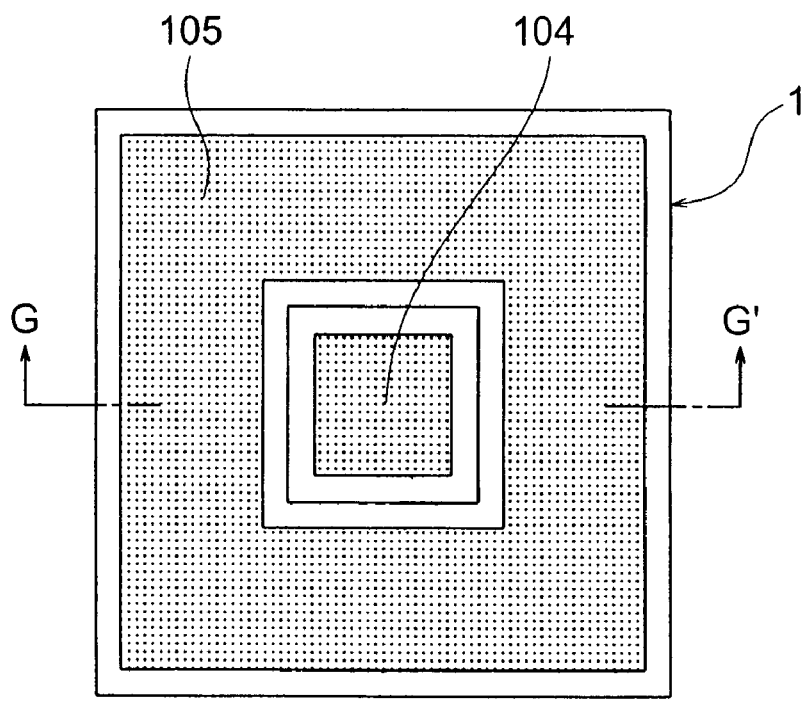
FIG. 30 is a schematic diagram for illustrating the overview configuration of the light emitting device of the third embodiment according to the present invention, and is a plan view of the light emitting device when seen from the electrode-surface side.
Figure 31:
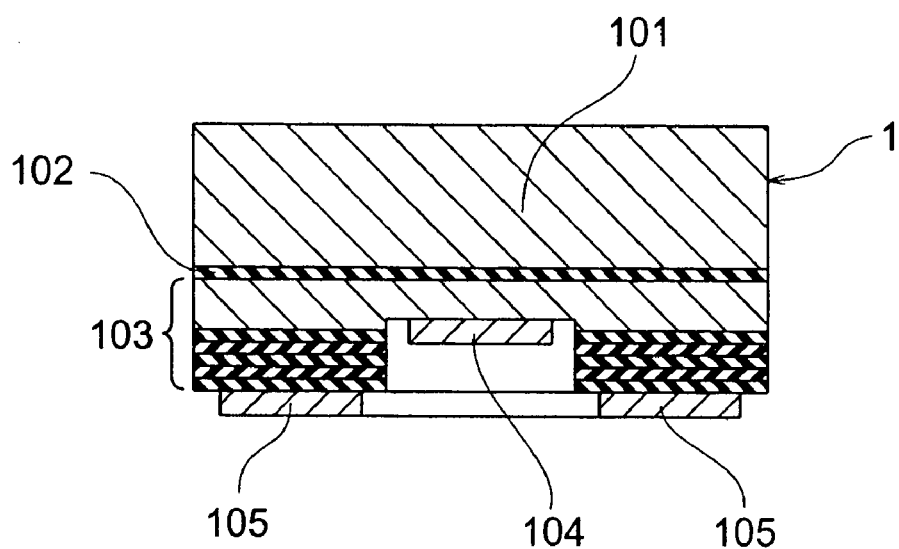
FIG. 31 is a schematic diagram for illustrating the overview configuration of the light emitting device of the third embodiment according to the present invention, and is a G-G' line cross-sectional view of FIG. 30.

FIG. 28 and FIG. 31 are schematic diagrams for illustrating overview configuration of a light emitting device of a third embodiment according to the present invention. FIG. 28 is a plan view of the light emitting device when seen from an output direction of light. FIG. 29 is an F-F' line cross-sectional view of FIG. 28. FIG. 30 is a plan view of the light emitting device when seen from the electrode-surface side. FIG. 31 is a G-G' line cross-sectional view of FIG. 30. Incidentally, FIG. 31 illustrates the cross-sectional view in a manner of being turned upside down.

As illustrated in FIG. 28 and FIG. 29, the light emitting device of the third embodiment includes the light emitting element 1, the first lead 201 which is electrically connected to the first electrode (not illustrated) of the light emitting element 1, the second lead 202 which is electrically connected to the second electrode (not illustrated) of the light emitting element 1, and the transparent resin 3 for sealing the surroundings of the light emitting element 1.

Also, in the light emitting element 1 used for the light emitting device of the third embodiment, as illustrated in FIG. 30 and FIG. 31, the semiconductor layers 103 engaged in performing the light emission are multilayered via the buffer layer 102 on one principal surface of the substrate 101. At this time, if the light emitting element 1 is, e.g., a blue-color light emitting LED chip, the substrate 101 is composed of, e.g., sapphire. Also, at this time, the buffer layer 102 is composed of, e.g., AlN. Also, at this time, the semiconductor layers 103 engaged in performing the light emission are formed by multilayering, e.g., first n-type GaN layer, second n-type GaN layer, InGaN layer (light emitting layer), p-type AlGaN layer, first p-type GaN layer, and second p-type GaN layer (not illustrated) from the side of the buffer layer 102.

Moreover, in the light emitting element 1 used for the light emitting device of the third embodiment, as illustrated in FIG. 30 and FIG. 31, a concave portion reaching the first n-type GaN layer is provided in proximity to the center of the semiconductor layers 103 engaged in performing the light emission. The first electrode 104 is provided on the bottom surface of the concave portion. Also, the second electrode 105 is provided on the second p-type GaN layer. Namely, in the light emitting element 1 used for the light emitting device of the third embodiment, the second electrode 105 is provided in a ring-shaped manner in surroundings of the first electrode 104.

Also, as illustrated in FIG. 28 and FIG. 29, the second lead 202 is formed into a cup shape whose outer configuration becomes conic pyramid shape or elliptic pyramid shape. The second electrode 105 of the light emitting element 1 is electrically connected to an inner bottom-surface of this cup-shape-formed portion (which, hereinafter, will be referred to as "cup portion") 202a of the second lead 202. At this time, the second electrode 105 of the light emitting element 1 and the second lead 202 are electrically connected to each other respectively via the adhesion members 4 of, e.g., gold-tin alloy. Also, although the illustration is omitted, as was explained in the first embodiment and the like, the V-character grooves are provided on the cup portion 202a of the second lead 202, the V-character grooves extending from inside the connection area with the second electrode 105 of the light emitting element 1 to outside the connection area.

Also, on the bottom surface of the cup portion 202a of the second lead 202, as illustrated in FIG. 28 and FIG. 29, a through hole 202b is provided on the inner side of the ring-shaped area connected to the second electrode 105. Furthermore, as illustrated in FIG. 29, the first electrode 104 of the light emitting element 1 and the first lead 201 are electrically connected to each other via a bonding wire 8 which passes through the through hole 202b of the cup portion 202a of the second lead 202.

In the light emitting device of the third embodiment, a voltage is applied between the first electrode 104 and the second electrode 105 of the light emitting element 1 by taking advantage of the first lead 201 and the second lead 202. As a result of this, light of a wavelength corresponding to the configuration of the semiconductor layers 103 engaged in performing the light emission is light-emitted (emitted) from the light emitting layer of the light emitting element 1. At this time, of the light emitted from the light emitting layer, light emitted from the side surface of the light emitting element 1 is reflected on the side surface of the cup portion 202a. This reflection changes its light path in a drawing-plane upward direction. Also, if the substrate 101 of the light emitting element 1 is a light-through substrate such as, e.g., sapphire, light emitted from the light emitting layer onto the substrate side passes through the substrate 101, then being emitted in the drawing-plane upward direction. As a consequence, in the light emitting device of the third embodiment, the light emitted from the light emitting element 1 is capable of being gathered and directed in the drawing-plane upward direction, thereby being able to be outputted to the outside of the light emitting device.

Also, in the light emitting device of the third embodiment, the first electrode 104 and the second electrode 105 of the light emitting element 1 are provided on the same principal-surface side of the substrate 101. Moreover, the first electrode 104 and the first lead 201 are electrically connected to each other via the bonding wire 8 which passes through the through hole 202b of the cup portion 202a of the second lead 202, and which is extracted into an opposite direction to the output direction of the light. Namely, in the light emitting device of the third embodiment, like the light emitting device disclosed in, e.g., JP-A-11-251645, the wire for connecting the one electrode and the one lead to each other is necessary. Nevertheless, the wire will not intercept the light emitted from the light emitting element into the output direction, or the light whose light path is changed into the output direction by being reflected on the side surface of the cup portion 202a. On account of this, the light emitted from the light emitting layer of the light emitting element is escaped from being intercepted by the wire. Accordingly, e.g., it becomes possible to prevent the shadow or light unevenness reflecting the shape of the wire from occurring in the light outputted from the light emitting device.

Also, in the case of the light emitting devices of the first and second embodiments, it is possible to prevent the lowering in the light-emission efficiency caused by the interception of the light by the bonding wire. However, the light emitted from the side surface (i.e., outer circumferential surface) of the light emitting layer of the light emitting element 1 into the principal-surface direction (i.e., drawing-plane horizontal direction) of the substrate is partially intercepted by the connection portion between the first electrode 104 and the first lead 201. On the other hand, in the case of the light emitting device of the third embodiment, the light emitting layer of the light emitting element 1 is provided in the ring-shaped manner in the surroundings of the first electrode 104 (and the bonding wire 8). On account of this, the light emitted from the outer circumferential surface of the light emitting layer into the principal-surface direction (i.e., drawing-plane horizontal direction) of the substrate is escaped from being intercepted by the connection portion between the first electrode 104 and the first lead 201. This makes it possible to enhance the light-emission efficiency even further.

Figure 32:
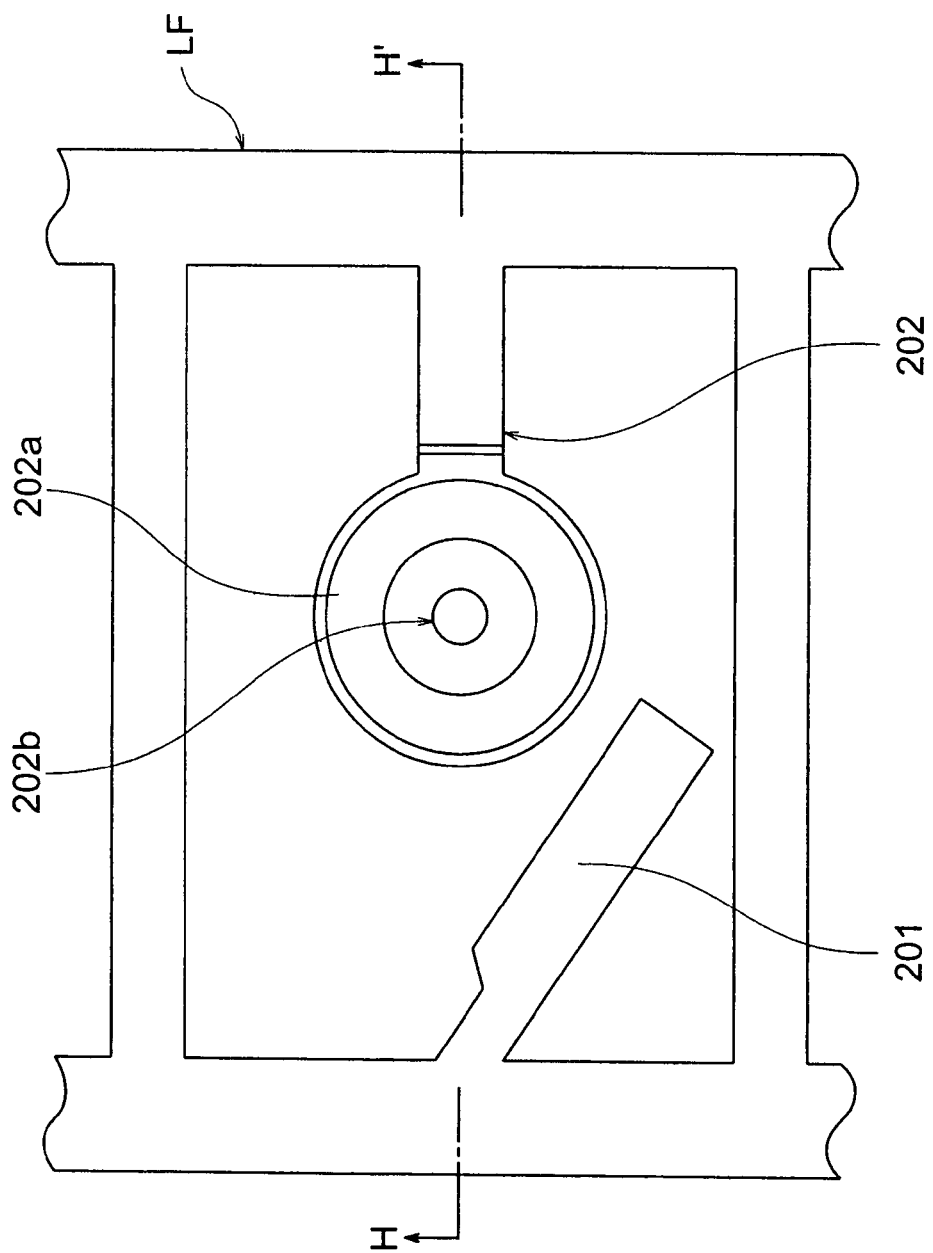
FIG. 32 is a schematic diagram for explaining a manufacturing method for manufacturing the light emitting device of the third embodiment, and is a plan view of the lead frame seen from element-mounted surface side, the lead frame being used for manufacturing the light emitting device.
Figure 33:
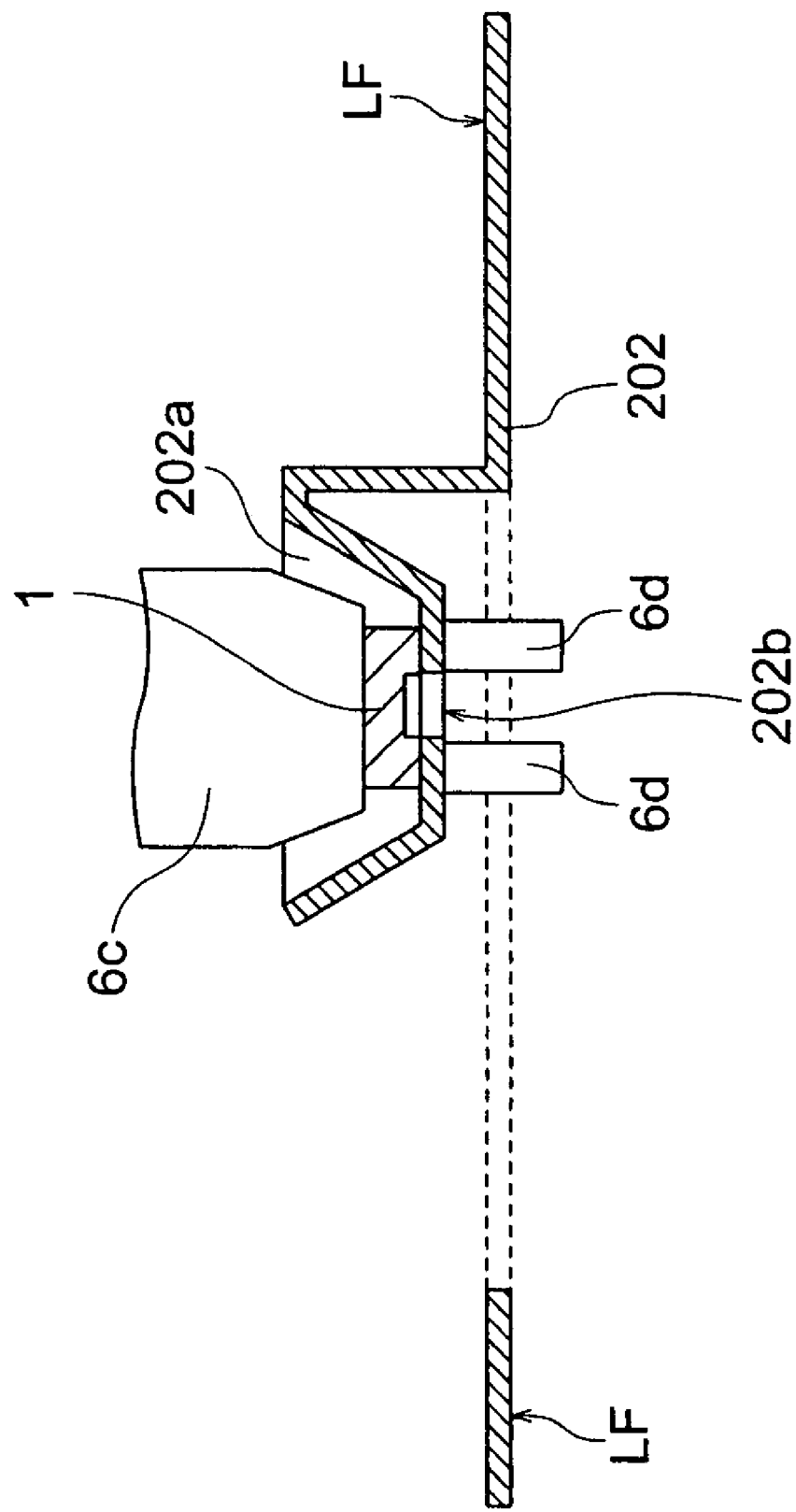
FIG. 33 is a schematic diagram for explaining the manufacturing method for manufacturing the light emitting device of the third embodiment, and is a cross-sectional view of a step of connecting a second electrode of the light emitting element and a second lead to each other.
Figure 34:
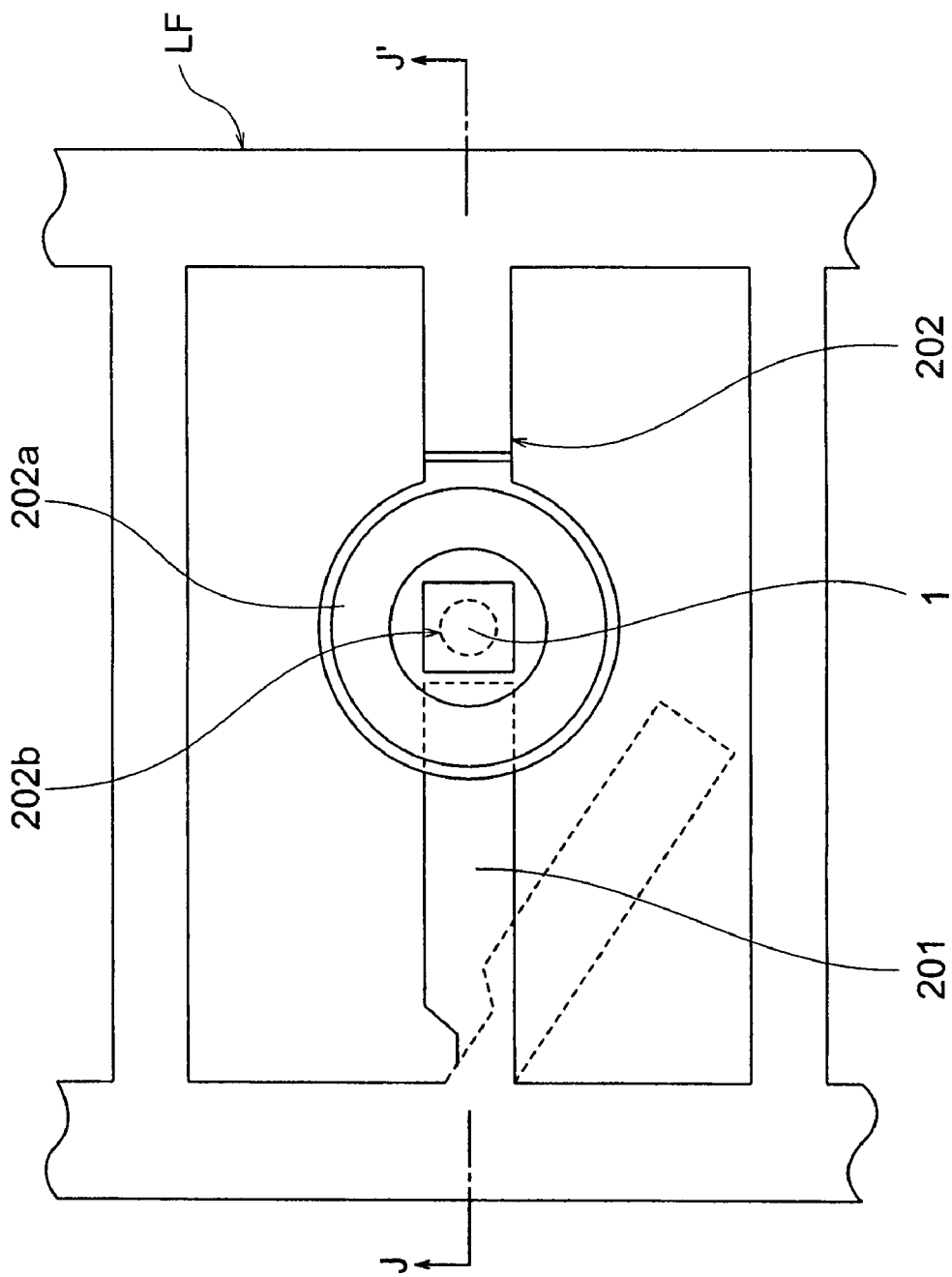
FIG. 34 is a schematic diagram for explaining the manufacturing method for manufacturing the light emitting device of the third embodiment, and is a plan view of a step of bending a first lead.
Figure 35:
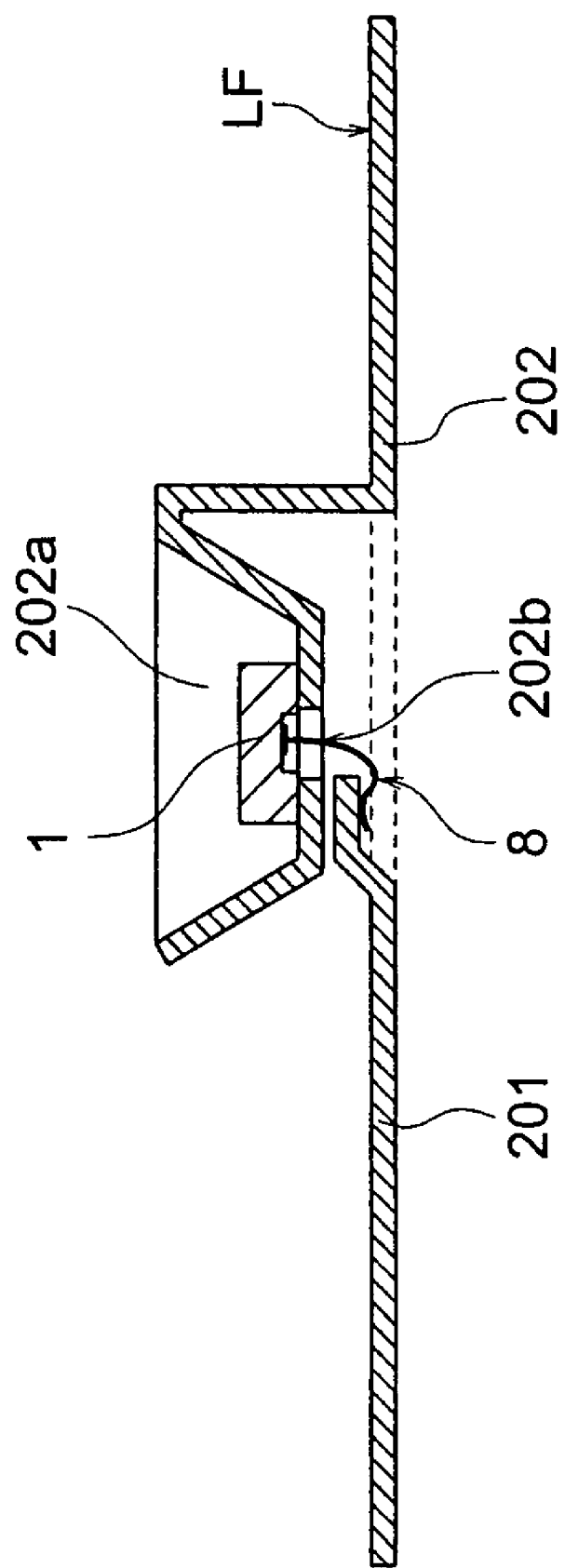
FIG. 35 is a schematic diagram for explaining the manufacturing method for manufacturing the light emitting device of the third embodiment, and is a cross-sectional view of a step of connecting a first electrode of the light emitting element and the first lead to each other.

FIG. 32 through FIG. 35 are schematic diagrams for explaining a manufacturing method for manufacturing the light emitting device of the third embodiment. FIG. 32 is a plan view of the lead frame seen from element-mounted surface side, the lead frame being used for manufacturing the light emitting device. FIG. 33 is a cross-sectional view of a step of connecting the second electrode of the light emitting element and the second lead to each other. FIG. 34 is plan view of a step of bending the first lead. FIG. 35 is a cross-sectional view of a step of connecting the first electrode of the light emitting element and the first lead to each other.

When manufacturing the light emitting device of the third embodiment, e.g., a lead frame LF as illustrated in FIG. 32 is used. At this time, the through hole (opening) 202b for allowing the bonding wire 8 to pass therethrough is formed in proximity to the center of a portion of the second lead 202 in which the cup portion 202a is to be formed. Also, as illustrated in FIG. 32, the first lead 201 is formed such that the first lead 201 juts in an oblique direction with respect to the second lead 202. Also, at this time, using a punching die, the lead frame LF is formed in a conductor plate such as, e.g., an about 100-μm-thick copper plate. On account of this, although the illustration is omitted, the lead frame LF at the time immediately after a lead pattern is formed by using the punching die still remains planar. On account of this, after forming the lead pattern by using the punching die, using e.g., the squeezing mold, the cup portion 202a of the second lead 202 is formed into the cup shape whose outer configuration becomes the conic pyramid shape or elliptic pyramid shape as illustrated in FIG. 28 and FIG. 29. Also at this time, although the illustration is omitted, when forming the V-character grooves on the inner bottom-surface of the cup portion 202a, the V-character grooves maybe formed simultaneously with the formation using the squeezing mold. Otherwise, after finishing the formation using the squeezing mold, the V-character grooves maybe formed by using another mold.

Incidentally, e.g., the lead frame LF may be a one formed by forming a plurality of lead patterns as illustrated in FIG. 32 on a tape-shaped or short-volume-shaped conductor plate whose length is long in one direction (drawing-plane up-and-down direction). Otherwise, the lead frame LF may be a one formed by forming only one lead pattern as illustrated in FIG. 32 on a piece of conductor plate.

After the formation of the cup portion 202a of the second lead 202 has been finished, next, as illustrated in FIG. 33, the inner bottom-surface of the cup portion 202a and the second electrode 105 of the light emitting element 1 are electrically connected to each other. At this time, although the illustration is omitted, the second electrode 105 of the light emitting element 1 and the inner bottom-surface of the cup portion 202a are electrically connected to each other by using the adhesion members 4 of, e.g., gold-tin alloy. Also, the adhesion members 4 are provided on the side of the second electrode 105 of the light emitting element 1. Moreover, as illustrated in FIG. 33, in a state where the cup portion 202a of the second lead 202 is heated by the heater 6d, the light emitting element 1 absorbed into a collet 6c is pressed onto the bottom surface of the cup portion 202a. Then, the adhesion members 4 are melted, thereby connecting the second electrode 105 to the second lead 202. As a result of this configuration, when the adhesion members 4 provided on the second electrode 105 of the light emitting element 1 are melted by the heat from the second lead 202, the melted adhesion members 4 flow into the V-character grooves on the bottom surface of the cup portion 202a. On account of this, it becomes possible to reduce failures such as, e.g., the adhesion members 4 will spread and come to the outside of the connection area, and cause a short-circuit to occur.

After the second electrode 105 of the light emitting element 1 and the cup portion 202a of the second lead 202 have been connected to each other, next, as illustrated in FIG. 34, the first lead 201 is bent into the direction of the through hole 202b of the cup portion 202a of the second lead 202. At this time, although the illustration is omitted, before bending the first lead 201 into the direction of the through hole 202b of the second lead 202, as illustrated in FIG. 29, a front-end portion of the first lead 201 is bent onto the side of the cup portion 202a.

After the first lead 201 has been bent into the direction of the through hole 202b of the second lead 202, next, as illustrated in FIG. 35, the first electrode 104 of the light emitting element 1 and the first lead 201 are electrically connected to each other via the bonding wire 8. Moreover, after that, although the illustration is omitted, surroundings of the light emitting element 1 is sealed by a transfer mold or the like with the transparent resin 3 formed such that the outer configuration thereof becomes a rectangular parallelepiped shape. Furthermore, the first lead 201 and the second lead 202 are cut off along the side surface of the transparent resin 3. This allows acquisition of the light emitting device of the third embodiment.

As having been explained so far, according to the light emitting device of the third embodiment, the light emitted from the light emitting element and outputted to outside of the device is escaped from being intercepted by the bonding wire. On account of this, as compared with the light emitting device of the conventional mode as is disclosed in, e.g., JP-A-11-251645, it becomes possible to enhance the light-emission efficiency.

Also, when manufacturing the light emitting device of the third embodiment, the first electrode 104 of the light emitting element 1 and the first lead 201 are electrically connected to each other via the bonding wire 8 which passes through the through hole 202b of the cup portion 202a of the second lead 202. On account of this, the processings for relaxing the step-height difference between the first electrode 104 and the second electrode 105 of the light emitting element 1 are unnecessary, which are necessary in the first and second embodiments as were explained earlier. On account of this, it becomes possible to reduce the tilting of the light emitting element 1 and the connection failure between each electrode and each lead.

Figure 36:
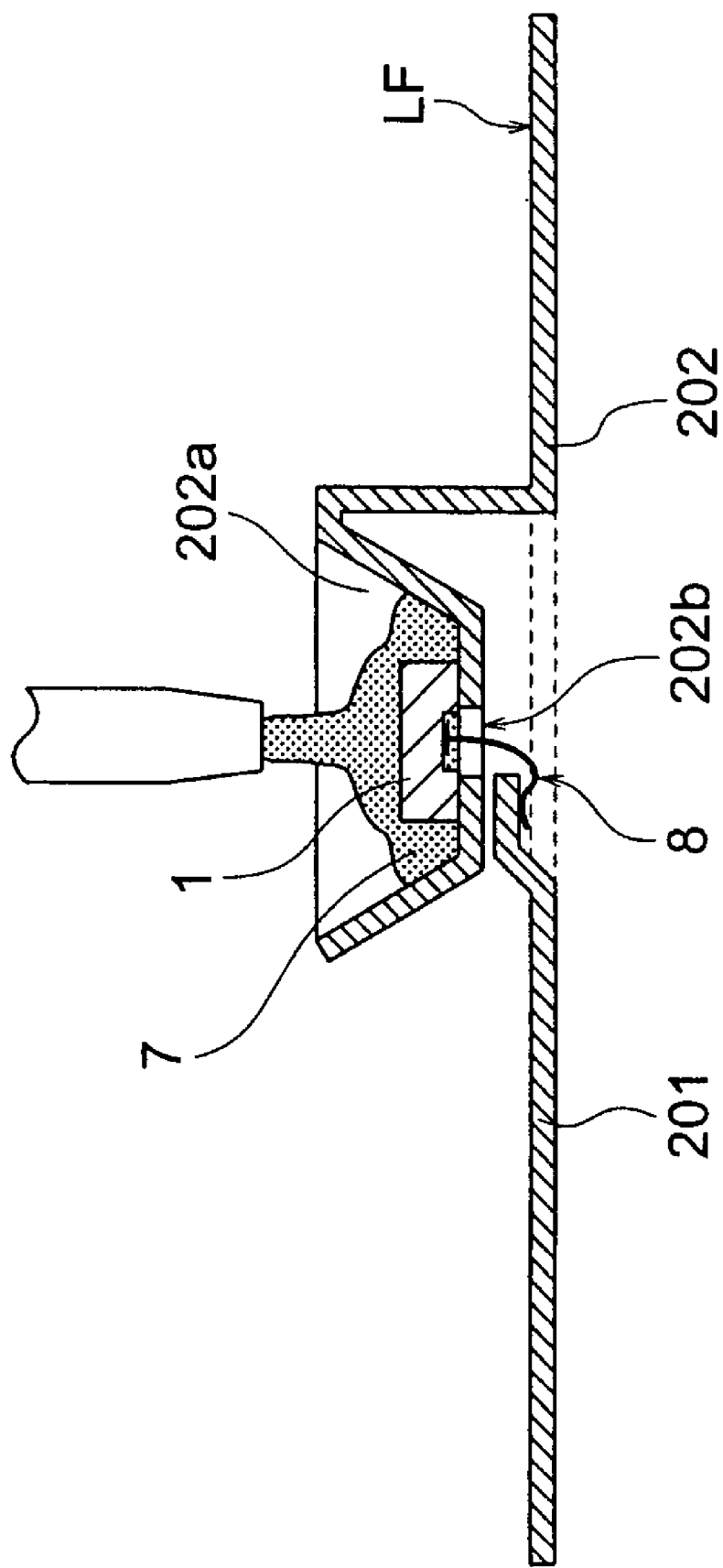
FIG. 36 is a schematic diagram for explaining the other effects of the light emitting device of the third embodiment, and is a cross-sectional view of a step of filling the cup portion with a resin produced by mixing fluorescent materials.

FIG. 36 is a schematic diagram for explaining the other effects of the light emitting device of the third embodiment, and is a cross-sectional view of a step of filling the cup portion with the resin produced by mixing fluorescent materials.

In the light emitting device of the third embodiment as well, similarly to the light emitting devices of the first and second embodiments, before performing the sealing with the transparent resin 3, the cup portion 202a is filled with the resin 7 produced by mixing the fluorescent materials (wavelength conversion materials). As a result of this filling, it becomes possible to manufacture the light emitting device which is capable of outputting light of various wavelengths without being limited to the light of the wavelength (color) specific to the light emitting element 1.

At this time, e.g., as illustrated in FIG. 36, the resin 7 produced by mixing the fluorescent materials is ejected from a nozzle. Then, the cup portion 202a is filled therewith.

In the case of the light emitting devices of the first and second embodiments, there are some cases where, e.g., if the viscosity of the resin 7 produced by mixing the fluorescent materials is low, the resin 7 with which the reflection mirror portion (cup portion) 202a is filled flows out of the opening. Accordingly, the processing for closing the opening with another resin 3a was necessary before performing the sealing. In the case of the light emitting device of the third embodiment, however, the second electrode 105 of the light emitting element 1 and the second lead 202 (cup portion 202a) are connected to each other in the ring-shaped manner in the surroundings of the through hole 202b of the cup portion 202a. On account of this, when the cup portion 202a is filled with the resin 7 produced by mixing the fluorescent materials, the connection portion between the second electrode 105 of the light emitting element 1 and the second lead 202 becomes a wall against the resin 7. Consequently, the resin 7 with which the cup portion is filled will not flow out of the through hole 202b. On account of this, even if the viscosity of the resin 7 produced by mixing the fluorescent materials is low, the processing for forming the first sealing resin layer 3a is unnecessary, which is necessary in the first and second embodiments as were explained earlier. Accordingly, the manufacturing cost can be reduced.

Also, in the light emitting device of the third embodiment, as illustrated in FIG. 28 and FIG. 29, the example has been cited where the cup portion 202a is formed such that the outer configuration thereof becomes the conic pyramid shape or elliptic pyramid shape. Being not limited thereto, however, the cup portion 202a may also be formed into e.g., concave mirror shape.

Also, in the light emitting device of the third embodiment as well, similarly to the first embodiment, the first electrode 104 and the second electrode 105 of the light emitting element 1 are provided on the same principal-surface side of the substrate 101. As long as this configuration is implemented, the light emitting element 1 may also be either a LED chip emitting whatever-color light, or a LD chip.

Also, in the light emitting device of the third embodiment, as illustrated in FIG. 28 and FIG. 29, the transparent resin 3 is formed such that the outer configuration thereof becomes the rectangular parallelepiped shape. Being not limited thereto, however, the transparent resin 3 may also be formed such that the light-outputting surface is formed into, e.g., convex lens shape or Fresnel lens shape.

Embodiment 4

Figure 37:
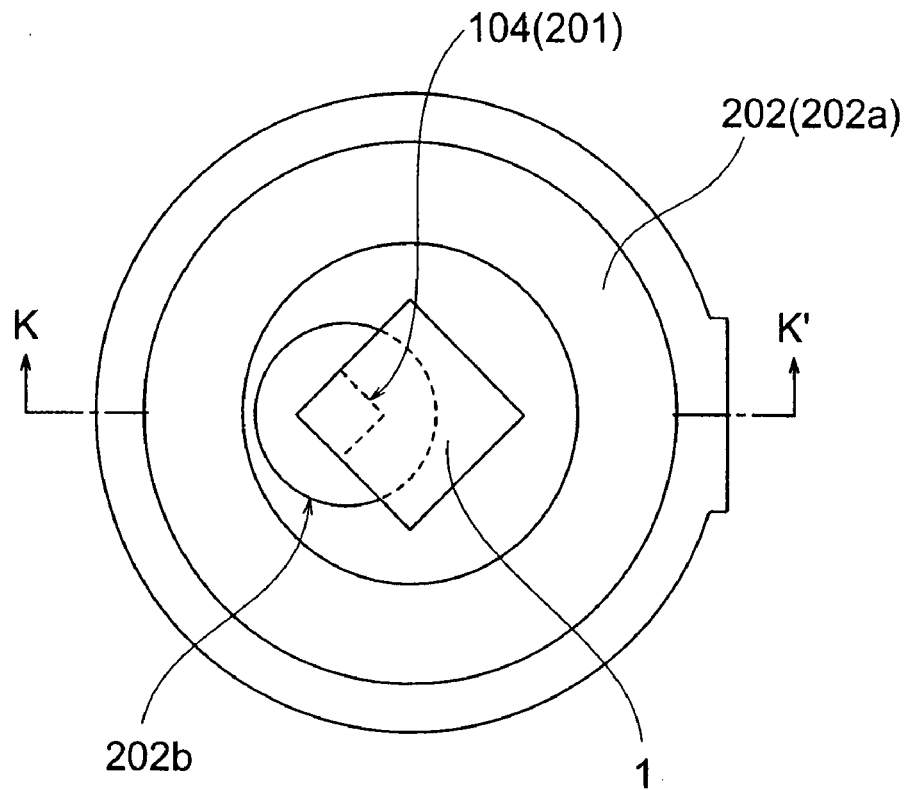
FIG. 37 is a schematic diagram for illustrating overview configuration of a light emitting device of a fourth embodiment according to the present invention, and is a plan view of the light emitting device when seen from an output direction of light.
Figure 38:
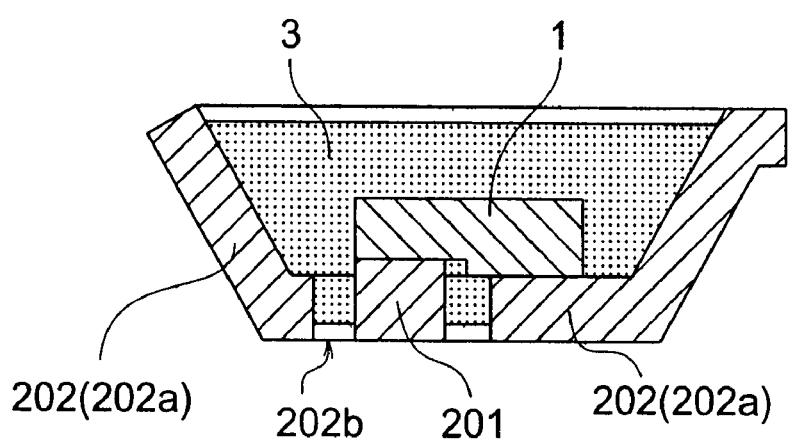
FIG. 38 is a schematic diagram for illustrating the overview configuration of the light emitting device of the fourth embodiment according to the present invention, and is a K-K' line cross-sectional view of FIG. 37.

FIG. 37 and FIG. 38 are schematic diagrams for illustrating overview configuration of a light emitting device of a fourth embodiment according to the present invention. FIG. 37 is a plan view of the light emitting device when seen from an output direction of light. FIG. 38 is a K-K' line cross-sectional view of FIG. 37.

As illustrated in FIG. 37 and FIG. 38, the light emitting device of the fourth embodiment includes the light emitting element 1, the first lead 201 which is electrically connected to the first electrode (not illustrated) of the light emitting element 1, the second lead 202 which is electrically connected to the second electrode (not illustrated) of the light emitting element 1, and the transparent resin 3 for sealing the surroundings of the light emitting element 1.

At this time, configuration of the light emitting element 1 is basically the same as the one of the light emitting element used in the light emitting device of the first embodiment. Consequently, the detailed explanation thereof will be omitted.

Also, in the light emitting device of the fourth embodiment, as illustrated in FIG. 37 and FIG. 38, the second lead 202 is a conductor which is formed into a cup shape. Also, a through hole 202b is provided on the bottom surface of the cup portion 202a of the second lead 202. At this time, although the illustration is omitted, the second electrode 105 of the light emitting element 1 and the second lead 202 are electrically connected to each other respectively via the adhesion members of, e.g., gold-tin alloy. Also, at this time, although the illustration is omitted, the V-character grooves are provided on the bottom surface of the second lead 202, the V-character grooves extending from inside the connection area to outside the connection area.

Also, in the light emitting device of the fourth embodiment, as illustrated in FIG. 37 and FIG. 38, the first lead 201 is a column-shaped conductor which passes through the through hole 202b of the second lead 202. At this time, although the illustration is omitted, the first electrode 104 of the light emitting element 1 and the first lead 201 are electrically connected to each other via a high melting-point solder such as, e.g., an alloy whose composition ratio of Sn, Ag, Cu is substantially equal to 96.5:3:0.5. Incidentally, a material for connecting the first electrode 104 and the first lead 201 to each other is not limited to the high melting-point solder of the above-described composition ratio. Instead, a suitable material can be appropriately selected and used from among already-known materials. Also, the first lead 201 is electrically isolated from the second lead 202 by the transparent resin 3 with which the through hole 202b of the second lead 202 is filled.

In the light emitting device of the fourth embodiment, a voltage is applied between the first electrode 104 and the second electrode 105 of the light emitting element 1 by taking advantage of the first lead 201 and the second lead 202. As a result of this, light of a wavelength corresponding to the configuration of the semiconductor layers 103 engaged in performing the light emission is light-emitted (emitted) from the light emitting layer of the light emitting element 1. At this time, of the light emitted from the light emitting layer, light emitted from the side surface of the light emitting element 1 is reflected on the side surface of the second lead (cup portion) 202. This reflection changes its light path in a drawing-plane upward direction. Also, if the substrate 101 of the light emitting element 1 is a light-through substrate such as, e.g., sapphire, light emitted from the light emitting layer onto the substrate side passes through the substrate 101, then being emitted in the drawing-plane upward direction. As a consequence, in the light emitting device of the third embodiment, the light emitted from the light emitting element 1 is capable of being gathered and directed in the drawing-plane upward direction, thereby being able to be outputted to the outside of the light emitting device.

Also, in the light emitting device of the fourth embodiment, the first electrode 104 and the second electrode 105 of the light emitting element 1 are provided on the same principal-surface side of the substrate 101. Moreover, the first electrode 104 is connected to the first lead 201 which passes through the through hole 202b of the second lead 202, and which is extracted onto the rear-surface side of the surface on which the light emitting element 1 is mounted. Namely, in the light emitting device of the fourth embodiment, unlike the light emitting device disclosed in, e.g., JP-A-11-251645, the wire for connecting the one electrode and the one lead to each other is unnecessary. On account of this, the light emitted from the light emitting layer of the light emitting element is escaped from being intercepted by the wire. Accordingly, e.g., it becomes possible to prevent the shadow or light unevenness reflecting the shape of the wire from occurring in the light outputted from the light emitting device.

Figure 39:
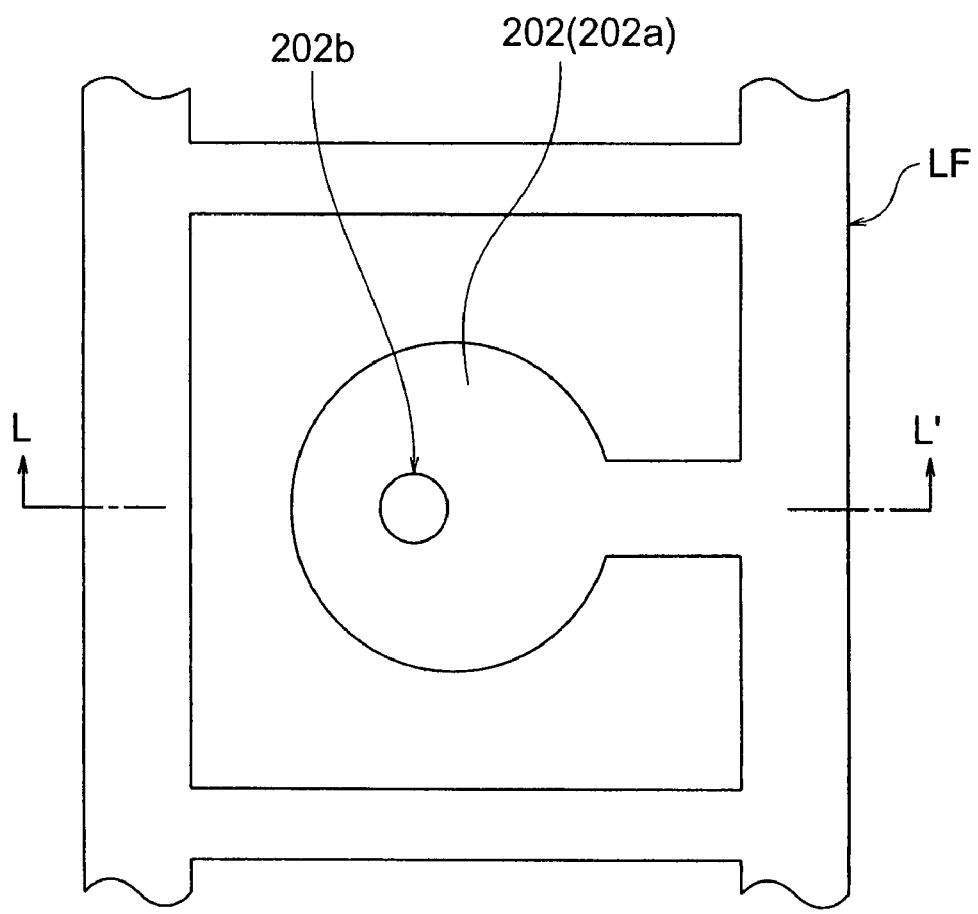
FIG. 39 is a schematic diagram for explaining a manufacturing method for manufacturing the light emitting device of the fourth embodiment, and is a plan view of the lead frame seen from element-mounted surface side, the lead frame being used for manufacturing the light emitting device.
Figure 40:
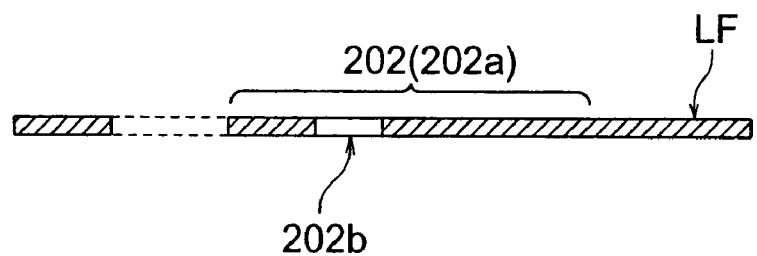
FIG. 40 is a schematic diagram for explaining the manufacturing method for manufacturing the light emitting device of the fourth embodiment, and is an L-L' line cross-sectional view of FIG. 39.
Figure 41:
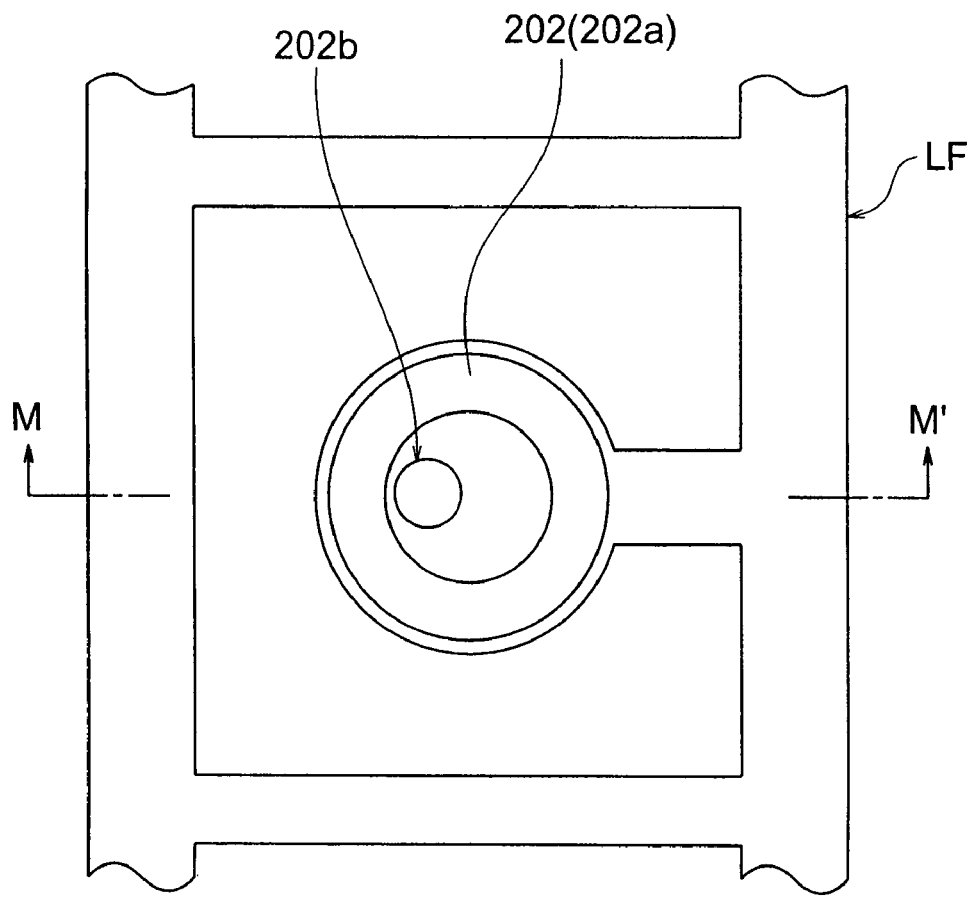
FIG. 41 is a schematic diagram for explaining the manufacturing method for manufacturing the light emitting device of the fourth embodiment, and is a plan view of a step of forming the second lead (cup-shaped lead).
Figure 42:
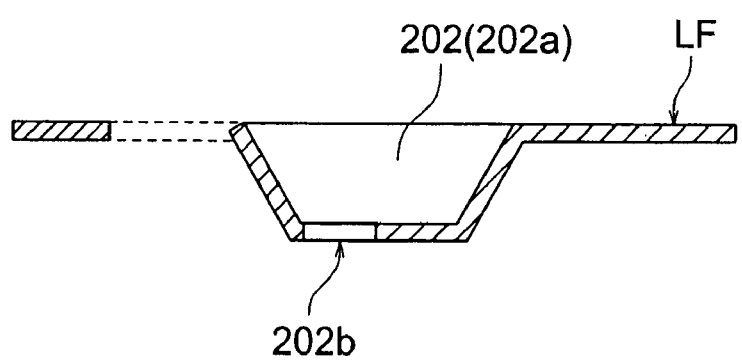
FIG. 42 is a schematic diagram for explaining the manufacturing method for manufacturing the light emitting device of the fourth embodiment, and is an M-M' line cross-sectional view of FIG. 41.
Figure 43:
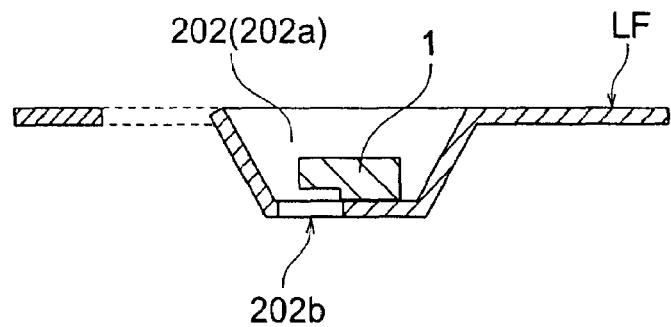
FIG. 43 is a schematic diagram for explaining the manufacturing method for manufacturing the light emitting device of the fourth embodiment, and is a cross-sectional view of a step of connecting the second electrode of the light emitting element and the second lead to each other.
Figure 44:
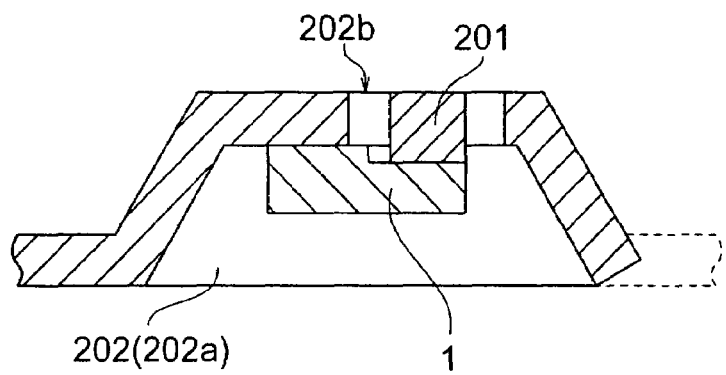
FIG. 44 is a schematic diagram for explaining the manufacturing method for manufacturing the light emitting device of the fourth embodiment, and is a cross-sectional view of a step of connecting the first electrode of the light emitting element and the first lead to each other.
Figure 45:
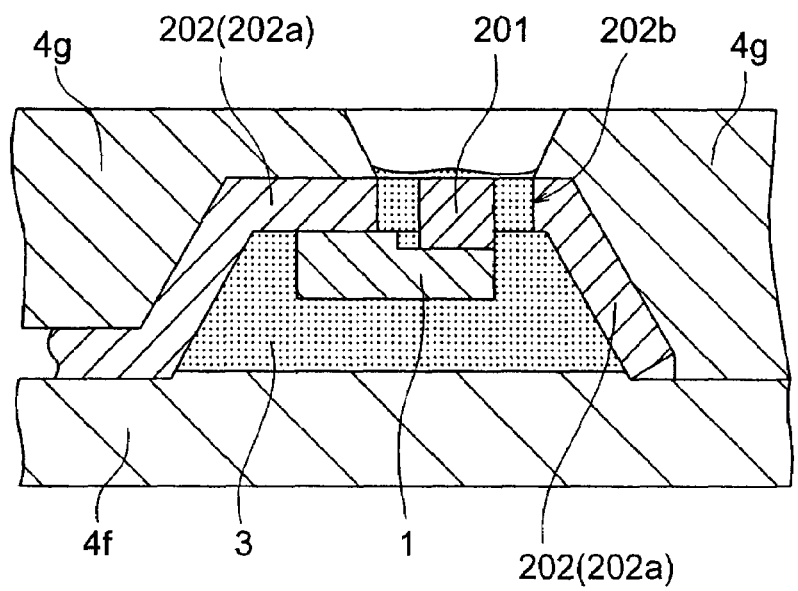
FIG. 45 is a schematic diagram for explaining the manufacturing method for manufacturing the light emitting device of the fourth embodiment, and is a cross-sectional view of a step of sealing surroundings of the light emitting element with a transparent resin.
Figure 46:
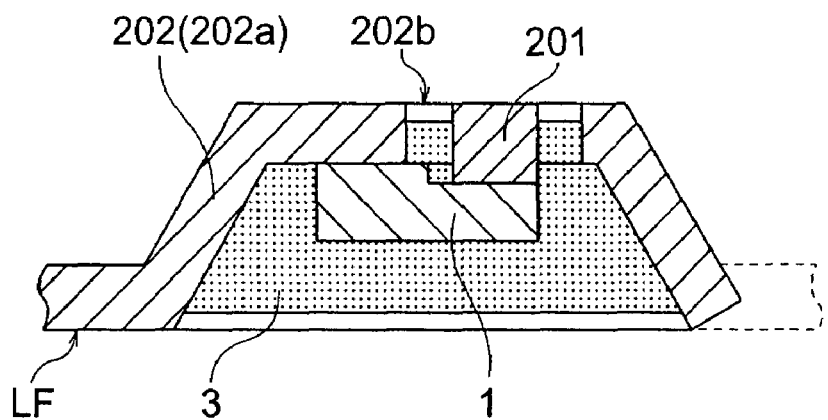
FIG. 46 is a schematic diagram for explaining the manufacturing method for manufacturing the light emitting device of the fourth embodiment, and is a cross-sectional view of a step of completing the light emitting device.

FIG. 39 through FIG. 46 are schematic diagrams for explaining a manufacturing method for manufacturing the light emitting device of the fourth embodiment. FIG. 39 is a plan view of the lead frame seen from element-mounted surface side, the lead frame being used for manufacturing the light emitting device. FIG. 40 is an L-L' line cross-sectional view of FIG. 39. FIG. 41 is a plan view of a step of forming the second lead (cup-shaped lead). FIG. 42 is an M-M' line cross-sectional view of FIG. 41. FIG. 43 is a cross-sectional view of a step of connecting the second electrode of the light emitting element and the second lead to each other. FIG. 44 is a cross-sectional view of a step of connecting the first electrode of the light emitting element and the first lead to each other. FIG. 45 a cross-sectional view of a step of sealing surroundings of the light emitting element with a transparent resin. FIG. 46 is a cross-sectional view of a step of completing the light emitting device.

When manufacturing the light emitting device of the fourth embodiment, e.g., a lead frame LF as illustrated in FIG. 39 and FIG. 40 is used. At this time, only a lead pattern for forming the second lead (cup-shaped lead) 202 is formed on the lead frame LF. Also, at this time, the through hole 202b is formed in advance in a predetermined area of the second lead 202. Also, at this time, using a punching die, the lead frame LF is formed in a conductor plate such as, e.g., an about 100-μm-thick copper plate. On account of this, although the illustration is omitted, the lead frame LF at the time immediately after the lead pattern is formed by using the punching die is still the planar LF.

After the lead pattern has been formed, next, as illustrated in FIG. 41 and FIG. 42, the second lead 202 is formed into the cup shape. At this time, using e.g., the squeezing mold, the second lead 202 is formed such that outer configuration of the second lead 202 becomes conic pyramid shape or elliptic pyramid shape. Also, at this time, although the illustration is omitted, when forming the V-character grooves on the inner bottom-surface of the cup portion, the V-character grooves maybe formed simultaneously with the formation using the squeezing mold. Otherwise, after finishing the formation using the squeezing mold, the V-character grooves maybe formed by using another mold.

After the second lead 202 has been formed into the cup shape, next, as illustrated in FIG. 43, the second electrode 105 of the light emitting element 1 and the inner bottom-surface of the second lead (cup-shaped lead) 202 are electrically connected to each other. The connection method (adhesion method) for connecting the second electrode 105 and the second lead 202 is exactly the same as was explained in the third embodiment. Consequently, the detailed explanation thereof will be omitted.

After the second electrode 105 of the light emitting element 1 and the second lead 202 have been electrically connected to each other, next, as illustrated in FIG. 44, the lead frame LF is turned upside down in the up-and-down direction. Moreover, the first lead 201 is caused to pass through the through hole 202b of the second lead 202, and then the first electrode 104 of the light emitting element 1 and the first lead 201 are electrically connected to each other. At this time, the first electrode 104 of the light emitting element 1 and the first lead 201 are connected via the high melting-point solder such as, e.g., an alloy whose composition ratio of Sn, Ag, Cu is substantially equal to 96.5:3:0.5.

After the first electrode 104 of the light emitting element 1 and the first lead 201 have been electrically connected to each other, next, as illustrated in FIG. 45, the transparent resin 3 is poured into an inner space of the cup portion 202a of the second lead 202 from the through hole 202b on the bottom surface of the second lead 202, thereby sealing surroundings of the light emitting element 1 with the transparent resin 3. This is performed in a state where a lid is put on the opening end of the second lead 202 by using forming dies 4f and 4g.

However, when the transparent resin 3 is poured into the cup portion, the following phenomenon occurs in some cases: Namely, as illustrated in FIG. 45, the transparent resin 3 is too much in quantity, and thus the first lead 201 is covered with the transparent resin 3.

Accordingly, after the transparent resin 3 has been poured into the cup portion, as illustrated in FIG. 46, the transparent resin 3 covering the first lead 201 is eliminated by irradiating the transparent resin 3 with, e.g., a carbon-dioxide laser. Furthermore, the second lead (cup-shaped lead) 202 is cut off at a position illustrated in FIG. 46. This allows acquisition of the light emitting device of the fourth embodiment.

Figure 47:
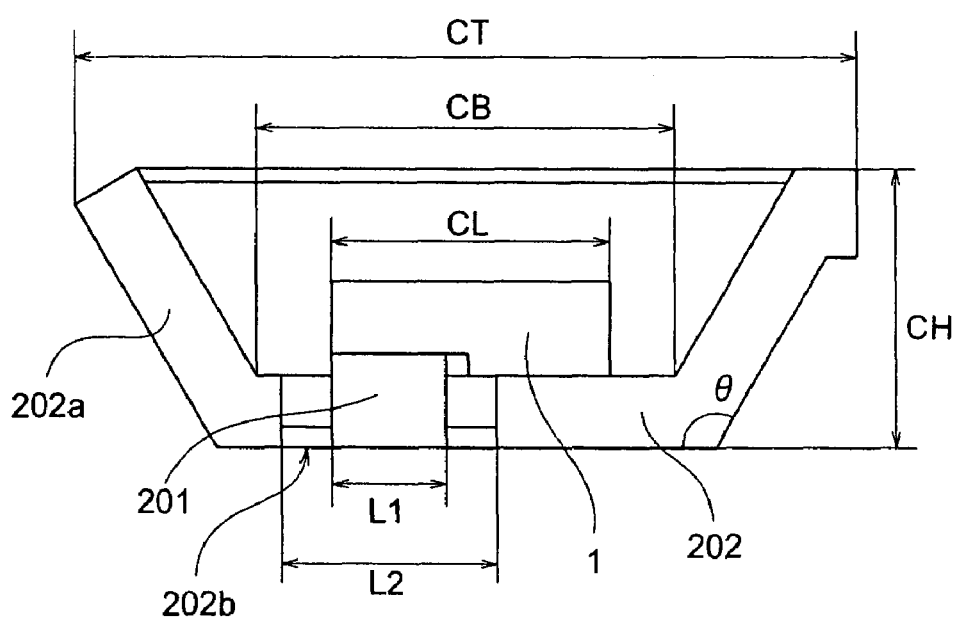
FIG. 47 is a schematic diagram for explaining one of effects of the light emitting device of the fourth embodiment.

FIG. 47 is a schematic diagram for explaining one of effects of the light emitting device of the fourth embodiment.

In the light emitting devices of the second and third embodiments, the implementation-purpose terminal portion to the implementation substrate or the like is provided in the outer portion of the cup portion 202a of the second lead 202. In the light emitting device of the fourth embodiment, however, the outer bottom-surface of the cup portion 202a is used as the implementation-purpose terminal portion. At this time, if, e.g., a LED chip whose one side is 300 μm long is used as the light emitting element 1, diagonal length CL of the light emitting element illustrated in FIG. 47 becomes equal to about 420 μm. On account of this, diameter CB of the inner bottom-surface of the second lead (cup-shaped lead) 202 is satisfying enough if it is, e.g., substantially 550 μm long. Also, at this time, diameter CT of the opening end of the second lead 202 differs depending on, e.g., height (depth) CH of the second lead 202 and angle θ formed between the bottom surface and the side surface (reflection mirror portion). The diameter CT, however, can be formed at substantially 900 μm by setting the height CH of the second lead 202 at 300 μm. Namely, by manufacturing the light emitting device in accordance with the method as explained in the fourth embodiment, it becomes possible to easily manufacture the very small-sized light emitting element.

Also, if diameter L1 of the implementation-purpose terminal surface is equal to at least substantially 150 μm, the first lead 201 can be sufficiently connected (adhered) to the wiring (terminal) of the implementation substrate. Also, at this time, if diameter L2 of the through hole 202b of the second lead 202 is equal to at least substantially 300 μm, the transparent resin 3 can be sufficiently poured from a spacing between inner-circumference surface of the through hole 202b and the first lead 201.

As having been explained so far, according to the light emitting device of the fourth embodiment, the light emitted from the light emitting element and outputted to outside of the device is escaped from being intercepted by the bonding wire. On account of this, as compared with the light emitting device of the conventional mode as is disclosed in, e.g., JP-A-11-251645, it becomes possible to enhance the light-emission efficiency. Also, the flip-chip connection is performed on the lead frame, using the adhesion members composed of a metal material such as, e.g., gold-tin alloy. This allows implementation of a reduction in the electrical resistance, thereby making it possible to increase the current capacity. Consequently, it becomes possible to flow a larger current, thereby making it possible to obtain the high luminance. Also, the flip-chip connection is performed on the lead frame, using the adhesion members composed of a metal material. This allows acquisition of the high heat-radiation property, thereby making it possible to effectively dissipate the heat liberation even at the time when the larger current is flown.

Also, in the light emitting device of the fourth embodiment, the second lead 202 is formed into the cup shape, and the outer bottom-surface of the cup portion is used as the implementation-purpose terminal surface. Also, the through hole 202b is provided on the bottom surface of the second lead 202, and the first lead 201 which is electrically isolated from the second lead 202 is provided inside the through hole 202b. On account of this, unlike the light emitting devices of the second and third embodiments, the implementation-purpose terminal portion does not protrude into the outside of the second lead (cup-shaped lead) 202 when seen from the output direction of the light. This makes it possible to obtain the very small-sized light emitting device.

Also, in the light emitting device of the fourth embodiment, the example has been cited where the second lead 202 is formed into the cup shape such that the outer configuration thereof becomes the conic pyramid shape or elliptic pyramid shape. Being not limited thereto, however, the second lead 202 may also be formed such that the side surface (reflection mirror portion) becomes into, e.g., concave mirror shape.

Also, in the light emitting device of the fourth embodiment as well, similarly to the first embodiment, the first electrode 104 and the second electrode 105 of the light emitting element 1 are provided on the same principal-surface side of the substrate 101. As long as this configuration is implemented, the light emitting element 1 may also be either a LED chip emitting whatever-color light, or a LD chip.

Figure 48:
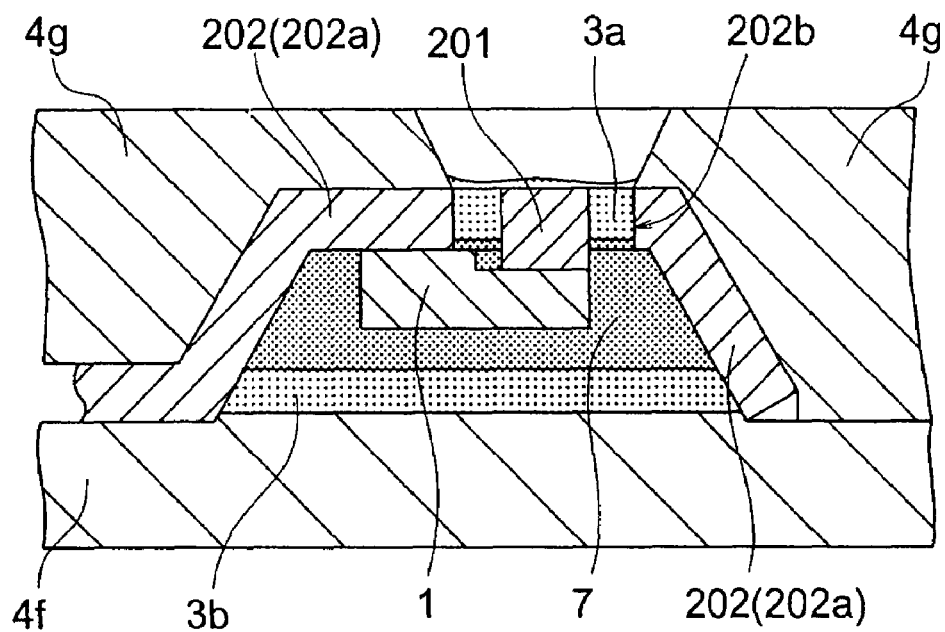
FIG. 48 is a schematic diagram for explaining an application example of the manufacturing method for manufacturing the light emitting device of the fourth embodiment, and is a diagram for illustrating an example of the case where the filling is performed with a resin produced by mixing fluorescent materials.
Figure 49:
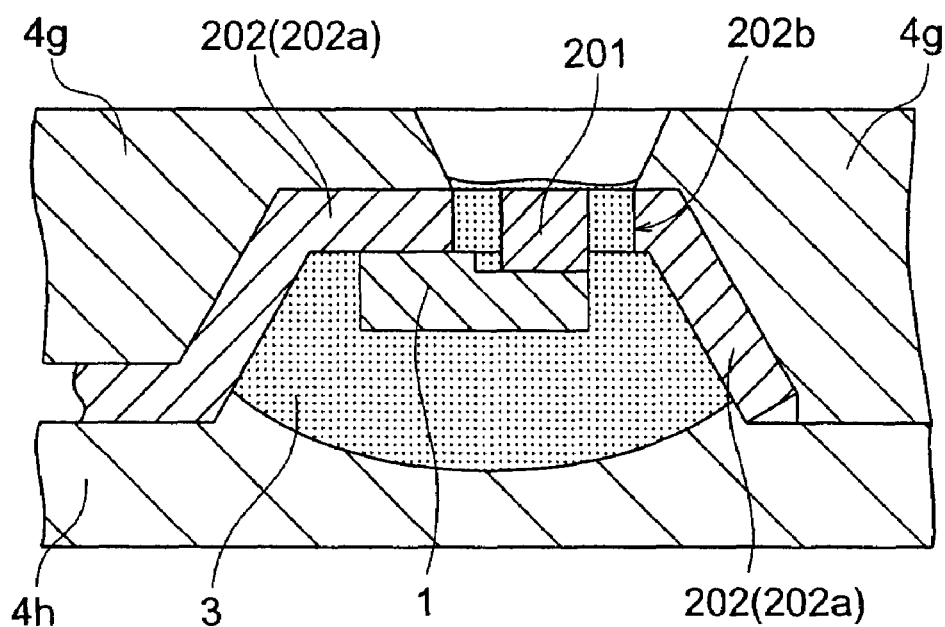
FIG. 49 is a schematic diagram for explaining the application example of the manufacturing method for manufacturing the light emitting device of the fourth embodiment, and is a diagram for illustrating an example of the case where the filling is performed with a transparent resin in a convex-lens-shaped manner.
Figure 50:
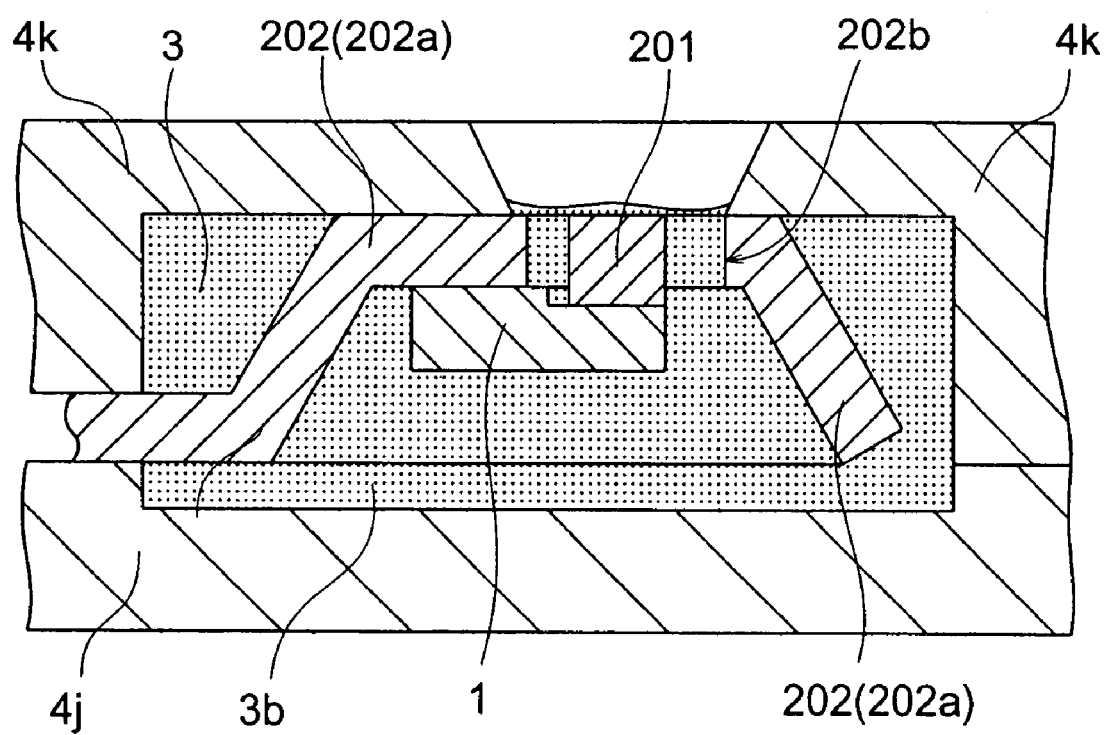
FIG. 50 is a schematic diagram for explaining the application example of the manufacturing method for manufacturing the light emitting device of the fourth embodiment, and is a diagram for illustrating an example of the case where the transparent resin is formed such that the outer configuration thereof becomes a rectangular parallelepiped shape.

FIG. 48 through FIG. 50 are schematic diagrams for explaining an application example of the manufacturing method for manufacturing the light emitting device of the fourth embodiment. FIG. 48 is a diagram for illustrating an example of the case where the filling is performed with a resin produced by mixing fluorescent materials. FIG. 49 is a diagram for illustrating an example of the case where the filling is performed with a transparent resin in a convex-lens-shaped manner. FIG. 50 is a diagram for illustrating an example of the case where the transparent resin is formed such that the outer configuration thereof becomes a rectangular parallelepiped shape.

In the light emitting device of the fourth embodiment as well, similarly to the light emitting devices of the first to third embodiments, before performing the sealing with the transparent resin 3, the inside of the cup portion of the second lead 202 is filled with the resin 7 produced by mixing the fluorescent materials (wavelength conversion materials). As a result of this filling, it becomes possible to manufacture the light emitting device which is capable of outputting light of various wavelengths without being limited to the light of the wavelength (color) specific to the light emitting element 1.

In this way, when performing the filling with the resin 7 produced by mixing the fluorescent materials, e.g., as illustrated in FIG. 48, in order to perform the filling with the transparent resin 3, the lid is put on the opening end of the second lead 202 by using the forming dies 4f and 4g. After that, at first, a transparent resin 3b is poured into a depth of an extent of not attaining to the light emitting element 1. Moreover, subsequently, the resin 7 produced by mixing the fluorescent materials is poured into a depth of an extent at which the light emitting layer of the light emitting element 1 is buried. Furthermore, again, the transparent resin 3b is poured therein. At this time, the transparent resin 3b to be poured therein may be a transparent resin or a colored resin. After that, although the illustration is omitted, the resin is hardened. In addition, the resin surrounding the first lead 201 is eliminated by irradiating the resin with, e.g., a carbon-dioxide laser, thereby completely exposing the first lead 201. After that, the second lead 202 is cut off.

In the light emitting device of the fourth embodiment as well, the exposed surface (light-outputting surface) of the transparent resin 3 with which the inside of the cup portion 202a is filled can be formed into the convex lens shape or Fresnel lens shape. When forming the light-outputting surface of the transparent resin 3 into the convex lens shape, e.g., as illustrated in FIG. 49, a die 4h is used which results from machining, into a concave shape, the portion becoming the lid of the opening end of the second lead (cup-shaped lead) 202.

Also, in the light emitting device of the fourth embodiment, as illustrated in FIG. 37 and FIG. 38, the transparent resin 3 is provided only inside the cup portion of the second lead (cup-shaped lead) 202. Being not limited thereto, however, like the light emitting devices of the second and third embodiments, the transparent resin 3 may be formed such that the outer configuration thereof becomes the rectangular parallelepiped shape. In this case, e.g., as illustrated in FIG. 50, using dies 4j and 4k which allows a rectangular-parallelepiped-shaped space (cavity) to be formed in the surroundings of the second lead (cup-shaped lead) 202, the transparent resin 3 is poured from the through hole 202b of the second lead 202, thereby filling the rectangular-parallelepiped-shaped space with the transparent resin 3. Also, at this time, although the illustration is omitted, the transparent resin 3 may also be formed such that the light-outputting surface is formed into the convex lens shape or Fresnel lens shape.

Figure 51:
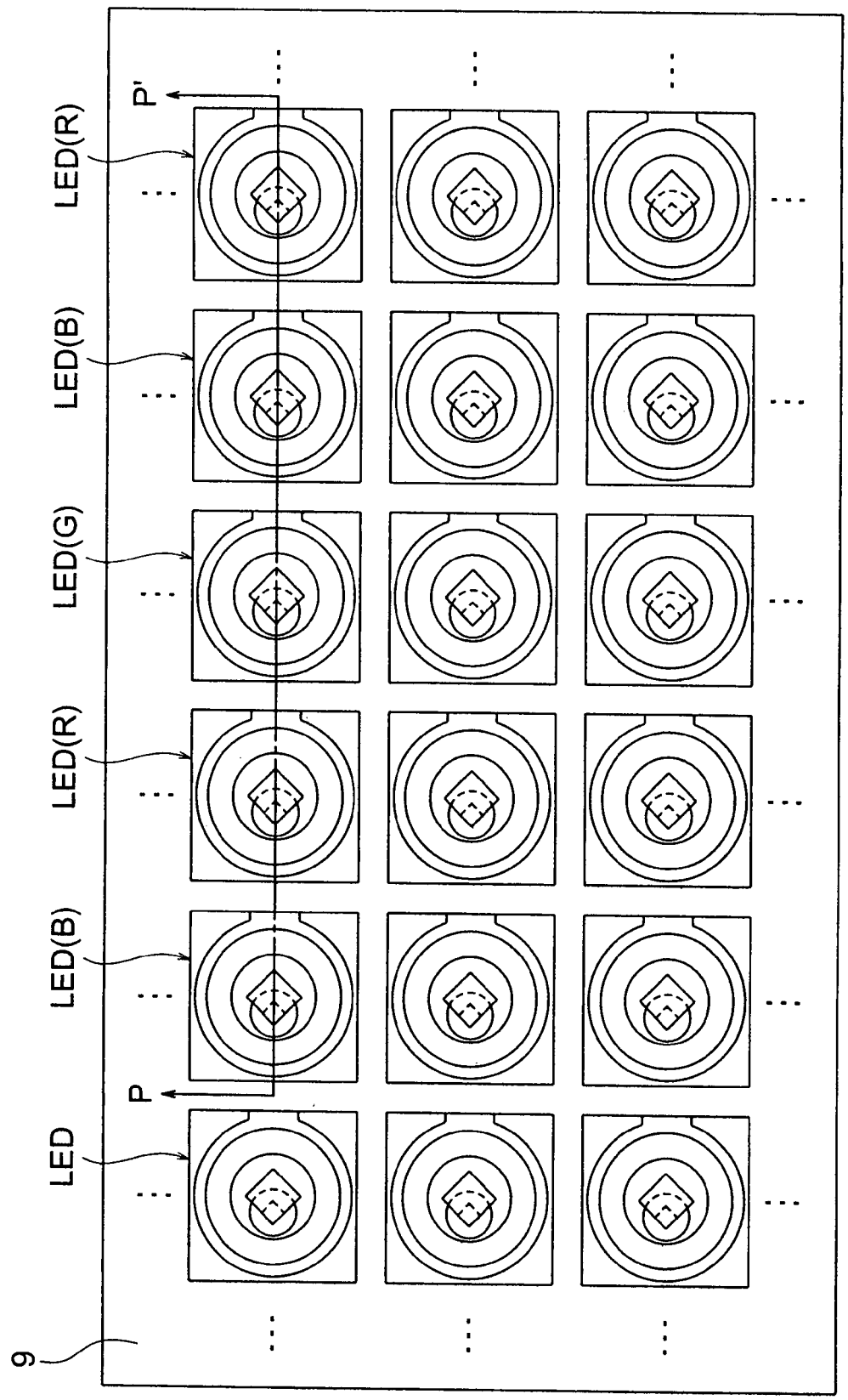
FIG. 51 is a schematic diagram for explaining an application example of the light emitting device of the fourth embodiment, and is a plan view of the light emitting device when a display device is seen from the display-screen side.
Figure 52:
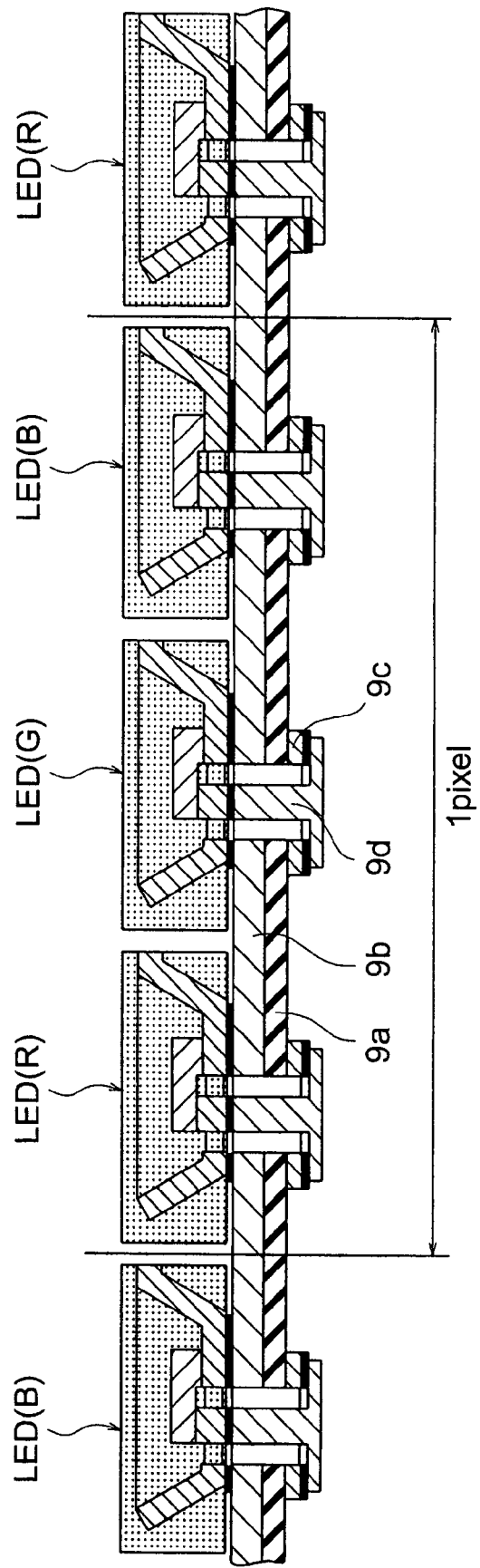
FIG. 52 is a schematic diagram for explaining the application example of the light emitting device of the fourth embodiment, and is a P-P line cross-sectional view of FIG. 51.
Figure 53:
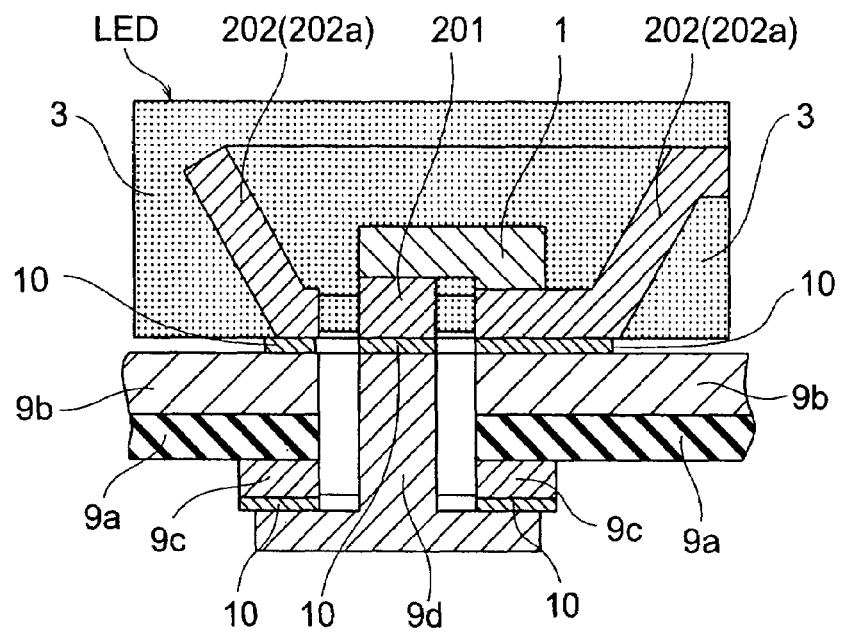
FIG. 53 is a schematic diagram for explaining the application example of the light emitting device of the fourth embodiment, and is an enlarged view of one of the light emitting devices in FIG. 52.

FIG. 51 through FIG. 53 are schematic diagrams for explaining an application example of the light emitting device of the fourth embodiment. FIG. 51 is a plan view of the light emitting device when a display device is seen from the display-screen side. FIG. 52 is a P-P line cross-sectional view of FIG. 51. FIG. 53 is an enlarged view of one of the light emitting devices in FIG. 52.

The outer size of the light emitting device of the fourth embodiment is substantially equal to the outer size of the second lead (cup-shaped lead) 202 on which the light emitting element 1 is mounted. Accordingly, it becomes possible to implement a very small-sized light emitting device. On account of this, as illustrated in FIG. 51 and FIG. 52, e.g., a light emitting device LED (R) on which a red-light-emitting light emitting element is mounted, a light emitting device LED (G) on which a green-light-emitting light emitting element is mounted, and a light emitting device LED (B) on which a blue-light-emitting light emitting element is mounted are arranged as one set on a printed wiring board (two-dimensional plane) 9. This makes it possible to manufacture a display device using these light emitting devices.

At this time, e.g., as illustrated in FIG. 52 and FIG. 53, the second lead 202 of each light emitting device LED is electrically connected to a solid electrode (common electrode) 9b, which is provided on one principal surface of an insulating substrate 9a, via a high melting-point solder 10 such as, e.g., an alloy whose composition ratio of Sn, Ag, Cu is substantially equal to 96.5:3:0.5. Incidentally, a material for connecting the second lead 202 and the solid electrode 9b to each other is not limited to the high melting-point solder of the above-described composition ratio. Instead, a suitable material can be appropriately selected and used from among already-known materials. Also, at this time, of the insulating substrate 9a and the solid electrode 9b, a through hole which passes through into the rear surface is provided in an area and its periphery which overlap with the first lead 201 of each light emitting device LED. Moreover, an independent electrode pattern (control electrode) 9c which becomes a pair with the first lead 201 of each light emitting device LED is provided on the rear surface of the surface of the insulating substrate 9a on which the solid electrode 9b is provided. Then, using a connection conductor 9d as illustrated in FIG. 52 and FIG. 53 and the high melting-point solder 10 such as, e.g., an alloy whose composition ratio of Sn, Ag, Cu is substantially equal to 96.5:3:0.5, the first lead 201 and the electrode pattern 9c are electrically connected to each other. Incidentally, the material for connecting the second lead 202 and the solid electrode 9b to each other is not limited to the high melting-point solder of the above-described composition ratio. Instead, a suitable material can be appropriately selected and used from among already-known materials.

Also, at this time, although the illustration is omitted, each electrode pattern 9c is connected to a controller capable of controlling the application of the voltage for each electrode pattern. The controller outputs a signal to, e.g., only an electrode pattern connected to the first lead 201 of a light emitting device LED which is to be made to emit light. On account of this, e.g., in the one set of the light emitting device LED (R) on which the red-light-emitting light emitting element is mounted, the light emitting device LED (G) on which the green-light-emitting light emitting element is mounted, and the light emitting device LED (B) on which the blue-light-emitting light emitting element is mounted, by changing a combination of light emitting devices which are to be made to emit light, it becomes possible to implement the display device where the one set of the light emitting devices is used as one pixel.

The display device using these light emitting devices can also be implemented by using, e.g., the conventional light emitting devices and the light emitting devices of the first to third embodiments. However, in the case of the conventional light emitting devices and the light emitting devices of the first to third embodiments, the implementation-purpose terminal surface of each lead protrudes into the outside of the second lead (cup-shaped lead) 202 when seen from the output direction of the light. On account of this, the outer size becomes larger, and thus the spacing between light emitting elements of the adjacent light emitting devices becomes wider. This situation makes it difficult to visually recognize the one set of the light emitting devices as one pixel.

On the other hand, in the case of the display device using the light emitting devices of the fourth embodiment, the outer size of the light emitting device can be made smaller down to an extent which is substantially equal to the outer size of the second lead. On account of this, the spacing between light emitting elements of the adjacent light emitting devices can also be made narrower. This situation makes it easier to visually recognize the one set of the light emitting devices as one pixel.

Figure 54:
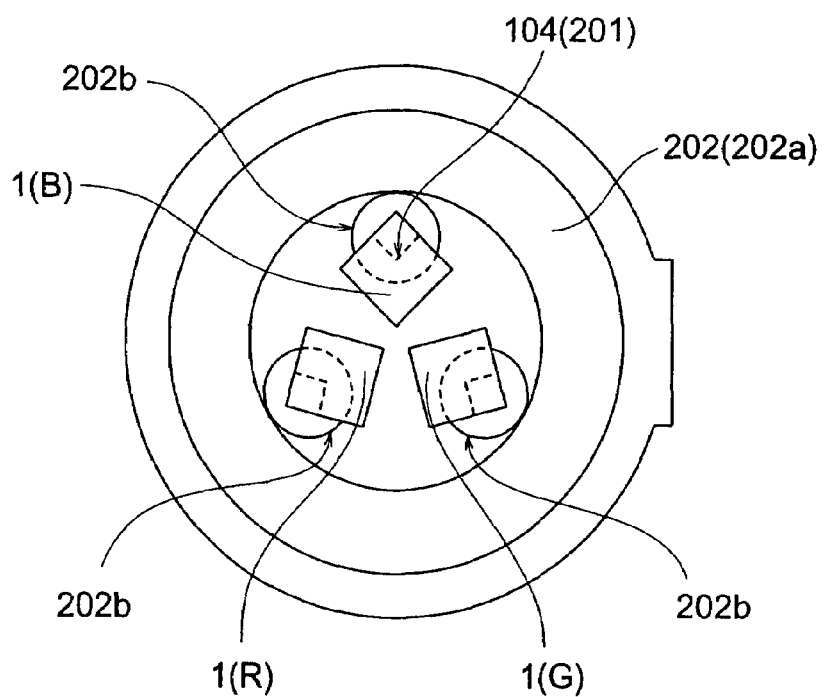
FIG. 54 is a schematic diagram for explaining a first application example of the light emitting device of the fourth embodiment, and is a plan view of the light emitting device when seen from an output direction of light.
Figure 55:
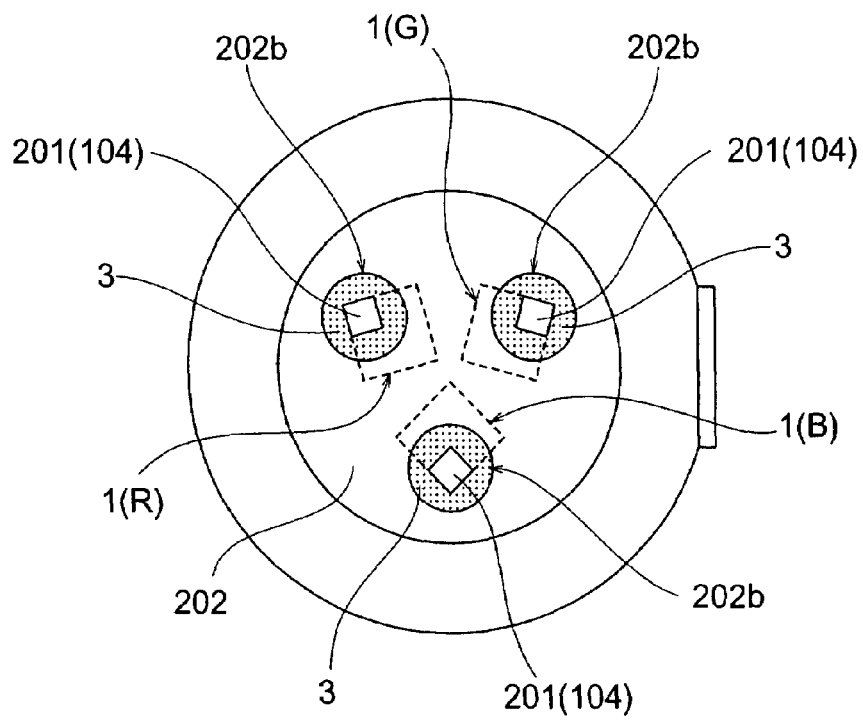
FIG. 55 is a schematic diagram for explaining the first application example of the light emitting device of the fourth embodiment, and is a rear-surface diagram of FIG. 54.

FIG. 54 and FIG. 55 are schematic diagrams for explaining a first application example of the light emitting device of the fourth embodiment. FIG. 54 is a plan view of the light emitting device when seen from an output direction of light. FIG. 55 is a rear-surface diagram of FIG. 54.

In the fourth embodiment, as illustrated in FIG. 37 and FIG. 38, the explanation has been given citing the light emitting device using the one light emitting element as the example. Being not limited thereto, however, the configuration of the light emitting device of the fourth embodiment and the manufacturing method therefor can also be applied to a light emitting device on which a plurality of light emitting elements are mounted (implemented).

Consider a case of applying the configuration of the light emitting device of the fourth embodiment and the manufacturing method therefor to, e.g., a light emitting device on which three light emitting elements 1 are mounted. In this case, as illustrated in FIG. 54 and FIG. 55, three independent through holes 202b are formed on the bottom surface of the second lead 202 (cup portion 202a), and each light emitting element 1 is implemented such that the first electrode 104 is positioned on each through hole 202b. At this time, the three light emitting elements 1 may be either elements which emit same-color (wavelength) lights or a combination of elements which emit different-color lights. Moreover, the first lead 201 is connected onto the first electrode 104 of each light emitting element 1 in accordance with the steps explained in the fourth embodiment. Then, each through hole 202b is filled with, e.g., the transparent resin 3.

At this time, as the three light emitting elements 1, e.g., as illustrated in FIG. 54, a red-light-emitting light emitting element 1 (R), a green-light-emitting light emitting element 1 (G), and a blue-light-emitting light emitting element 1 (B) are mounted on a light emitting device. This makes it possible to manufacture a display device where one light emitting device as illustrated in FIG. 54 is used as one pixel. By doing this, e.g., as illustrated in FIG. 51 and FIG. 52, as compared with the case where one pixel is configured by arranging the three light emitting devices, i.e., the light emitting device on which the red-light-emitting light emitting element is mounted, the light emitting device on which the green-light-emitting light emitting element is mounted, and the light emitting device on which the blue-light-emitting light emitting element is mounted, it becomes possible to reduce an area occupied by the light emitting device which configure one pixel on the printed wiring board 9. This situation makes it even easier to visually recognize the pixel.

Figure 56:
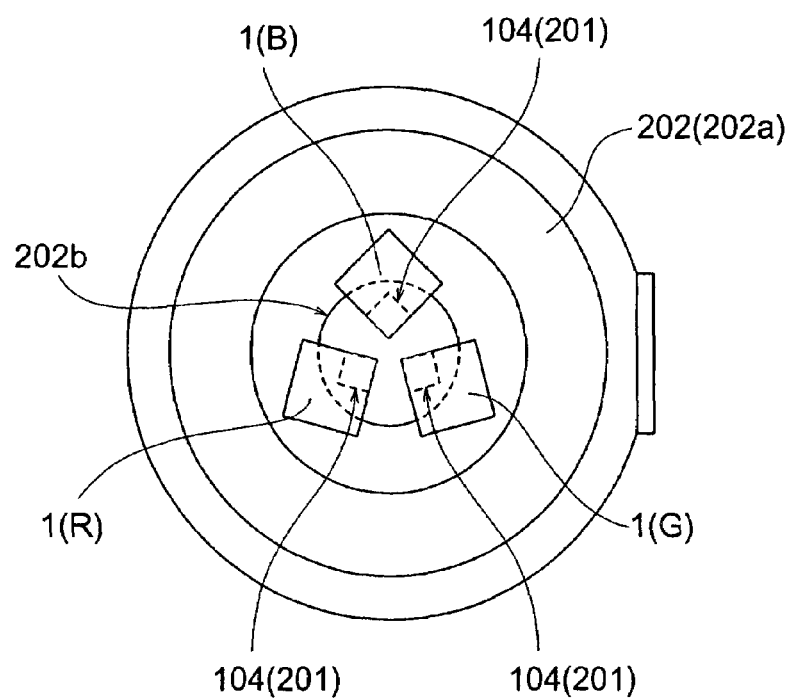
FIG. 56 is a schematic diagram for explaining a second application example of the light emitting device of the fourth embodiment, and is a plan view of the light emitting device when seen from an output direction of light.
Figure 57:
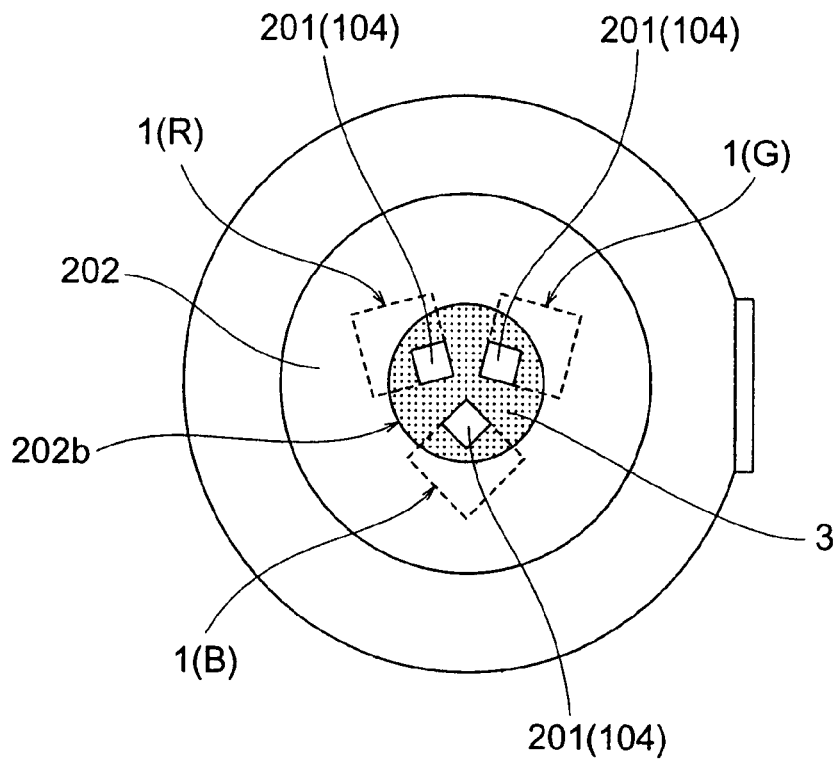
FIG. 57 is a schematic diagram for explaining the second application example of the light emitting device of the fourth embodiment, and is a rear-surface diagram of FIG. 56.
Figure 58:
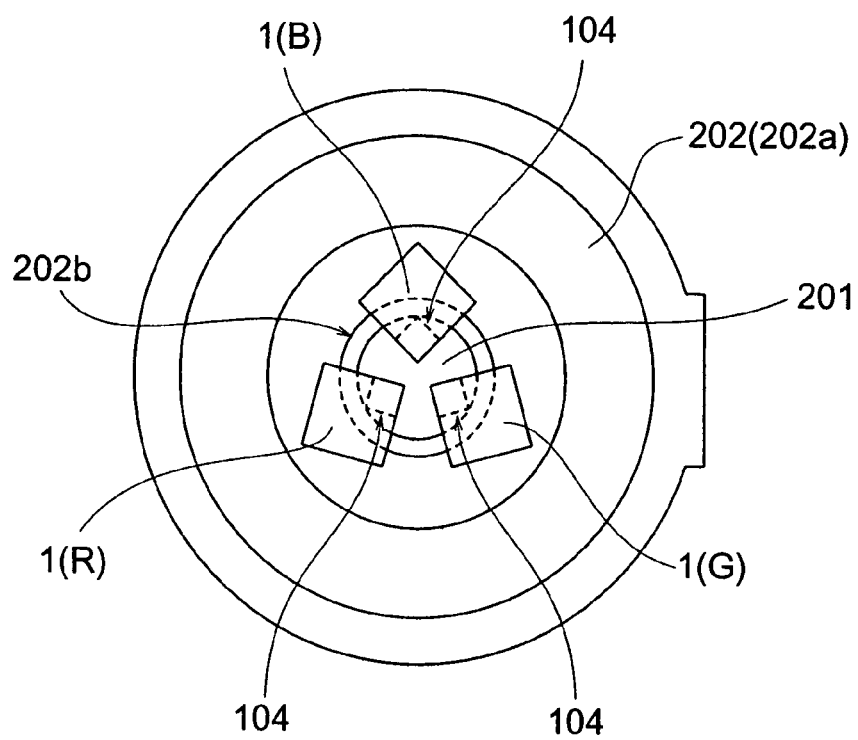
FIG. 58 is a schematic diagram for explaining the second application example of the light emitting device of the fourth embodiment, and is a plan view for illustrating a modification example of the light emitting device illustrated in FIG. 56.
Figure 59:
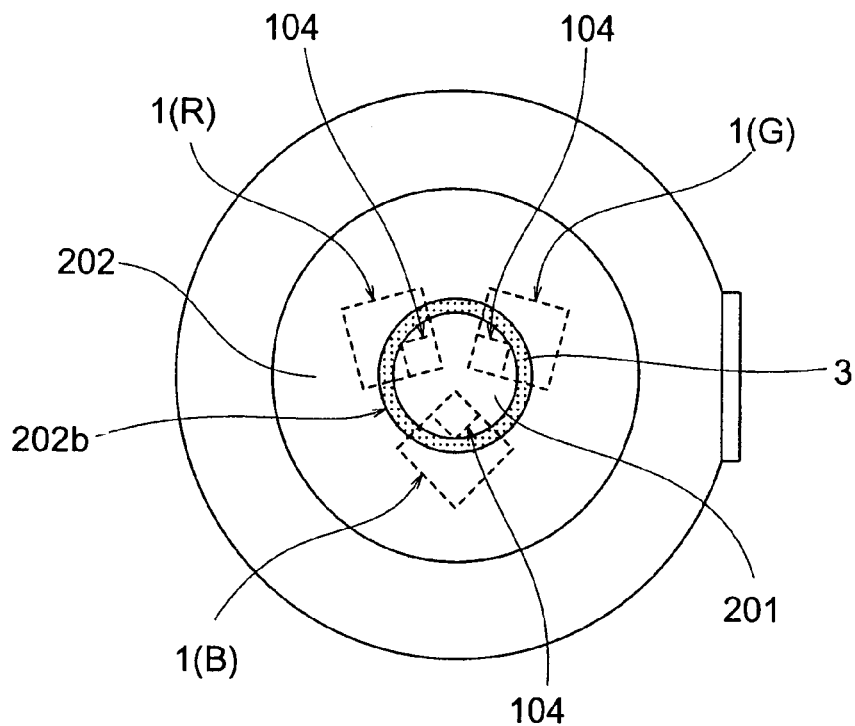
FIG. 59 is a schematic diagram for explaining the second application example of the light emitting device of the fourth embodiment, and is a rear-surface diagram of FIG. 58.

FIG. 56 through FIG. 59 are schematic diagrams for explaining a second application example of the light emitting device of the fourth embodiment. FIG. 56 is a plan view of the light emitting device when seen from an output direction of light. FIG. 57 is a rear-surface diagram of FIG. 56. FIG. 58 is a plan view for illustrating a modification example of the light emitting device illustrated in FIG. 56. FIG. 59 is a rear-surface diagram of FIG. 58.

Consider the case of applying the configuration of the light emitting device of the fourth embodiment and the manufacturing method therefor to the light emitting device on which a plurality of light emitting elements are mounted (implemented). In this case, instead of forming the three independent through holes 202b on the bottom surface of the second lead 202 as illustrated in FIG. 54 and FIG. 55, e.g., as illustrated in FIG. 56 and FIG. 57, one through hole 202b may be formed in proximity to the center of the bottom surface of the second lead 202 (cup portion 202a).

At this time, similarly to the example illustrated in FIG. 54 and FIG. 55, consider the case of applying the configuration of the light emitting device of the fourth embodiment and the manufacturing method therefor to the light emitting device on which the three light emitting elements 1 are mounted. In this case, as illustrated in FIG. 56 and FIG. 57, each light emitting element 1 is implemented such that the first electrode 104 is positioned on the through hole 202b. Moreover, if the three light emitting elements 1 are light emitting elements which emit different-color lights respectively, as illustrated in FIG. 57, three independent first leads 201 are provided inside the through hole 202b. Furthermore, each first lead 201 and the first electrode 104 of each light emitting element 1 are connected to each other in accordance with the steps explained in the fourth embodiment. Then, the through hole 202b is filled with, e.g., the transparent resin 3.

At this time, as the three light emitting elements 1, e.g., the red-light-emitting light emitting element 1 (R), the green-light-emitting light emitting element 1 (G), and the bluelight-emitting light emitting element 1 (B) are mounted on a light emitting device. This makes it possible to manufacture a display device where one light emitting device as illustrated in FIG. 56 is used as one pixel. By doing this, e.g., as illustrated in FIG. 51 and FIG. 52, as compared with the case where one pixel is configured by arranging the three light emitting devices, i.e., the light emitting device on which the red-light-emitting light emitting element is mounted, the light emitting device on which the green-light-emitting light emitting element is mounted, and the light emitting device on which the blue-light-emitting light emitting element is mounted, it becomes even easier to visually recognize the pixel.

Also, if the light emitting device as illustrated in FIG. 56 and FIG. 57 is, e.g., a light emitting device for outputting white light by simultaneously lighting the red-light-emitting light emitting element 1 (R), the green-light-emitting light emitting element 1 (G), and the blue-light-emitting light emitting element 1 (B), the three first leads 201 connected to each light emitting element 1 need not be independent. In such a case, as illustrated in FIG. 58 and FIG. 59, one common first lead 201 may be provided inside the through hole 202b of the second lead 202 (cup portion 202a), and may be electrically connected to the first electrode 104 of each light emitting element 1. Also, being not limited to the light emitting device for outputting white light, the configuration as illustrated in FIG. 58 and FIG. 59 can also be applied to, e.g., a case of a light emitting device for outputting certain specific-color light by mixing a plurality of colors, or a case of a light emitting device on which a plurality of light emitting elements for emitting same-color light are mounted in order to enhance the light amount.

Figure 60:
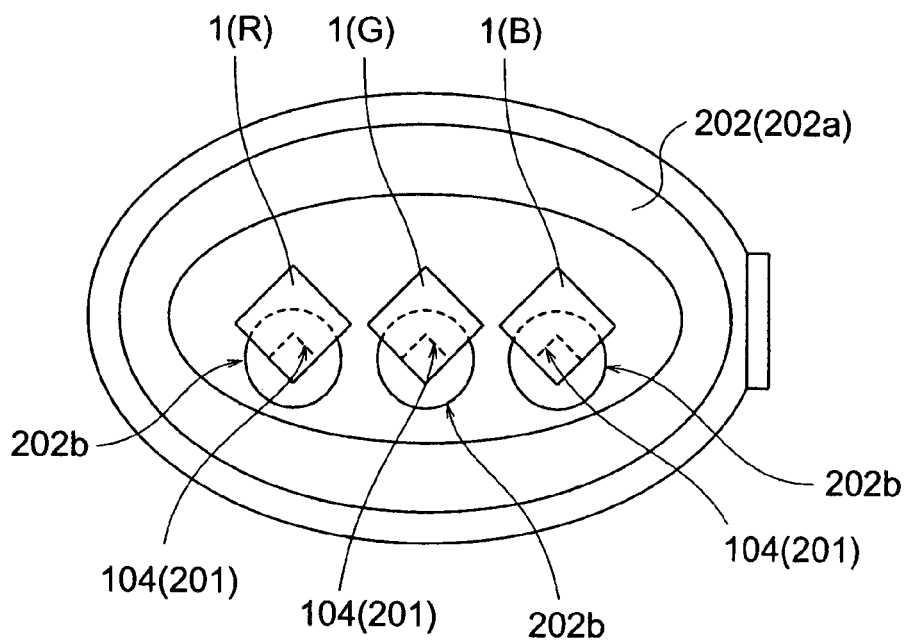
FIG. 60 is a schematic diagram for explaining a third application example of the light emitting device of the fourth embodiment, and is a plan view of the light emitting device when seen from an output direction of light.
Figure 61:
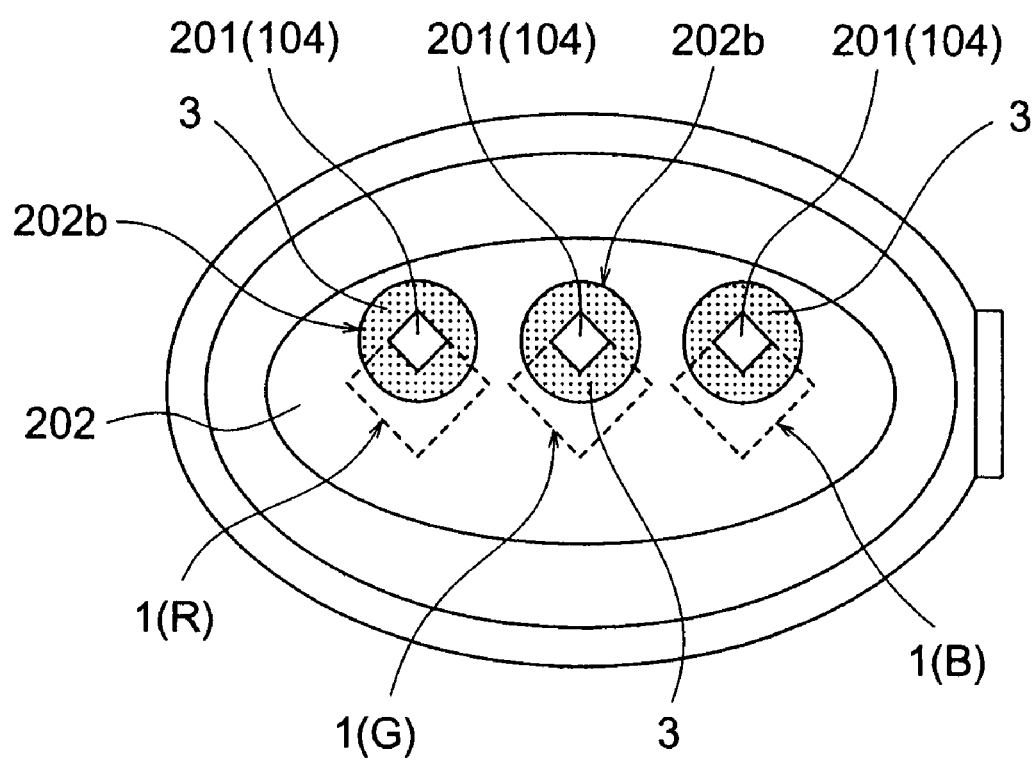
FIG. 61 is a schematic diagram for explaining the third application example of the light emitting device of the fourth embodiment, and is a rear-surface diagram of FIG. 60.

FIG. 60 and FIG. 61 are schematic diagrams for explaining a third application example of the light emitting device of the fourth embodiment. FIG. 60 is a plan view of the light emitting device when seen from an output direction of light. FIG. 61 is a rear-surface diagram of FIG. 60.

In the first application example and the second application example, the explanation has been given citing the example where a plurality of light emitting elements are mounted (implemented) in the ring-shaped manner. Being not limited thereto, however, e.g., as illustrated in FIG. 60 and FIG. 61, the bottom surface of the second lead 202 (cup portion 202a) may be formed into an elliptic (oval) shape, and the plurality of light emitting elements may be mounted in a straight-line-shaped manner. At this time, similarly to the first application example and the second application example, consider the case of applying the configuration of the light emitting device of the fourth embodiment and the manufacturing method therefor to the light emitting device on which the three light emitting elements 1 are mounted. In this case, e.g., as illustrated in FIG. 60 and FIG. 61, three independent through holes 202b are formed on the bottom surface of the second lead 202. Moreover, similarly to the first application example, the first lead 201 is provided inside each through hole 202b, and each first lead 201 and the first electrode 104 of each light emitting element 1 are connected to each other. Then, each through hole 202b is filled with, e.g., the transparent resin 3.

Also, as illustrated in FIG. 60 and FIG. 61, in the case of mounting the light emitting elements in the straight-line-shaped manner, instead of forming the three independent through holes 202b, e.g., one through hole may be formed whose opening end becomes a rectangular or elliptic shape. At this time, if the light emitting device is, e.g., the light emitting device for outputting white light by simultaneously lighting the red-light-emitting light emitting element 1 (R), the green-light-emitting light emitting element 1 (G), and the blue-light-emitting light emitting element 1 (B), the light emitting device for outputting certain specific-color light by mixing a plurality of colors, or the light emitting device on which a plurality of light emitting elements for emitting same-color light are mounted in order to enhance the light amount, like the light emitting device as illustrated in FIG. 58 and FIG. 59, the one common first lead 201 may be provided inside the one through hole, and may be connected to the first electrode 104 of each light emitting element 1.

In the foregoing description, the present invention has been concretely explained based on the above-described embodiments. It is needless to say, however, that the present invention is not limited to the embodiments, but can be modified in various ways within a range of not departing from its essence and spirit.

The invention claimed is:

1. A light emitting device, comprising:
a light emitting element in which plural types of semiconductor layers engaged in performing light emission are multilayered on a principal surface of a substrate, and in which a first electrode and a second electrode are provided on said principal-surface side of said substrate on which said semiconductor layers are multilayered,
a first lead electrically connected to said first electrode of said light emitting element,
a second lead electrically connected to said second electrode of said light emitting element, and
a transparent resin for sealing surroundings of said light emitting element,
a reflection mirror portion being provided on either of said first lead and said second lead and in said surroundings of said light emitting element, said reflection mirror portion extending upwardly from a connection surface with either of said electrodes of said light emitting element, and becoming more distant from center of said light emitting element as moving away from said connection surface, wherein
a portion of each of said first lead and said second lead is bending-formed onto said connection-surface side, said portion being connected to each of said first electrode and said second electrode of said light emitting element,
said first electrode and said second electrode of said light emitting element being faced to said first lead and said second lead respectively, and being electrically connected via adhesion members to said first lead and said second lead respectively,
said reflection mirror portion being provided by bending a cup portion so that said light emitting element will be contained inside an inner space of said cup portion, bottom surface of said cup portion being configured to have an opening, said cup portion being provided by forming an end portion on said opposite side to said portion of either of said first lead and said second lead, said portion being connected to either of said electrodes of said light emitting element.

2. The light emitting device according to claim 1, wherein a plurality of grooves are provided in said portion of each lead connected to either of said electrodes of said light emitting element, said plurality of grooves extending from inside a connection area to outside said connection area, and being intersected or branched inside said connection area.

3. The light emitting device according to claim 1, wherein said inner space of said cup portion of said lead on which said reflection mirror portion is provided is filled with a resin produced by mixing fluorescent materials or wavelength conversion materials.

4. A light emitting device, comprising:
a light emitting element in which plural types of semiconductor layers engaged in performing light emission are multilayered on a principal surface of a substrate, and in which a first electrode and a second electrode are provided on said principal-surface side of said substrate on which said semiconductor layers are multilayered,
a first lead electrically connected to said first electrode of said light emitting element,
a second lead electrically connected to said second electrode of said light emitting element, and
a transparent resin for sealing surroundings of said light emitting element,
a reflection mirror portion being provided on either of said first lead and said second lead and in said surroundings of said light emitting element, said reflection mirror portion extending upwardly from a connection surface with either of said electrodes of said light emitting element, and becoming more distant from center of said light emitting element as moving away from said connection surface, wherein
said reflection mirror portion is provided by bending an outer circumferential portion of a portion of either of said first lead and said second lead onto said connection-surface side, said portion being connected to either of said electrodes of said light emitting element,
an opening passing through from said connection surface to a rear surface being provided in proximity to said portion of said lead on which said reflection mirror portion is provided, said portion being connected to either of said electrodes of said light emitting element,
a portion of said other lead differing from said lead on which said reflection mirror portion is provided passing through said opening of said lead on which said reflection mirror portion is provided, said portion being connected to either of said electrodes of said light emitting element, said portion then existing inside an inner space of a cup portion which includes said connection portion and said reflection mirror portion, said connection portion being said connection portion of said lead on which said reflection mirror portion is provided with either of said electrodes of said light emitting element,
said first electrode and said second electrode of said light emitting element being faced to either of said respective leads, and being electrically connected via adhesion members to either of said respective leads.

5. The light emitting device according claim 4, wherein a plurality of grooves are provided in said portion of each lead connected to either of said electrodes of said light emitting element, said plurality of grooves extending from inside a connection area to outside said connection area, and being intersected or branched inside said connection area.

6. The light emitting device according to claim 4, wherein said inner space of said cup portion of said lead on which said reflection mirror portion is provided is filled with a resin produced by mixing fluorescent materials or wavelength conversion materials.

7. A light emitting device, comprising:
a light emitting element in which plural types of semiconductor layers engaged in performing light emission are multilayered on a principal surface of a substrate, and in which a first electrode and a second electrode are provided on said principal-surface side of said substrate on which said semiconductor layers are multilayered,
a first lead electrically connected to said first electrode of said light emitting element,
a second lead electrically connected to said second electrode of said light emitting element, and
a transparent resin for sealing surroundings of said light emitting element,
a reflection mirror portion being provided on either of said first lead and said second lead and in said surroundings of said light emitting element, said reflection mirror portion extending upwardly from a connection surface with either of said electrodes of said light emitting element, and becoming more distant from center of said light emitting element as moving away from said connection surface, wherein
said one electrode of said light emitting element is provided in a ring-shaped manner in surroundings of said other electrode of said light emitting element,
said reflection mirror portion being provided by bending an outer circumferential portion of a portion of either of said first lead and said second lead onto said connection-surface side, said portion being connected to either of said electrodes of said light emitting element,
an opening passing through from said connection surface to a rear surface being provided in an inner area of said portion of said lead on which said reflection mirror portion is provided, said portion being connected to said ring-shaped electrode of said light emitting element,
said ring-shaped electrode of said light emitting element being faced to said lead on which said reflection mirror portion is provided, and being connected via an adhesion member to said lead in such a manner that said ring-shaped electrode surrounds said opening of said lead on which said reflection mirror portion is provided,
a portion of said other lead differing from said lead on which said reflection mirror portion is provided existing in proximity to said opening of said lead on which said reflection mirror portion is provided, said portion being connected to either of said electrodes of said light emitting element, said other lead and either of said electrodes of said light emitting element being connected to each other via a bonding wire which passes through said opening.

8. The light emitting device according to claim 7, wherein a plurality of grooves are provided in said portion of each lead connected to either of said electrodes of said light emitting element, said plurality of grooves extending from inside a connection area to outside said connection area, and being intersected or branched inside said connection area.

9. The light emitting device according to claim 7, wherein said inner space of said cup portion of said lead on which said reflection mirror portion is provided is filled with a resin produced by mixing fluorescent materials or wavelength conversion materials.

10. A light emitting device, comprising:
a light emitting element in which plural types of semiconductor layers engaged in performing light emission are multilayered on a principal surface of a substrate, and in which a first electrode and a second electrode are provided on said principal-surface side of said substrate on which said semiconductor layers are multilayered,
a first lead electrically connected to said first electrode of said light emitting element,
a second lead electrically connected to said second electrode of said light emitting element, and
a transparent resin for sealing surroundings of said light emitting element,
a reflection mirror portion being provided on either of said first lead and said second lead and in said surroundings of said light emitting element, said reflection mirror portion extending upwardly from a connection surface with either of said electrodes of said light emitting element, and becoming more distant from center of said light emitting element as moving away from said connection surface, wherein said reflection mirror portion is provided by bending an outer circumferential portion of a portion of either of said first lead and said second lead onto said connection-surface side, said portion being connected to either of said electrodes of said light emitting element, an opening passing through from said connection surface to a rear surface being provided in proximity to said portion of said lead on which said reflection mirror portion is provided, said portion being connected to either of said electrodes of said light emitting element, said other lead differing from said lead on which said reflection mirror portion is provided being a column-shaped conductor which protrudes into an inner space of a cup portion from said opening of said lead on which said reflection mirror portion is provided, said cup portion including said connection portion and said reflection mirror portion, said connection portion being said connection portion of said lead on which said reflection mirror portion is provided with either of said electrodes of said light emitting element, said first electrode and said second electrode of said light emitting element being faced to either of said respective leads, and being electrically connected via adhesion members to either of said respective leads.

11. The light emitting device according to claim 10, wherein said transparent resin is provided inside only said inner space of said cup portion and a through hole of said lead on which said reflection mirror portion is provided.

12. The light emitting device according to claim 10, wherein a plurality of grooves are provided in said portion of each lead connected to either of said electrodes of said light emitting element, said plurality of grooves extending from inside a connection area to outside said connection area, and being intersected or branched inside said connection area.

13. The light emitting device according to claim 10, wherein said inner space of said cup portion of said lead on which said reflection mirror portion is provided is filled with a resin produced by mixing fluorescent materials or wavelength conversion materials.

* * * * *